(12) United States Patent
Katayama et al.

(10) Patent No.: US 6,408,079 B1
(45) Date of Patent: Jun. 18, 2002

(54) DISTORTION REMOVAL APPARATUS, METHOD FOR DETERMINING COEFFICIENT FOR THE SAME, AND PROCESSING SPEAKER SYSTEM, MULTI-PROCESSOR, AND AMPLIFIER INCLUDING THE SAME

(75) Inventors: Taro Katayama, Toyonaka; Mitsuhiko Serikawa, Nishinomiya, both of (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 08/932,859

(22) Filed: Sep. 23, 1997

(30) Foreign Application Priority Data

Oct. 23, 1996 (JP) .............................. 8-280431
Jun. 6, 1997 (JP) .............................. 9-149626

(51) Int. Cl.[7] .................................. H03G 5/00
(52) U.S. Cl. ................................ 381/98; 381/96
(58) Field of Search ........................... 381/98, 59, 96, 381/103

(56) References Cited

U.S. PATENT DOCUMENTS 4,709,391 A 11/1987 Kaizer et al. .................. 381/98
5,438,625 A 8/1995 Klippel ........................ 381/96

*Primary Examiner*—Minsun Oh Harvey
(74) *Attorney, Agent, or Firm*—Renner, Otto, Boisselle & Sklar

(57) ABSTRACT

A distortion removal apparatus connected between a signal source and a signal input section of a distortion-generating system, for processing a signal output from the signal source so as to compensate for a distortion component generated in the system is provided. The distortion removal apparatus includes a frame division section for dividing a signal output from the signal source into data streams having a length of N while causing the data streams to partially overlap with one another; a Fourier transform section for performing Fourier transform of the data streams obtained by the frame division section in a time domain into a signal in a frequency domain; a memory section for storing N samples of first coefficients and N×N samples of second coefficients in the frequency domain. The distortion removal apparatus further includes an operation section for removing a distortion component from the output signal from the Fourier transform section by performing an operation based on the first coefficients and the output signal from the Fourier transform section and an operation based on the second coefficients and the output signal from the Fourier transform section; an inverse Fourier transform section for performing inverse Fourier transform of the output signal from the operation section into a signal in the time domain; and a frame synthesis section for sequentially connecting parts of the output signal from the inverse Fourier transform section.

11 Claims, 31 Drawing Sheets

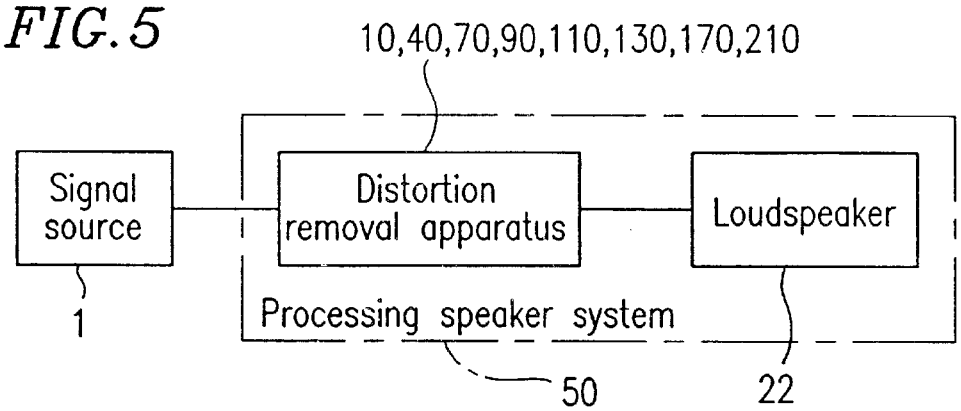
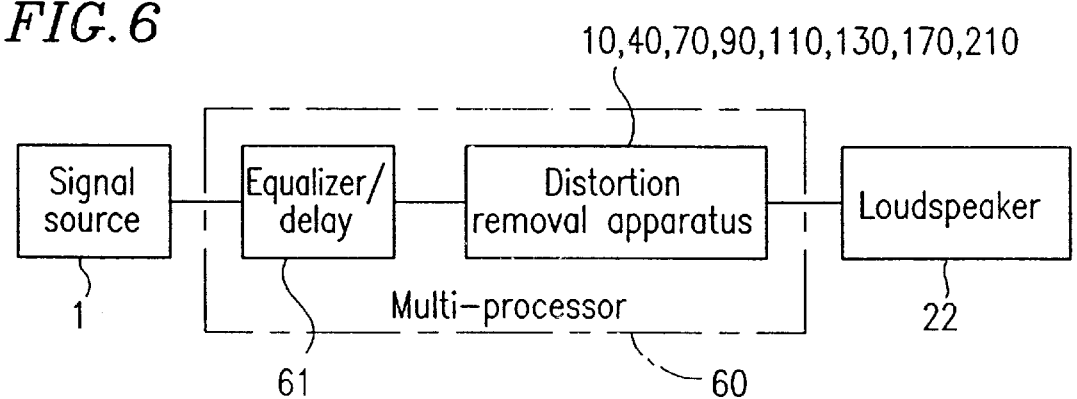

DISTORTION REMOVAL APPARATUS, METHOD FOR DETERMINING COEFFICIENT FOR THE SAME, AND PROCESSING SPEAKER SYSTEM, MULTI-PROCESSOR, AND AMPLIFIER INCLUDING THE SAME

BACKGROUND OF THE INVENTION

1. Field of the Invention

The present invention relates to a distortion removal apparatus for removing a harmonic distortion and an intermodulation distortion generated in a system such as a loudspeaker for reproducing, for example, an audio signal and performing high fidelity reproduction of an input signal, a method for determining a coefficient for the distortion removal apparatus. The present invention also relates to a processing speaker system, a multi-processor and an amplifier including the distortion moving apparatus

2. Description of the Related Art

As is well known, in order to reproduce music or announcement in a large space such as concert halls, outside theaters and stadiums, a large-size professional-use loudspeaker system for reproducing a large volume of sound is generally used. Specifically in order to reproduce sound in a high frequency range, a horn loudspeaker is used; and in order to reproduce sound in a low frequency range, a loudspeaker such as woofer or subwoofer is used.

A horn loudspeaker system includes a compression driver, which is an electro-acoustic transducer, and a horn into which sound wave output from the compression driver is input. The compression driver converts the input electric signal into sound wave and outputs the sound wave to the horn, and the horn radiates the sound wave into a large space. In the compression driver, the sound pressure radiated by a diaphragm for generating the sound wave by reducing the diameter of a part at which the compression driver is connected to the horn (a throat section of the horn) rather than the diameter of the diaphragm. Thus, reproduction of a large volume of sound is realized.

However, in such a compression driver, reproduction is distorted by high compression of the air and the distortion is added to the original sound wave. This is one of the causes of the distortion generated when a large volume of sound is reproduced by the horn loudspeaker system, which is quite serious.

In the case of reproduction of sound in a low frequency range in a large volume using a woofer, the diaphragm of the woofer is vibrated to a large amplitude. In this case, the reproduced sound accompanies a distortion due to the kinetic nonlinearity of the dumper or the edge supporting the diaphragm or the nonlinearity of the volume of the air eliminated by the edge.

The above-described distortions are nonlinear distortions referred to as the harmonic distortion and the intermodulation distortion. Such distortions, which are generated due to the above-described reasons when sound is generated in a large volume, deteriorate the sound quality.

A method for removing a distortion generated in a loudspeaker or the like which generates a nonlinear distortion (hereinafter, referred to as a "system") uses a nonlinear filter. One known nonlinear filter used for such general systems is a Volterra filter. The Volterra filter refers to connecting a one-dimensional filter, a two-dimensional filter, . . . an n-dimensional filter in parallel, performing a convolution operation of an input signal with respect to each filter, and then adding and outputting the results.

Such a method has a problem in that the amount of operation increases to an excessive degree as the number of dimensions increases from a two-dimensional filter to a three-dimensional filter and to an n-dimensional filter. For example, even in the case of removing only a two-order distortion from a loudspeaker as a system, a large-scale apparatus is required to perform a real-time two-dimensional convolution operation of an input audio signal.

The U.S. Pat. No. 4,709,391 to Kaizer at al. entitled "Arrangement for converting an electric signal into an acoustic signal or vice versa and a non-linear network for use in the arrangement" (assigned to U.S. Philips Corporation) and the European Patent application No. 0 168 078 A1 filed in the names of the same inventors propose a nonlinear circuit for correcting a nonlinear distortion referred to as a two-order distortion or a three-order distortion of an electro-acoustic transducer. The method described in these documents is as follows. The nonlinearities of the magnetic flux density of the magnetic circuit of the loudspeaker, inductance of the voice coil, and spring constant of the damper are modelled by an equivalent circuit of an electric circuit to obtain respective constants. Then, the input and output characteristic of the loudspeaker is modelled by a series referred to as the Volterra series in which a usual transfer characteristic is connected in parallel to a nonlinear distortion characteristic. A nonlinear filter for providing an equivalent effect as that by the Volterra filter is connected as a distortion correction circuit to the stage prior to the loudspeaker. By the nonlinear filter, a distortion compensation signal for compensating for the distortion generated by the loudspeaker is added to the audio signal, and the resultant signal is sent to the loudspeaker.

By this method, a distortion removing effect which is equivalent to the effect obtained by two-dimensional and three-dimensional convolution operations is effected without performing such convolution operations.

However, this method requires a significant amount of trouble in order to measure constants for determining the nonlinear transfer characteristic of the loudspeaker, such as the magnetic flux density, inductance and spring constant. Moreover, when any of the measurement results includes a relatively large error and thus a satisfactory effect is not obtained by the above-described procedure, it is difficult to identify which of the constants includes an error. Thus, this method requires significant experience of the operator.

When this method is used for a system from which a nonlinear distortion is to be removed in order to, for example, remove a distortion from a dynamic electric loudspeaker, in the case where the factor of the distortion is clear, it is possible to design a distortion correction circuit. In the case where the distortion generation cannot be modelled by an equivalent circuit, such as in the case of a general system, it is impossible to design a distortion correction circuit.

The U.S. Pat. No. 5,438,625 to W. Klippel entitled "Arrangement to correct the linear and nonlinear transfer behavior or electro-acoustical transducers" (assigned to JBL Incorporated) and the German Patent No. DE 41 11 884 C2 (granted to the same inventor) propose a nonlinear circuit for removing a nonlinear distortion in an electro-acoustic transducer and a method for automatically updating the coefficient for the circuit. According to the method described in these documents, as the method proposed by Kaizer et al., some factors of generation of a nonlinear distortion in the loudspeaker are formulated and a nonlinear circuit to be used as an inverse system is designed. This method is based on the concept of the Volterra filter, but constructs a distortion removing circuit not as a circuit for performing a two- or higher dimensional convolution operation but as a non-linear circuit for providing the same effect as obtained by the convolution operation.

This method also requires formulation of some factors of the generation of distortion in the loudspeaker as a system in order to design a distortion removing circuit. Such a method is only usable for a system, the mechanism of generation of a distortion of which is clear. Moreover, it is necessary to measure the constants of the expressions after the formulation, which is quite complicated.

The two methods described in the above-described documents require formulation of the mechanism of generation of the distortion in a system in order to remove a distortion therefrom. Accordingly, when the factors of the distortion are not clearly known or when formulation cannot be performed with high precision, these methods cannot be used.

SUMMARY OF THE INVENTION

According to one aspect of the invention, a distortion removal apparatus connected between a signal source and a signal input section of a distortion-generating system, for processing a signal output from the signal source so as to compensate for a distortion component generated in the system is provided. The distortion removal apparatus includes a frame division section for dividing a signal output from the signal source into data streams having a length of N while causing the data streams to partially overlap with one another; a Fourier transform section for performing Fourier transform of the data streams obtained by the frame division section in a time domain into a signal in a frequency domain; a memory section for storing N samples of first coefficients and N×N samples of second coefficients in the frequency domain; an operation section for removing a distortion component from the output signal from the Fourier transform section by performing an operation based on the first coefficients and the output signal from the Fourier transform section and an operation based on the second coefficients and the output signal from the Fourier transform section; an inverse Fourier transform section for performing inverse Fourier transform of the output signal from the operation section into a signal in the time domain; and a frame synthesis section for sequentially connecting parts of the output signal from the inverse Fourier transform section.

According to another aspect of the invention, a distortion removal apparatus connected between a signal source and a signal input section of a distortion-generating system, for processing a signal output from the signal source so as to compensate for a distortion component generated in the system is provided. The distortion removal apparatus includes a frame division section for dividing a signal output from the signal source into data streams having a length of N while causing the data streams to partially overlap with one another; a Fourier transform section for performing Fourier transform of the data streams obtained by the frame division section in a time domain into a signal in a frequency domain; a first memory section for storing N samples of first coefficients in a frequency domain; and a first multiplier for performing a multiplication of a first term of the right side of expression (1) using the first coefficients and the output signal from the Fourier transform section, $$W(m) = G1(m)X(m) + \sum_{\substack{m=m1+m2 \\ \text{or} \\ |m1-m2|}} G2(m1, m2)X(m1)X(m2) \quad \text{expression (1)}$$

where m, m1 and m2 each represent an integer representing the number of discrete points on a frequency axis, W(m) represents a component of an m'th frequency point of the output signal from the distortion removal apparatus in a frequency domain: G1(m) represents the first coefficient, X(m) represents an m component of the signal in the frequency domain obtained by the Fourier transform of an input signal after the input signal is made discrete, G2(m1, m2) represents a second coefficient, X(m1) represents an m1 component of the signal in the frequency domain obtained by the Fourier transform of the input signal after the input signal is made discrete, and X(m2) represents an m2 component of the signal in the frequency domain obtained by the Fourier transform of the input signal after the input signal is made discrete. The distortion removal apparatus further includes a second memory section for storing N×N samples of second coefficients in the frequency domain; a multiplier and adder for performing a multiplication and an addition of the second term of the right side of expression (1) using the second coefficients and the output signal from the Fourier transform section; an adder for adding the output signal from the first multiplier and the output signal from the multiplier and adder; an inverse Fourier transform section for performing inverse Fourier transform of the output signal from the adder into a signal in the time domain; and a frame synthesis section for sequentially connecting parts of the output signal from the inverse Fourier transform section and outputting the resultant signal.

According to still another aspect of the invention, a distortion removal apparatus connected between a signal source and a signal input section of a distortion-generating system, for processing a signal output from the signal source so as to compensate for a distortion component generated in the system is provided. The distortion removal apparatus includes a frame division section for dividing a signal output from the signal source into data streams having a length of N while causing the data streams to partially overlap with one another; a Fourier transform section for performing Fourier transform of the data streams obtained by the frame division section in a time domain into a signal in a frequency domain; a third memory section for storing a tap in a frequency domain obtained by Fourier transform of an impulse response from an N-tapped delay section having a delay amount which is substantially equivalent to a group delay of a first-order impulse response from the system from which a distortion is to be removed; a first multiplier for reading the tap stored in the third memory section and performing a multiplication of the tap by the output signal from the Fourier transform section; a first memory section for storing N samples of first coefficients in the frequency domain; and a second multiplier for performing a multiplication of the first term of the right side of expression (1) using the first coefficients and the output signal from the first multiplier, $$W(m) = G1(m)X(m) + \quad \text{expression (1)}$$

-continued $$\sum_{\substack{m=m1+m2 \\ \text{or} \\ |m1-m2|}} G2(m1, m2)X(m1)X(m2)$$

where m, m1 and m2 each represent an integer representing the number of discrete points on a frequency axis, W(m) represents a component of an m'th frequency point of the output signal from the distortion removal apparatus in a frequency domain; G1(m) represents the first coefficient, X(m) represents an m component of the signal in the frequency domain obtained by the Fourier transform of an input signal after the input signal is made discrete, G2(m1, m2) represents a second coefficient, X(m1) represents an m1 component of the signal in the frequency domain obtained by the Fourier transform of the input signal after the input signal is made discrete, and X(m2) represents an m2 component of the signal in the frequency domain obtained by the Fourier transform of the input signal after the input signal is made discrete. The distortion removal apparatus further includes a second memory section for storing N×N samples of second coefficients in the frequency domain; a multiplier and adder for performing a multiplication and an addition of the second term of the right side of expression (1) using the second coefficients and the output signal from the first multiplier; an adder for adding the output signal from the second multiplier and the output signal from the multiplier and adder; an inverse Fourier transform section for performing inverse Fourier transform of the output signal from the adder into a signal in the time domain; and a frame synthesis section for sequentially connecting parts of the output signal from the inverse Fourier transform section and outputting the resultant signal According to still another aspect of the invention, a method for determining a coefficient for a distortion removal apparatus according to one of the above-described apparatuses will be described. A first coefficient G1(m) which is a numerical value stream having N numerical values is obtained by a process comprising the steps of measuring a transfer function of a first-order subsystem of the system as a stream of N numerical values having a point number of N2 in the frequency domain, where N2≦N1<N; performing inverse Fourier transform of the numerical value stream in the frequency domain into a numerical value stream having a point number of N2 in the time domain; adding N−N2 pieces of zero data to a trailing end of the numerical value stream in the time domain; performing Fourier transform of the numerical value stream having a length of N including the zero data into a numerical value stream having a point number of N in the frequency domain; and storing the resultant numerical value stream in the frequency domain in a memory section as a first coefficient. N×N samples of second coefficients G2(m1, m2) are obtained by a process comprising the steps of measuring a transfer function of a second-order subsystem which generates a distortion of the system as a numerical value arrangement having a point number of N3×N3 in the frequency domain, where N3≦N1<N; performing two-dimensional inverse Fourier transform of the numerical value arrangement in the frequency domain into a numerical value arrangement having a point number of N3×N3 in the time domain; adding N−N3 pieces of zero data in a row direction and a column direction to a trailing end of the numerical value arrangement in the time domain to form a numerical value arrangement of N×N; performing two-dimensional Fourier transform of the numerical value arrangement having a point number of N×N including the zero data into a numerical value arrangement having a point number of N×N in the frequency domain; and storing the resultant numerical value arrangement having a point number of N×N in the frequency domain in a memory section as second coefficients.

According to still another aspect of the invention, a distortion removal apparatus connected between a signal source and a signal input section of a distortion-generating system, for adding a characteristic of a low-pass filter to a signal output from the signal source and also processing the signal output from the signal source so as to compensate for a distortion component generated in the system is provided. The distortion removal apparatus includes an A/D converter for converting an analog signal output from the signal source into a digital signal; a first filter for performing a one-dimensional convolution operation of the output signal from the A/D converter; a second filter for performing a two-dimensional convolution operation of the output signal from the A/D converter; an adder for adding the output signal from the first filter and the output signal from the second filter; and a D/A converter for converting the output signal from the adder into an analog signal. Where m is an integer representing a point number on a frequency axis, m1 and m2 are each an integer representing a point number on the frequency axis and fulfill the relationship of m=m1+m2 or m=|m1−m2|, H1(m) is a value representing the transfer characteristic of a first-order subsystem of the system in a frequency domain, and H2(m1, m2) is a value representing the transfer characteristic of a second-order harmonic distortion and intermodulation distortion of a second-order subsystem of the system in a two-dimensional frequency domain; the transfer characteristic G1L(m) of the first filter is G1(m)L(m) obtained by multiplying a characteristic L(m) of the low-pass filter by an arbitrarily determinable first-order transfer characteristic G1(m), and the transfer characteristic G2L(m1, m2) of the second filter is represented by expression (16), $$G2L(m1, m2) = -\frac{H2(m1, m2)}{H1(m)} G1L(m1)G1L(m2). \quad \text{expression (16)}$$

According to still another aspect of the invention, a distortion removal apparatus connected between a signal source and a signal input section of a distortion-generating system, for adding a characteristic of a band-pass filter to a signal output from the signal source and also processing the signal output from the signal source so as to compensate for a distortion component generated in the system is provided. The distortion removal apparatus includes an A/D converter for converting an analog signal output from the signal source into a digital signal; a first filter for performing a one-dimensional convolution operation of the output signal from the A/D converter; a second filter for performing a two-dimensional convolution operation of the output signal from the A/D converter; an adder for adding the output signal from the first filter and the output signal from the second filter; and a D/A converter for converting the output signal from the adder into an analog signal. Where m is an integer representing a point number on a frequency axis, m1 and m2 are each an integer representing a point number on the frequency axis and fulfill the relationship of m=m1+m2 or m=|m1−m2|, H1(m) is a value representing the transfer characteristic of a first-order subsystem of the system in a frequency domain, and H2(m1, m2) is a value representing the transfer characteristic of a second-order harmonic distortion and intermodulation distortion of a second-order subsystem of the system in a two-dimensional frequency domain; the transfer characteristic G1B(m) of the first filter is G1(m)B(m) obtained by multiplying a characteristic B(m) of the band-pass filter by an arbitrarily determinable first-order transfer characteristic G1(m), and the transfer characteristic G2(m1, m2) of the second filter is represented by expression (24), $$G2B(m1, m2) = -\frac{H2(m1, m2)}{H1(m)} G1B(m1)G1B(m2). \qquad \text{expression (24)}$$

According to still another aspect of the invention, a distortion removal apparatus connected between a signal source and a signal input section of a distortion-generating system, for adding a characteristic of a high-pass filter to a signal output from the signal source and also processing the signal output from the signal source so as to compensate for a distortion component generated in the system is provided. The distortion removal apparatus includes an A/D converter for converting an analog signal output from the signal source into a digital signal; a first filter for performing a one-dimensional convolution operation of the output signal from the A/D converter; a second filter for performing a two-dimensional convolution operation of the output signal from the A/D converter; an adder for adding the output signal from the first filter and the output signal from the second filter; and a D/A converter for converting the output signal from the adder into an analog signal. Where m is an integer representing a point number on a frequency axis, m1 and m2 are each an integer representing a point number on the frequency axis and fulfill the relationship of m=m1+m2 or m=|1−m2|, H1(m) is a value representing the transfer characteristic of a first-order subsystem of the system in a frequency domain, and H2(m1, m2) is a value representing the transfer characteristic of second-order harmonic distortion and intermodulation distortion of a second-order subsystem of the system in a two-dimensional frequency domain: the transfer characteristic G1F(m) of the first filter is G1(m)F(m) obtained by multiplying a characteristic F(m) of the high-pass filter by an arbitrarily determinable first-order transfer characteristic G1(m), and the transfer characteristic G2F(m1, m2) of the second filter is represented by expression (32), $$G2F(m1, m2) = -\frac{H2(m1, m2)}{H1(m)} G1F(m1)G1F(m2). \qquad \text{expression (32)}$$

According to still another aspect of the invention, a distortion removal apparatus connected between a signal source and a signal input section of a distortion-generating system, for processing a signal output from the signal source so as to compensate for a distortion component generated in the system is provided. The distortion removal apparatus includes a first filter for performing a first-order convolution operation of the output signal from the signal source; a second filter for performing a second-order convolution operation of the output signal from the signal source; a low-pass filter to which the output signal from the second filter is input; and an adder for adding the output signal from the first filter and the output signal from the low-pass filter. The cut-off frequency of the low-pass filter is less than the upper limit of a reproduction frequency band of the system.

According to still another aspect of the invention, a distortion removal apparatus connected between a signal source and a signal input section of a distortion-generating system, for processing a signal output from the signal source so as to compensate for a distortion component generated in the system is provided. The distortion removal apparatus includes a first filter for performing a first-order convolution operation of the output signal from the signal source; a second filter for performing a second-order convolution operation of the output signal from the signal source; and an adder for adding the output signal from the first filter and the output signal from the low-pass filter. Where X(m) is a value representing an input signal from the signal source in a frequency domain, m is an integer representing a point of a frequency axis, m1 and m2 are each a value fulfilling the relationship of m=m1+m2 or m=|m1−m2|, H1(m) is a value representing the transfer characteristic of a first-order subsystem of the system in a frequency domain, and H2(m1, m2) is a value representing the transfer characteristic of second-order harmonic distortion and intermodulation distortion of a second-order subsystem of the system in a two-dimensional frequency domain, G1(m) is a value representing the transfer characteristic of the first filter in the frequency domain, G2(m1, m2) is a value representing the transfer characteristic of the second filter in the frequency domain, and mc is an integer corresponding to the cut-off frequency on the high frequency range side of the transfer characteristic of the first-order subsystem w of the system; the second filter is a two-dimensional digital filter having a tap length of N×N, provides the transfer characteristic G2(m1, m2) with respect to the input signal X(m) and outputs a result of a convolution operation of the input signal X(m) performed in an area represented by expression (36) while blocking the area other than the area represented by expression (36), $$G2(m1, m2) = -\frac{H2(m1, m2)}{H1(m)} G1(m1)G1(m2) \qquad \text{expression (9)}$$

$m1+m2 \leq mc, \; m1 \geq 0, \; m2 \geq 0$ $N-mc \leq m1+m2 \leq N+mc, \; 0 \leq m1 < N, \; 0 \leq m2 < N$ $m1+m2 \geq 2N-mc, \; m1<N, \; m2<N$  expression (36).

According to still another aspect of the invention, a distortion removal apparatus connected between a signal source and a signal input section of a distortion-generating system, for processing a signal output from the signal source so as to compensate for a distortion component generated in the system is provided The distortion removal apparatus includes a first filter for performing a first-order convolution operation of the output signal from the signal source; a second filter for performing a second-order convolution operation of the output signal from the signal source; a band-pass filter to which the output signal from the second filter is input; and an adder for adding the output signal from the first filter and the output signal from the low-pass filter. The cut-off frequency of the band-pass filter on the low frequency range side is equal to or more than the upper limit of a reproduction frequency band of the system, and the cut-off frequency of the band-pass filter on the high frequency range side is equal to or less than the upper limit of the reproduction frequency band of the system.

According to still another aspect of the invention, a distortion removal apparatus connected between a signal source and a signal input section of a distortion-generating system, for processing a signal output from the signal source so as to compensate for a distortion component generated in the system is provided. The distortion removal apparatus includes a first filter for performing a first-order convolution operation of the output signal from the signal source; a second filter for performing a second-order convolution operation of the output signal from the signal source; and an adder for adding the output signal from the first filter and the output signal from the band-pass filter. Where X(m) is a value representing an input signal from the signal source in a frequency domain, m is an integer representing a point of a frequency axis, m1 and m2 are each a value fulfilling the relationship of m=m1+m2 or m=|m1−m2|, H1(m) is a value representing the transfer characteristic of a first-order subsystem of the system in a frequency domain, and H2(m1, m2) is a value representing the transfer characteristic of second-order harmonic distortion and intermodulation distortion of a second-order subsystem of the system in a two-dimensional frequency domain, G1(m) is a value representing the transfer characteristic of the first filter in the frequency domain, G2(m1, m2) is a value representing the transfer characteristic of the second filter in the frequency domain, and mc is an integer corresponding to the cut-off frequency on the high frequency range side of the transfer characteristic of the first-order subsystem of the system; the second filter is a two-dimensional digital filter having a tap length of N×N, provides the transfer characteristic G2(m1, m2) represented by expression (9) with respect to the input signal X(m), and outputs a result of a convolution operation of the input signal X(m) performed in an area represented by expression (39) while blocking the area other than the area represented by expression (39), $$G2(m1, m2) = -\frac{H2(m1, m2)}{H1(m)} G1(m1)G1(m2) \quad \text{expression (9)}$$

$mcl \leq m1+m2 \leq mch,\ 0 \leq m1,\ 0 \leq m2$ $N-mch \leq m1+m2 \leq N-mcl,\ 0 \leq m1,\ 0 \leq m2$ $N+mcl \leq m1+m2 \leq N+mch,\ m1<N,\ m2<N$ $2N-mch \leq m1+m2 \leq 2N-mcl,\ m1<N,\ m2<N$ \quad expression (39).

According to still another aspect of the invention, a distortion removal apparatus connected between a signal source and a signal input section of a distortion-generating system, for processing a signal output from the signal source so as to compensate for a distortion component generated in the system is provided. The distortion removal apparatus includes a first filter for performing a first-order convolution operation of the output signal from the signal source; a second filter for performing a second-order convolution operation of the output signal from the signal source: a high-pass filter to which the output signal from the second filter is input; and an adder for adding the output signal from the first filter and the output signal from the high-pass filter. The cut-off frequency of the high-pass filter is equal to or more than the upper limit of a reproduction frequency band of the system.

According to still another aspect of the invention, a distortion removal apparatus connected between a signal source and a signal input section of a distortion-generating system, for processing a signal output from the signal source so as to compensate for a distortion component generated in the system is provided. The distortion removal apparatus includes a first filter for performing a first-order convolution operation of the output signal from the signal source; a second filter for performing a second-order convolution operation of the output signal from the signal source; and an adder for adding the output signal from the first filter and the output signal from the second filter. Where X(m) is a value representing an input signal from the signal source in a frequency domain, m is an integer representing a point of a frequency axis, m1 and m2 are each a value fulfilling the relationship of m=m1+m2 or m=|m1−m2|, H1(m) is a value representing the transfer characteristic of a first-order subsystem of the system in a frequency domain, and H2(m1, m2) is a value representing the transfer characteristic of second-order harmonic distortion and intermodulation distortion of a second-order subsystem of the system in a two-dimensional frequency domain, G1(m) is a value representing the transfer characteristic of the first filter in the frequency domain, G2(m1, m2) is a value representing the transfer characteristic of the second filter in the frequency domain, and mc is an integer corresponding to the cut-off frequency on the high frequency range side of the transfer characteristic of the first-order subsystem of the system; the second filter is a two-dimensional digital filter having a tap length of N×N, provides the transfer characteristic G2(m1, m2) represented by expression (9) with respect to the input signal X(m), and outputs a result of a convolution operation of the input signal X(m) performed in an area represented by expression (42) while blocking the area other than the area represented by expression (42), $$G2(m1, m2) = -\frac{H2(m1, m2)}{H1(m)} G1(m1)G1(m2) \quad \text{expression (9)}$$

$mc \leq m1+m2 \leq N-mc,\ 0 \leq m1,\ 0 \leq m2$ $N+mc \leq m1+m2 \leq 2N-mc,\ m1<N,\ m2<N$ \quad (42).

According to another still aspect of the invention, a distortion removal apparatus connected between a signal source and a signal input section of a processor, which is provided on a stage before a distortion-generating system, for processing a signal output from the signal source so as to compensate for a distortion component generated in the system is provided. The w distortion removal apparatus includes a first filter for performing a first-order convolution operation of the output signal from the signal source; a second filter for performing a second-order convolution operation of the output signal from the signal source; and an adder for adding the output signal from the first filter and the output signal from the second filter. Where X(m) is a value representing an input signal from the signal source in a frequency domain, m is an integer representing a point of a frequency axis, m1 and m2 are each a value fulfilling the relationship of m=m1+m2 or m=|m1−m2|, H1(m) is a value representing the transfer characteristic of a first-order subsystem of the system in a frequency domain, and H2(m1, m2) is a value representing the transfer characteristic of second-order harmonic distortion and intermodulation distortion of a second-order subsystem of the system in a two-dimensional frequency domain, E(m) is a value representing a transfer characteristic of the processor in the frequency domain, G1(m) is a value representing the transfer characteristic of the first filter in the frequency domain, and G2(m1, m2) is a value representing the transfer characteristic of the second filter in the frequency domain; the second filter is a two-dimensional digital filter having a tap length of N×N, and outputs a result of a convolution operation of the input signal X(m) performed using the two-dimensional transfer characteristic G2(m1, m2) represented by expression (48), $$G2(m1, m2) = -\frac{H2(m1, m2)E(m1)E(m2)}{H1(m)E(m)}G1(m1)G1(m2). \quad \text{expression (48)}$$

According to still another aspect of the invention, a distortion removal apparatus connected between a signal source and a signal input section of a processor, which is provided on a stage before a distortion-generating system, for processing a signal output from the signal source so as to compensate for a distortion component generated in the processor is provided. The distortion removal apparatus includes a first filter for performing a first-order convolution operation of the output signal from the signal source; a second filter for performing a second-order convolution operation of the output signal from the signal source; and an adder for adding the output signal from the first filter and the output signal from the second filter. Where X(m) is a value representing an input signal from the signal source in a frequency domain, m is an integer representing a point of a frequency axis, m1 and m2 are each a value fulfilling the relationship of m=m1+m2 or m=|m1−|m2|, H1(m) is a value representing the transfer characteristic of a first-order subsystem of the system in a frequency domain, and H2(m1, m2) is a value representing the transfer characteristic of second-order harmonic distortion and intermodulation distortion of a second-order subsystem of the system in a two-dimensional frequency domain, A1(m) is a value representing a transfer characteristic of a first-order subsystem of the processor in the frequency domain, A2(m1, m2) is a value representing a transfer characteristic of a second-order subsystem of the processor in the frequency domain, G1(m) is a value representing the transfer characteristic of the first filter in the frequency domain, and G2(m1, m2) is a value representing the transfer characteristic of the second filter in the frequency domain; the second filter is a two-dimensional digital filter having a tap length of N×N, and outputs a result of a convolution operation of the input signal X(m) performed using the two-dimensional transfer characteristic G2(m1, m2) represented by expression (52), $$G2(m1, m2) = \quad \text{expression (52)}$$
$$-\frac{H1(m1)A2(m1, m2) + \frac{H2(m1, m2)A1(m1)A1(m2)}{H1(m)A1(m)}}G1(m1)G1(m2).$$

According to still another aspect of the invention, a multi-processor including any one of the above-described distortion removal apparatuses is provided. The distortion-generating system is a loudspeaker for reproducing an audio signal, and the system is provided between the signal source and an amplifier for driving the loudspeaker.

According to still another aspect of the invention, an amplifier including any one of the above-described distortion removal apparatuses is provided. The distortion-generating system is a loudspeaker for reproducing an audio signal, and the amplifier drives the loudspeaker.

According to still another aspect of the invention, a processing speaker system including any one of the above-described distortion removal apparatuses is provided. The distortion-generating system is a loudspeaker for reproducing an audio signal.

As described above, according to the present invention, in order to remove a distortion, the characteristic of a distortion generated in a loudspeaker is measured in advance, and a coefficient for generating a distortion compensation signal is obtained based on the measurement result. This coefficient is stored in a distortion removal apparatus. The distortion removal apparatus generates a distortion compensation signal using the coefficient upon receipt of an audio signal, and adds the distortion compensation signal to the original audio signal. The combined signal is output to the loudspeaker via a power amplifier. The distortion generated in the loudspeaker is cancelled by the distortion compensation signal, and only the audio signal output from the signal source is radiated from the loudspeaker. As a result, the loudspeaker reproduces the audio signal with high fidelity without generating a distortion.

According to the present invention, the trouble for analyzing in detail the factor of generation of a distortion in a system, for example, a loudspeaker can be saved.

According to the present invention, a distortion compensation signal is generated real-time with respect to an arbitrary input audio signal.

According to the present invention, the function of a band restricting filter of allowing only a component of the input signal in a certain frequency range to pass for output is provided.

According to the present invention, the amount of operation performed by a second-order filter can be reduced in a distortion removal apparatus having the function of a band restricting filter.

According to the present invention, even when a graphic equalizer is provided on the stage after the distortion removal apparatus, the distortion in the loudspeaker can be removed.

According to the present invention, when the power amplifier for driving the loudspeaker generates a nonlinear distortion, the distortion in the amplifier can be also removed.

Thus, the invention described herein makes possible the advantages of providing (1) a practical distortion removal apparatus, disposed at a stage prior to a distortion-generating system such as a loudspeaker, for generating a signal for compensating for the distortion generated in the system with high precision, (2) a method for determining a coefficient usable in the distortion removal apparatus, (3) a processing speaker system, multi-processor and amplifier including the distortion removal apparatus, and (4) a distortion removal apparatus for reducing the amount of operation performed for signal processing therein.

These and other advantages of the present invention will become apparent to those skilled in the art upon reading and understanding the following detailed description with reference to the accompanying figures.

Figure 3A:
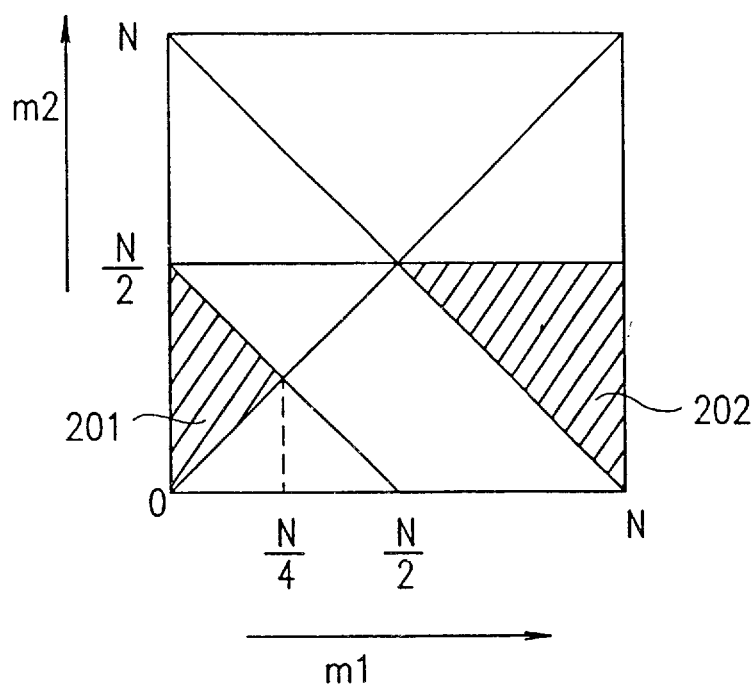
FIG. 3A is a diagram showing an area of a two-dimensional filter for which the operation by the multiplier/ adder is to be substantially performed in a distortion removal apparatus in a second example according to the present invention.
Figure 3B:
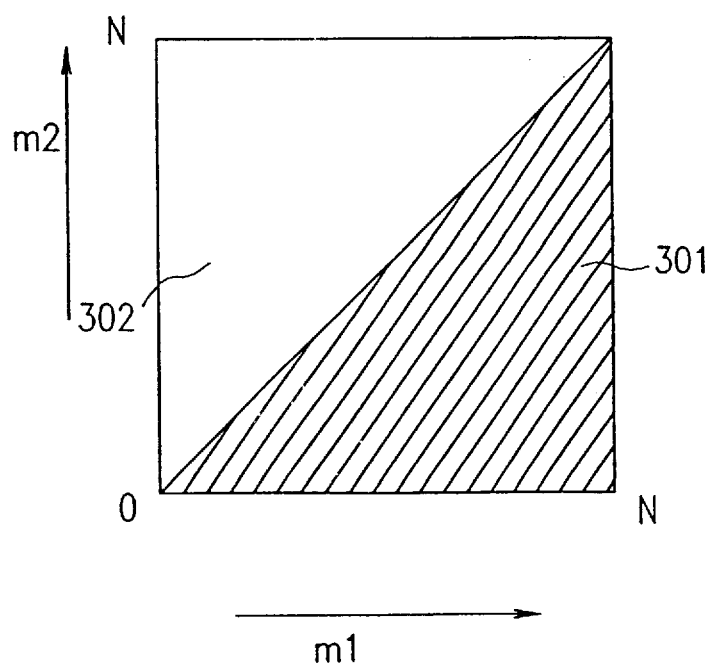
Figure 3C:
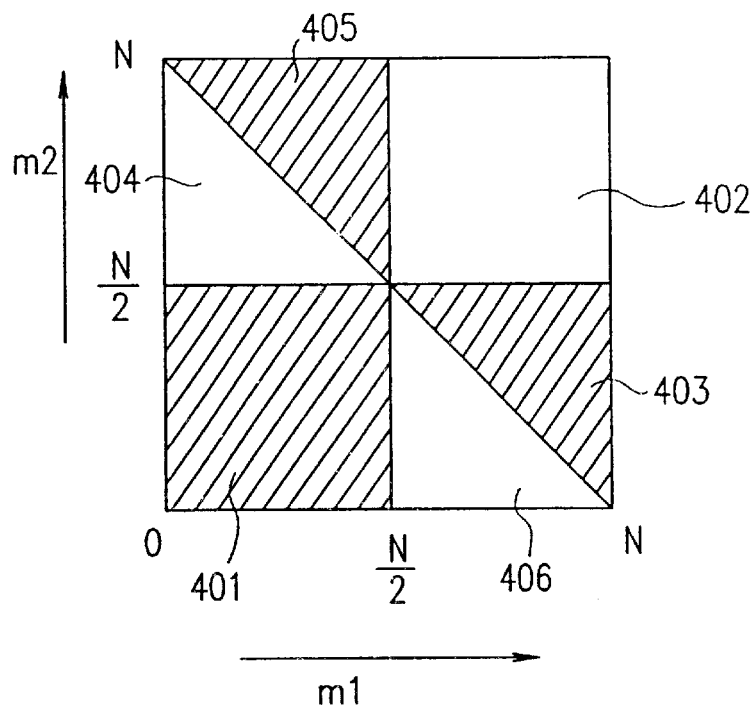
Figure 3D:
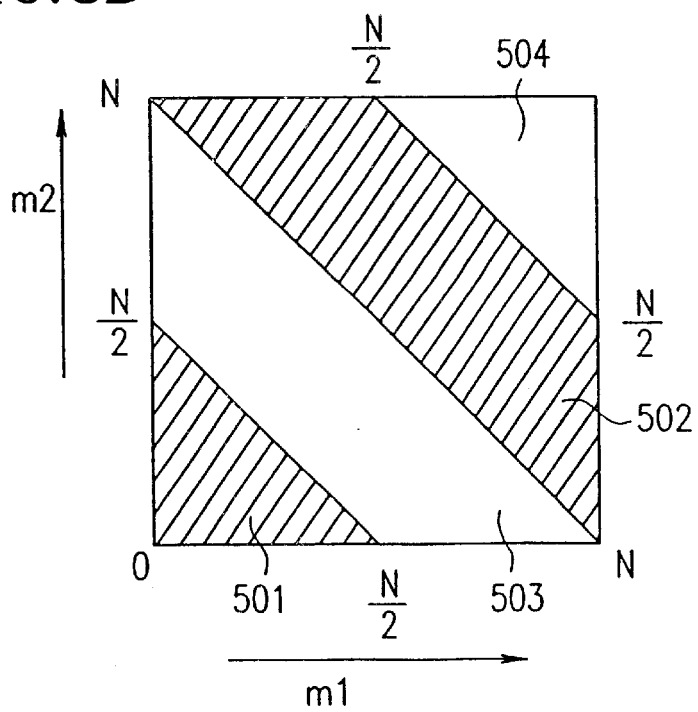
Figure 4:
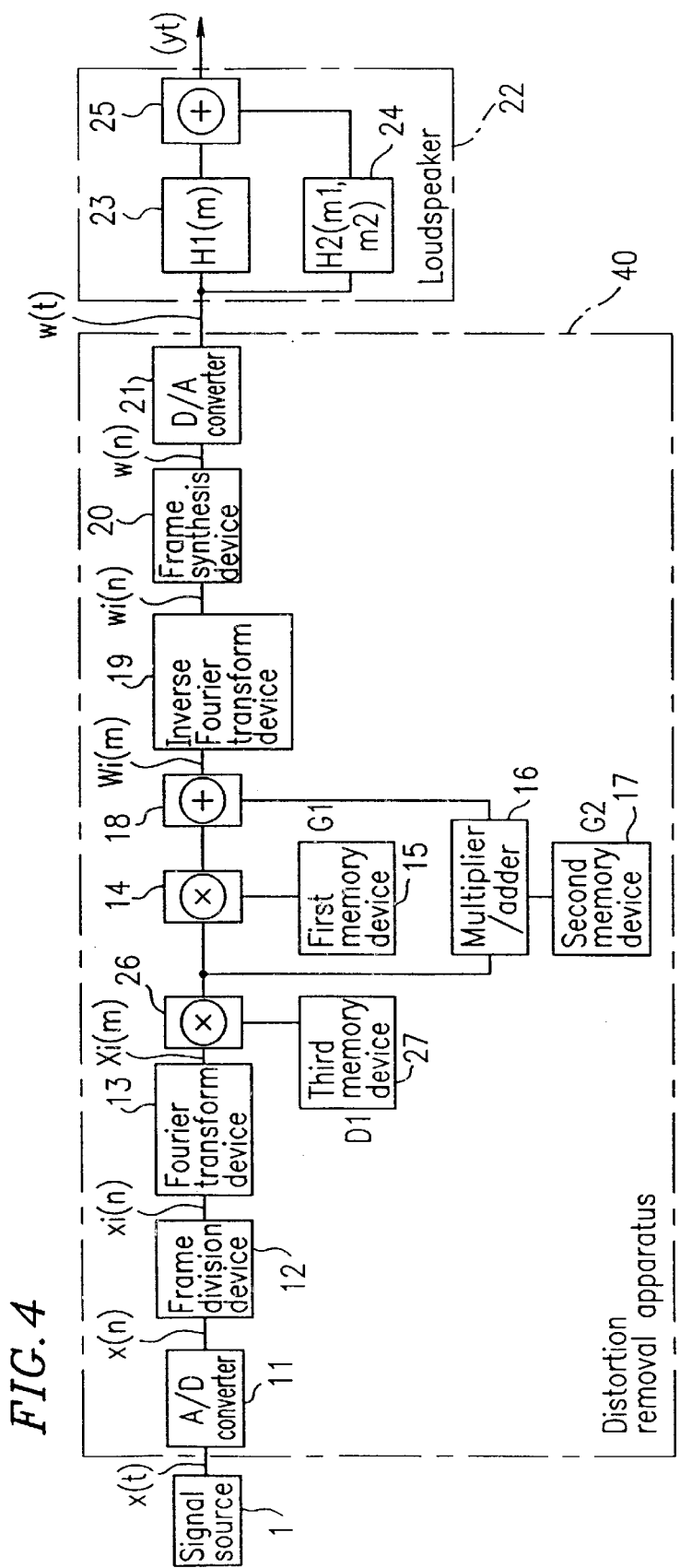
Figure 7:
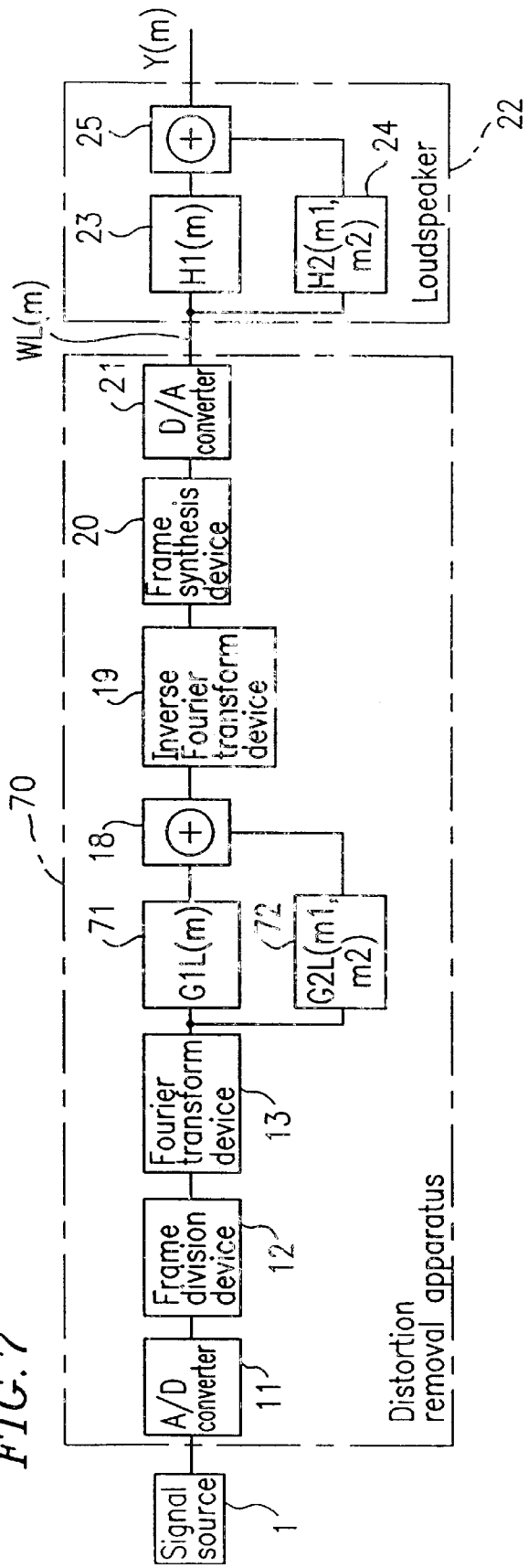
Figure 8A:
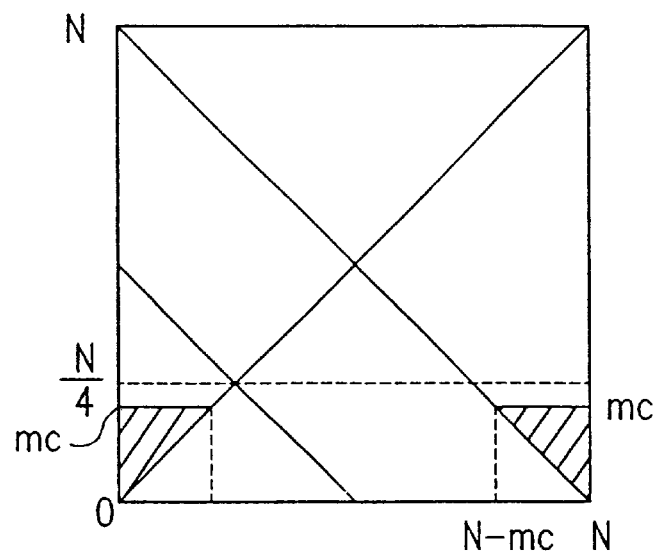
Figure 8B:
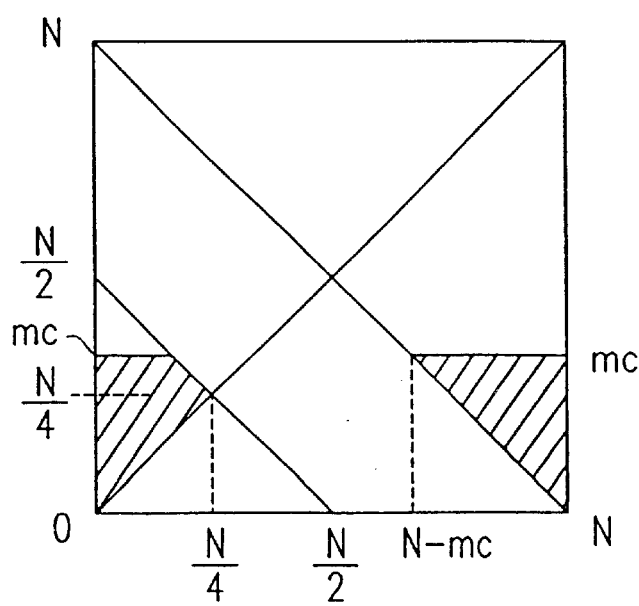
Figure 9:
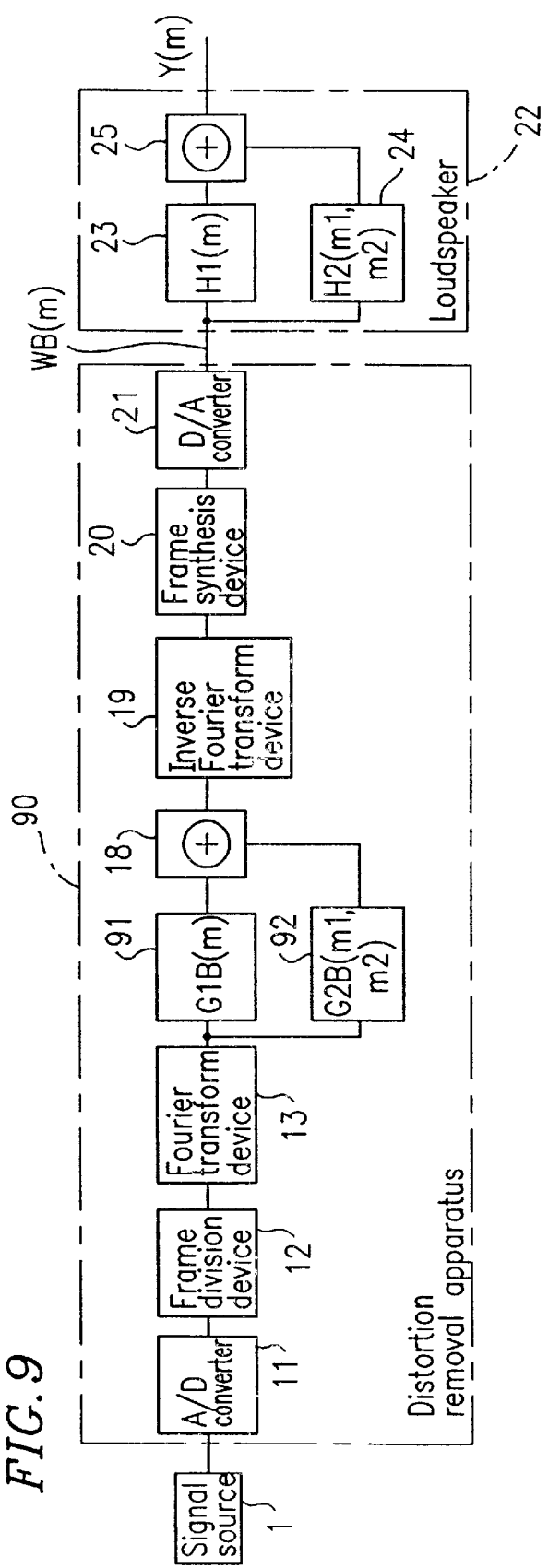
Figure 10A:
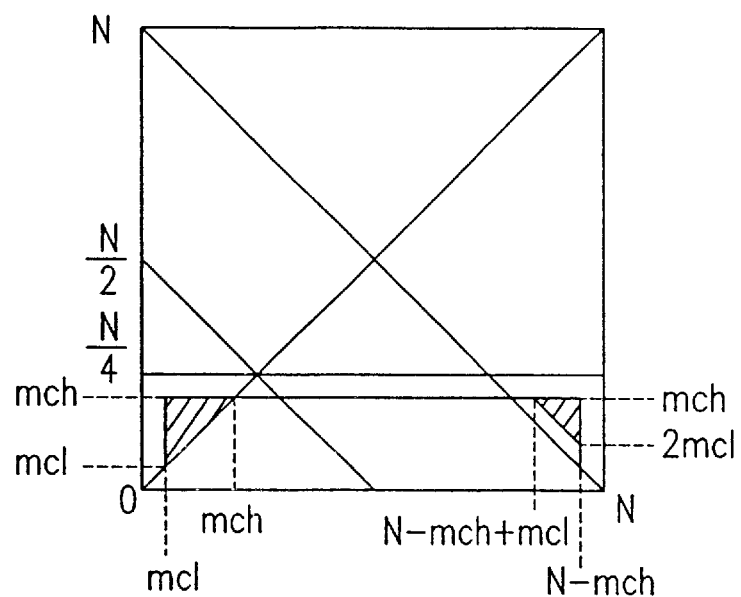
Figure 10B:
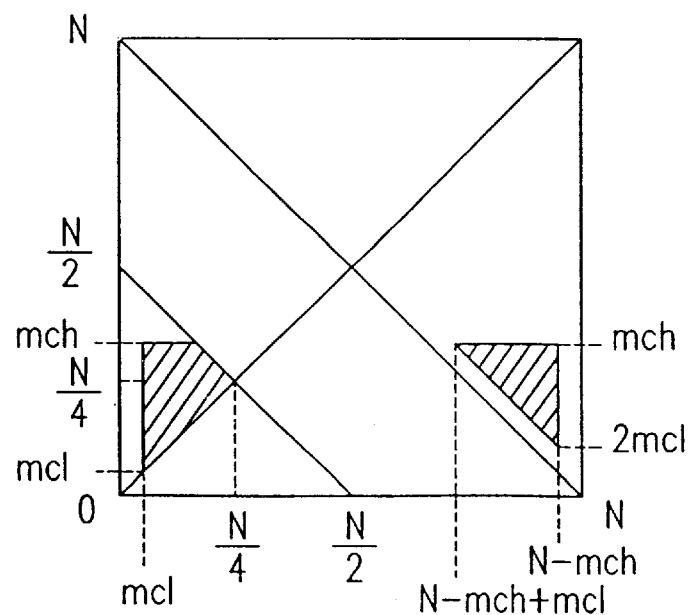
Figure 11:
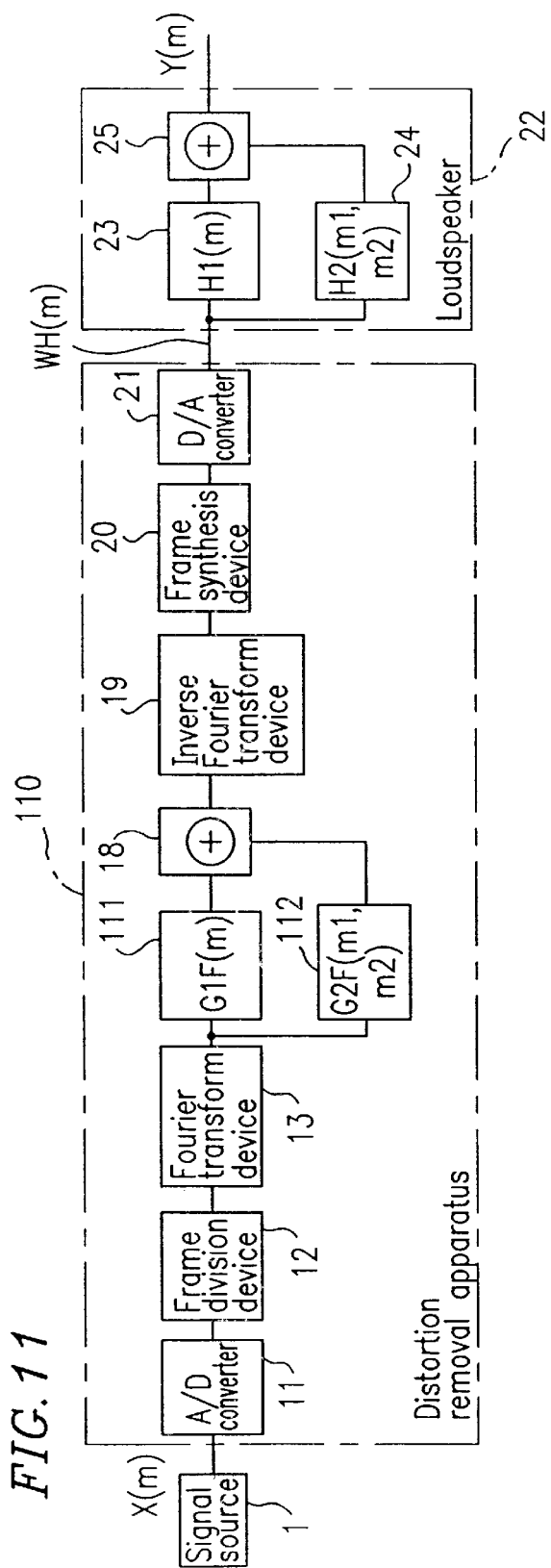
Figure 12:
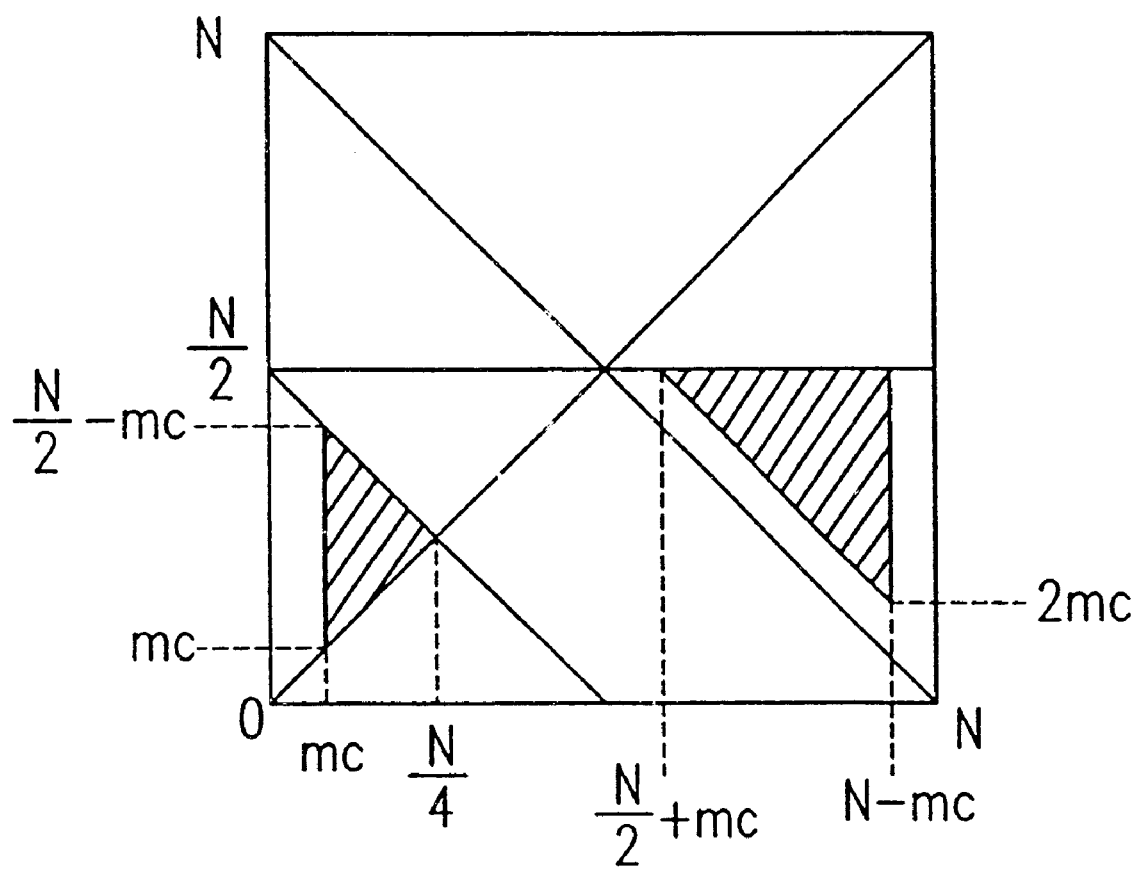
Figure 13:
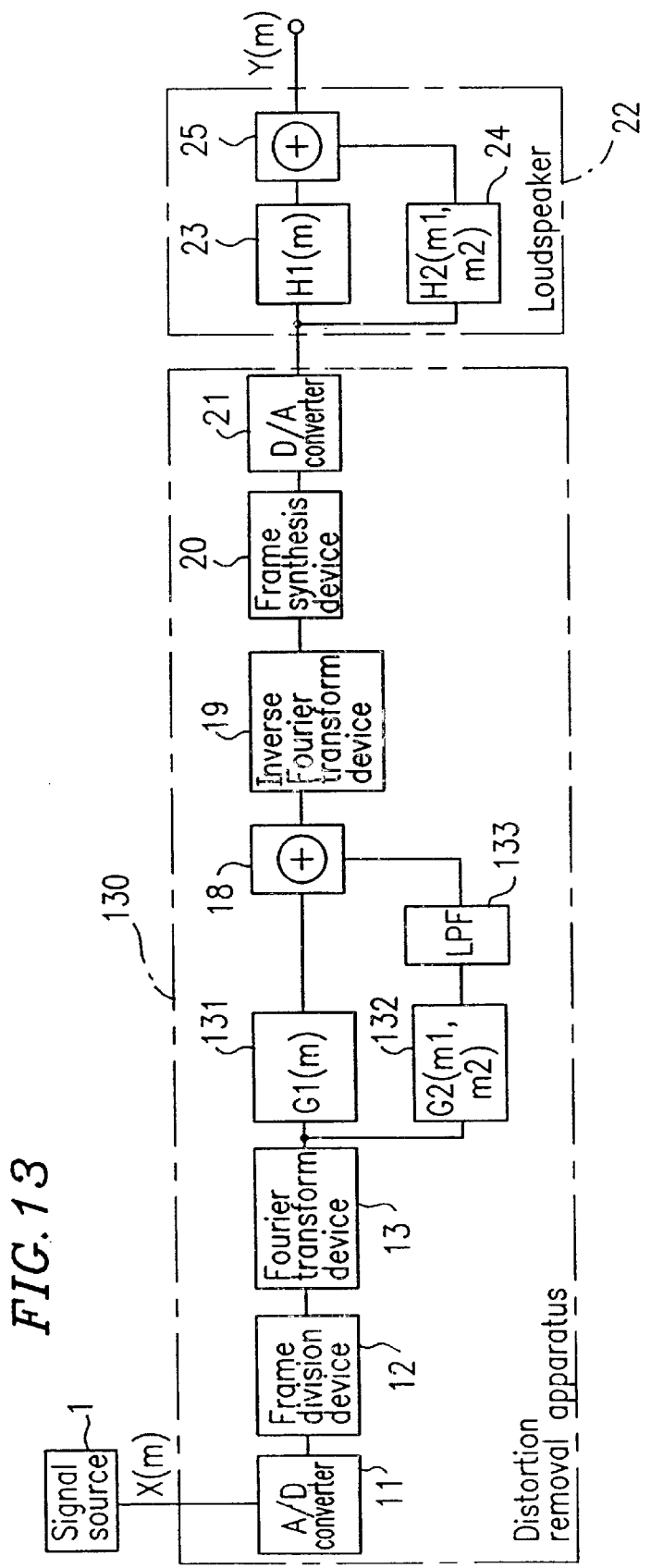
Figure 14:
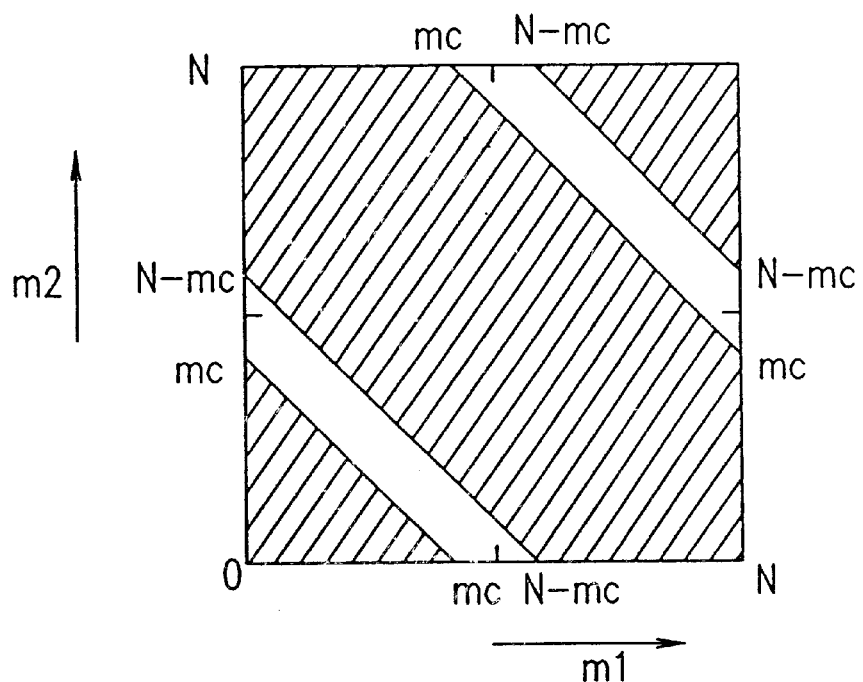
Figure 15:
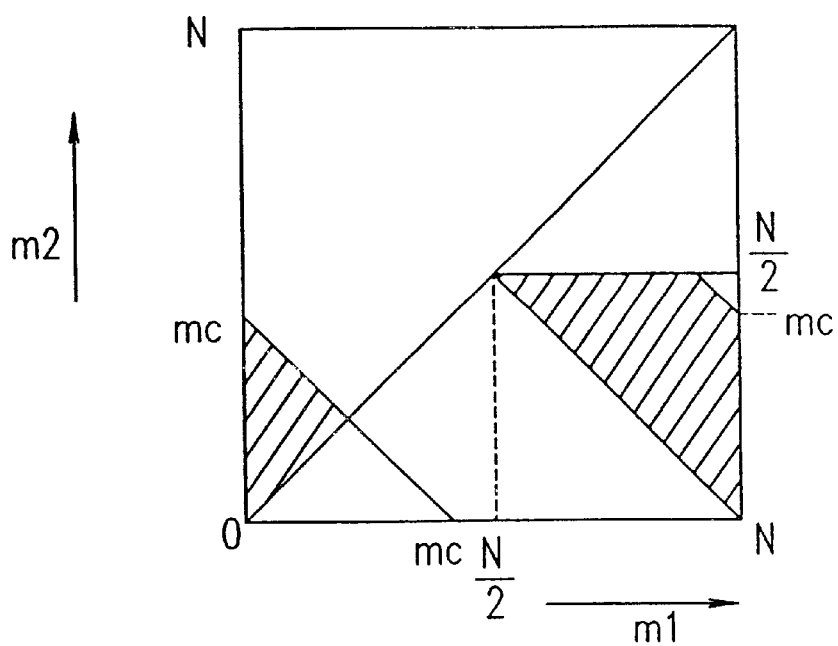
Figure 16:
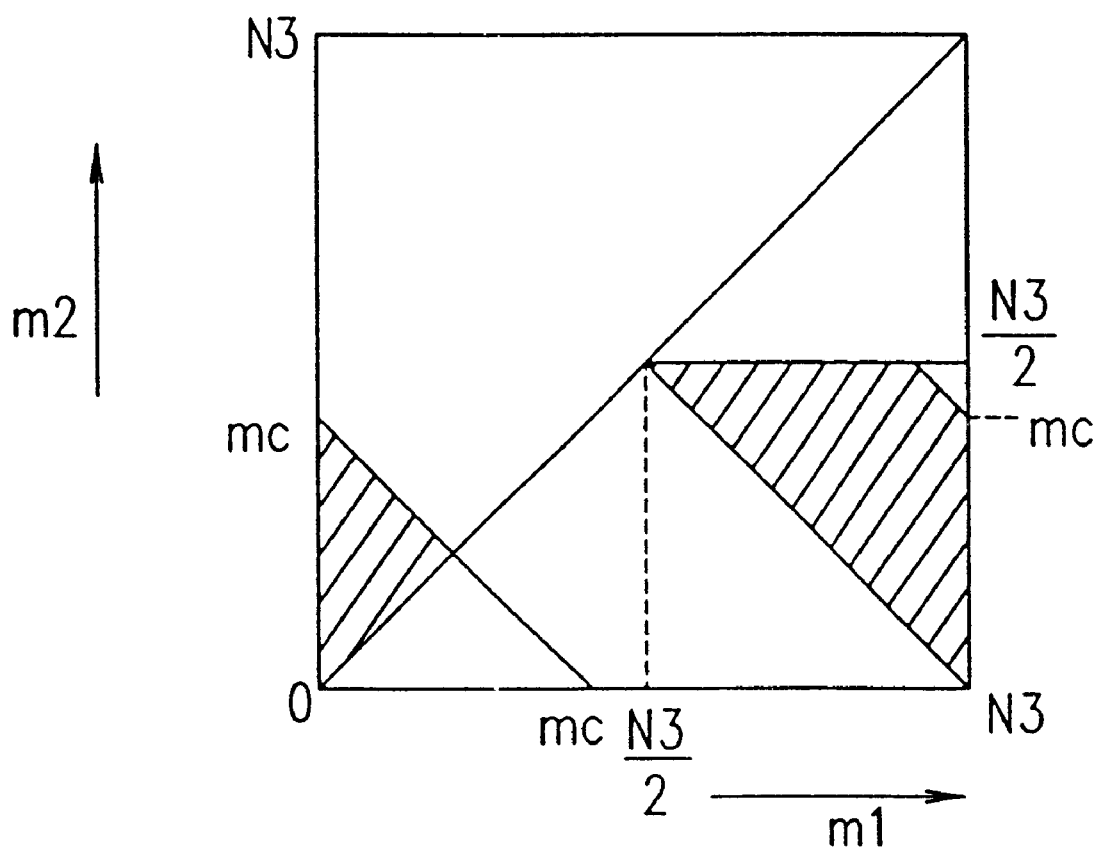
Figure 17:
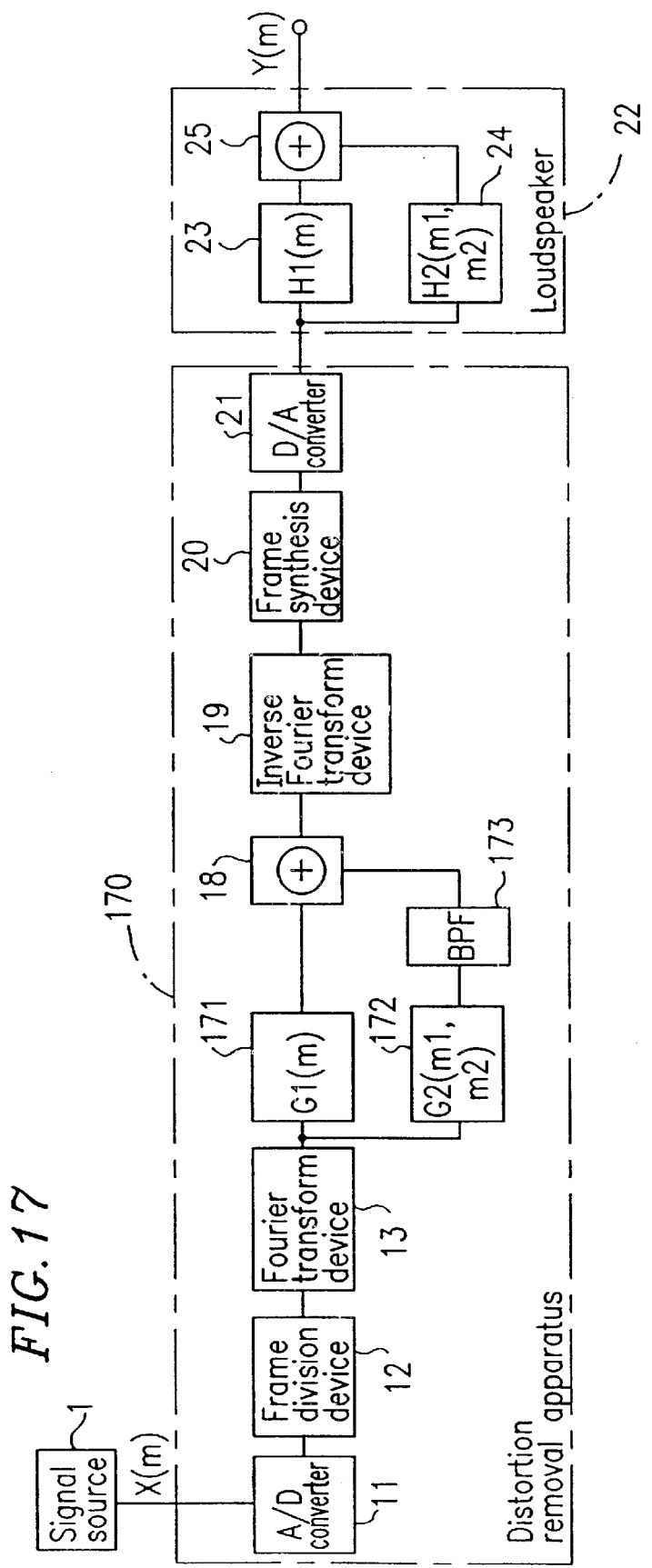
Figure 18:
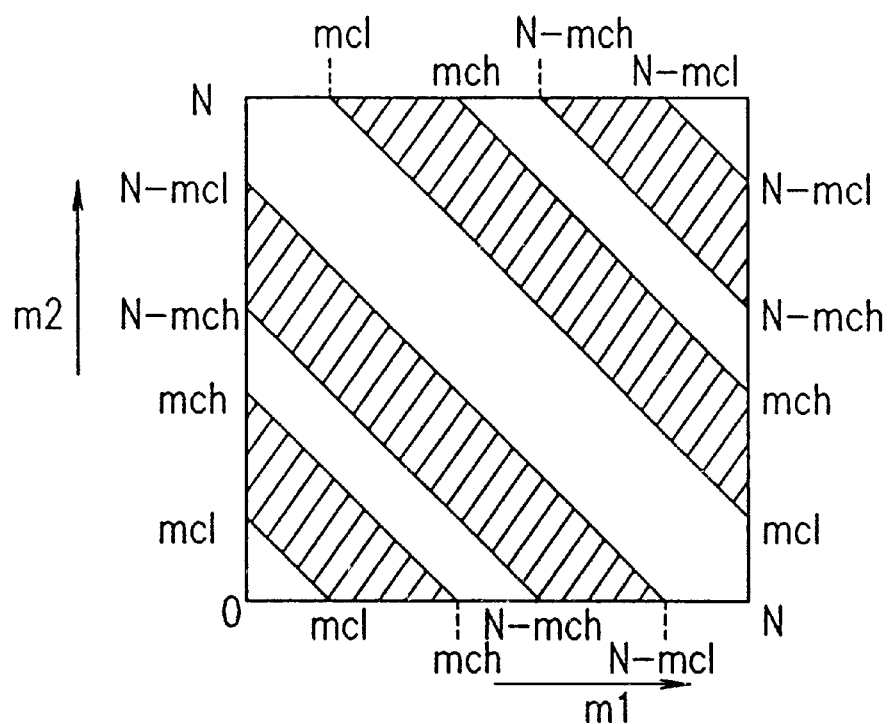
Figure 19:
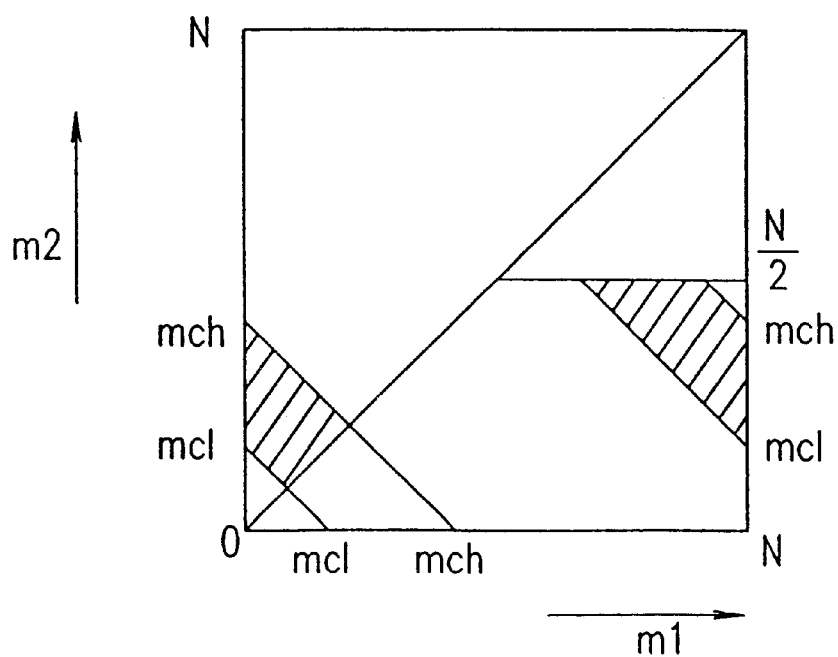
Figure 20:
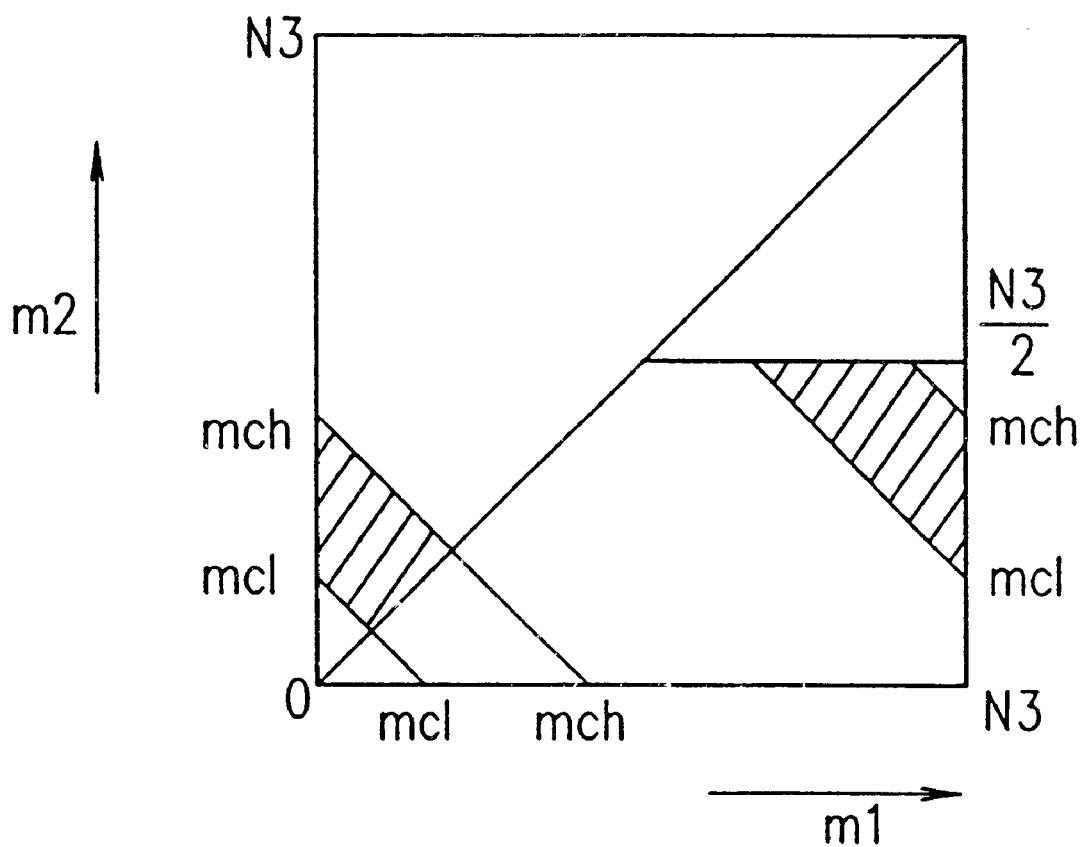
Figure 21:
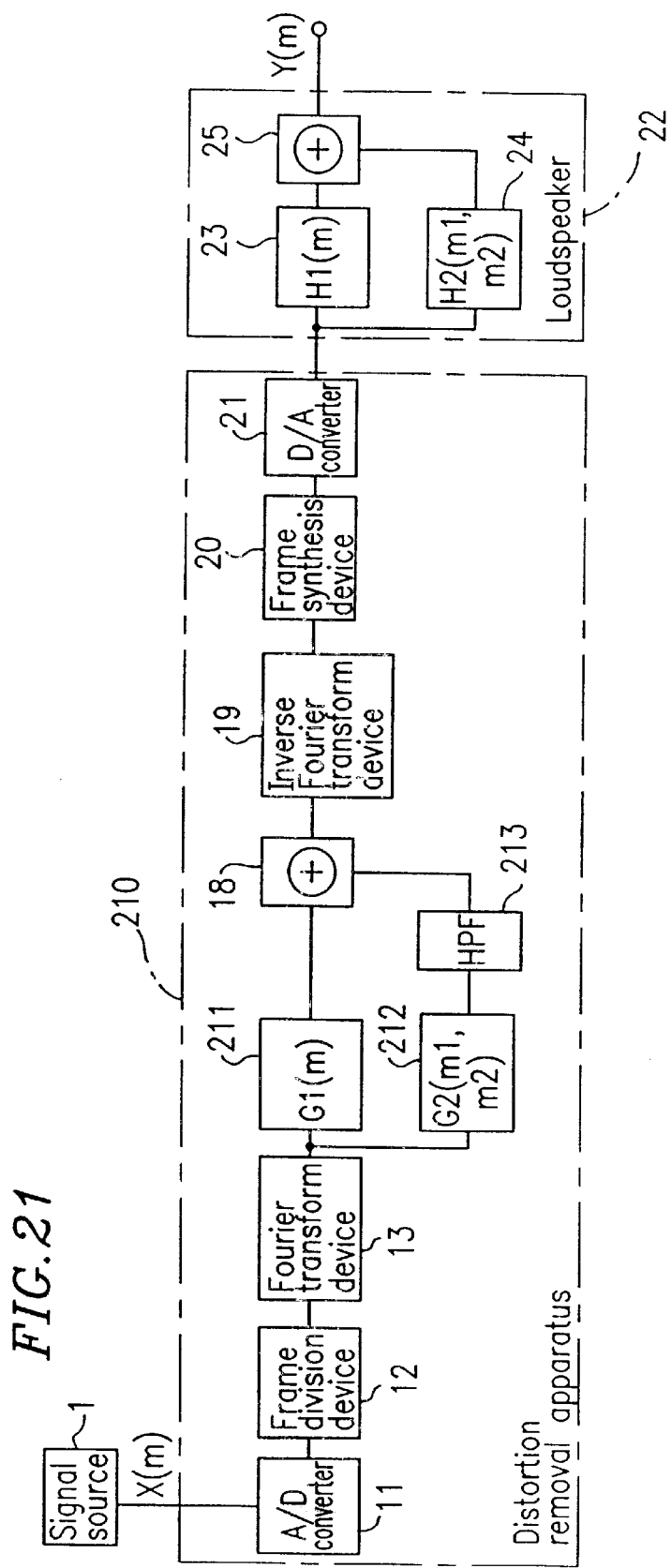
Figure 22:
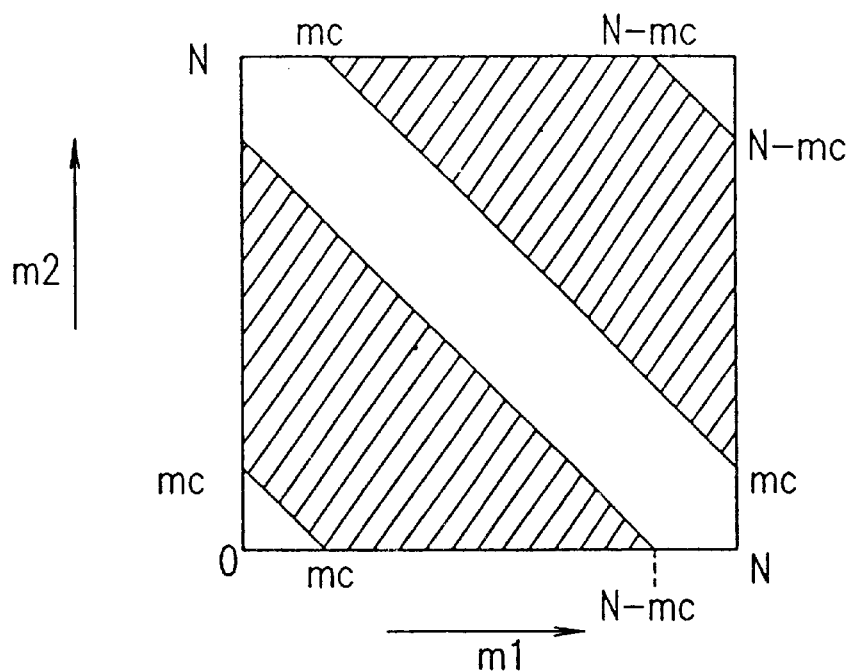
Figure 23:
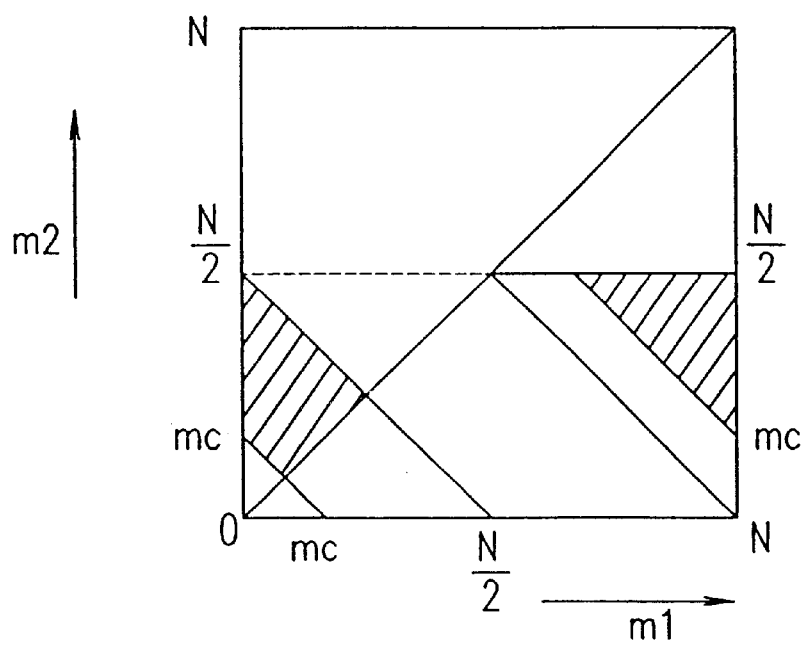
Figure 24:
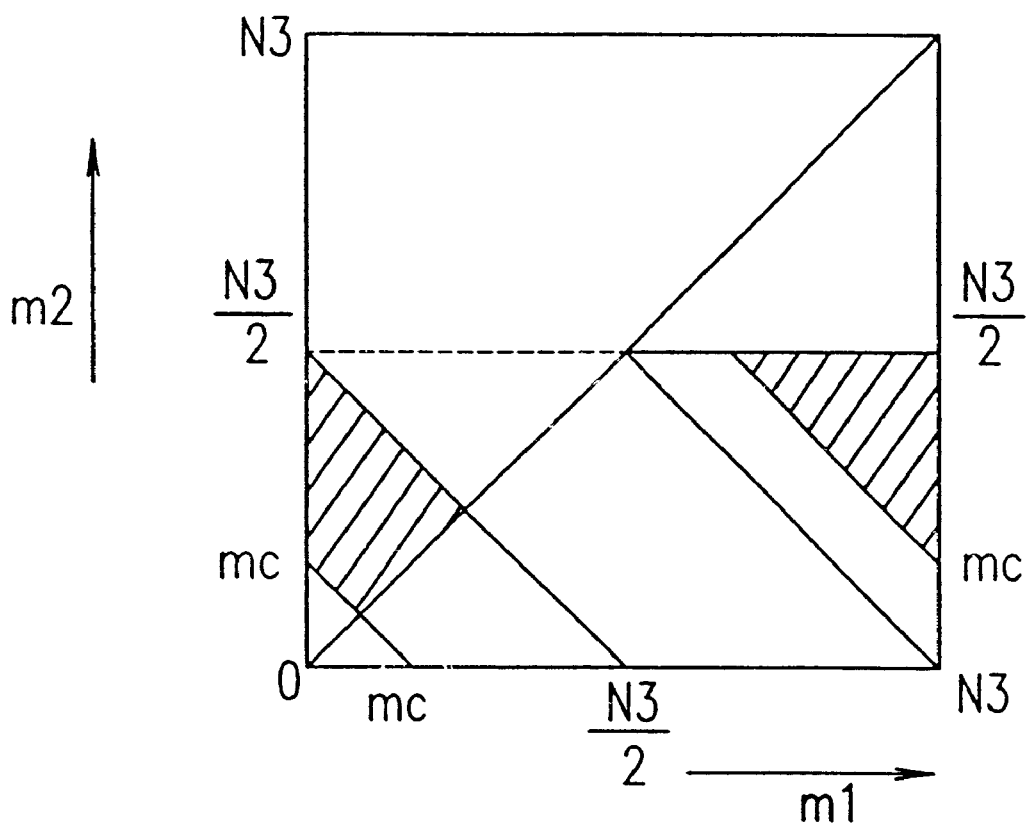
Figure 25:
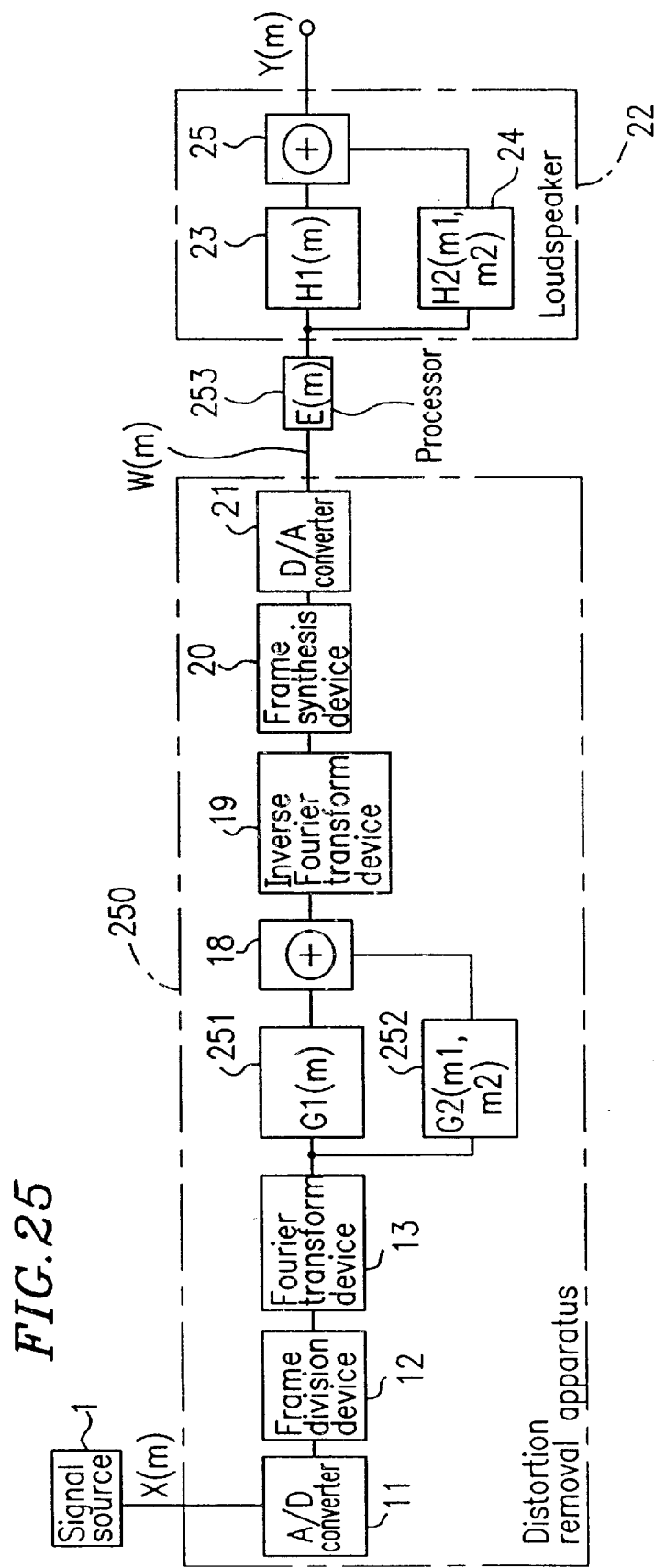
Figure 26:
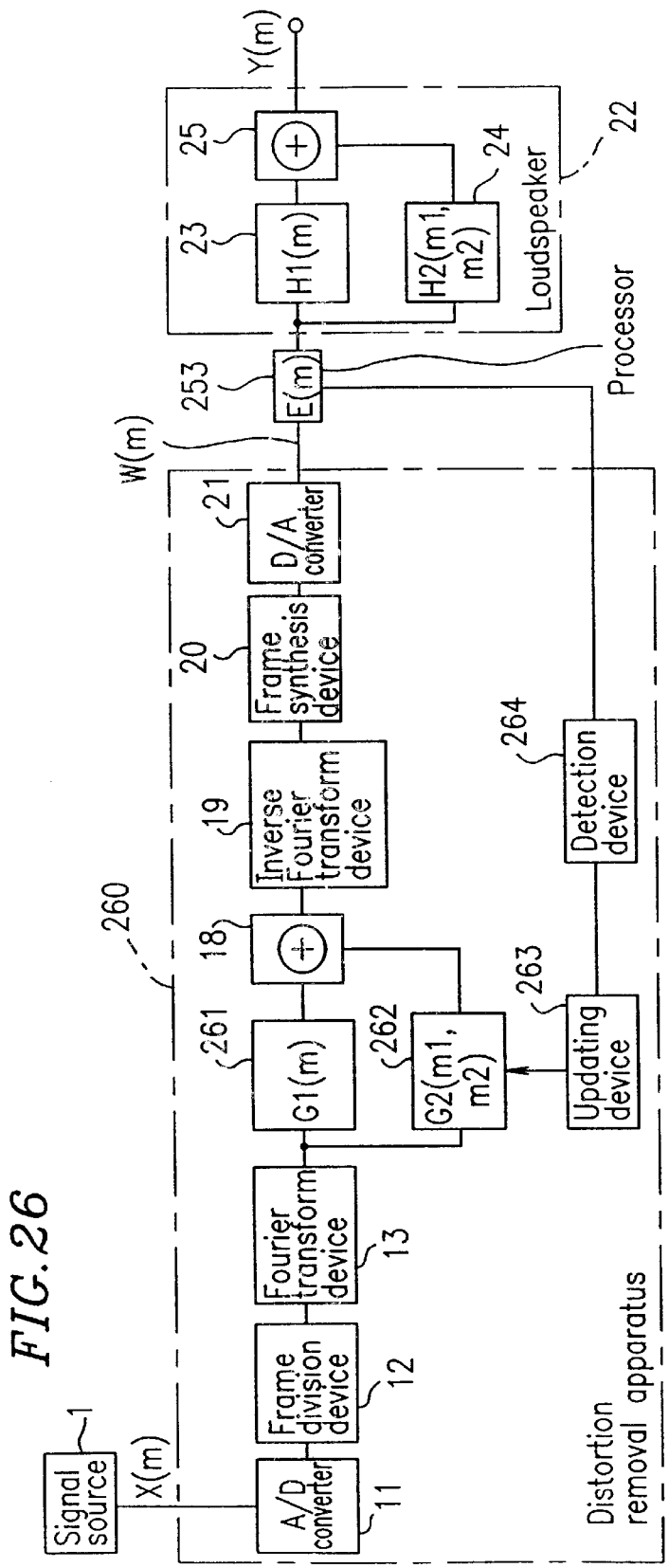
Figure 27:
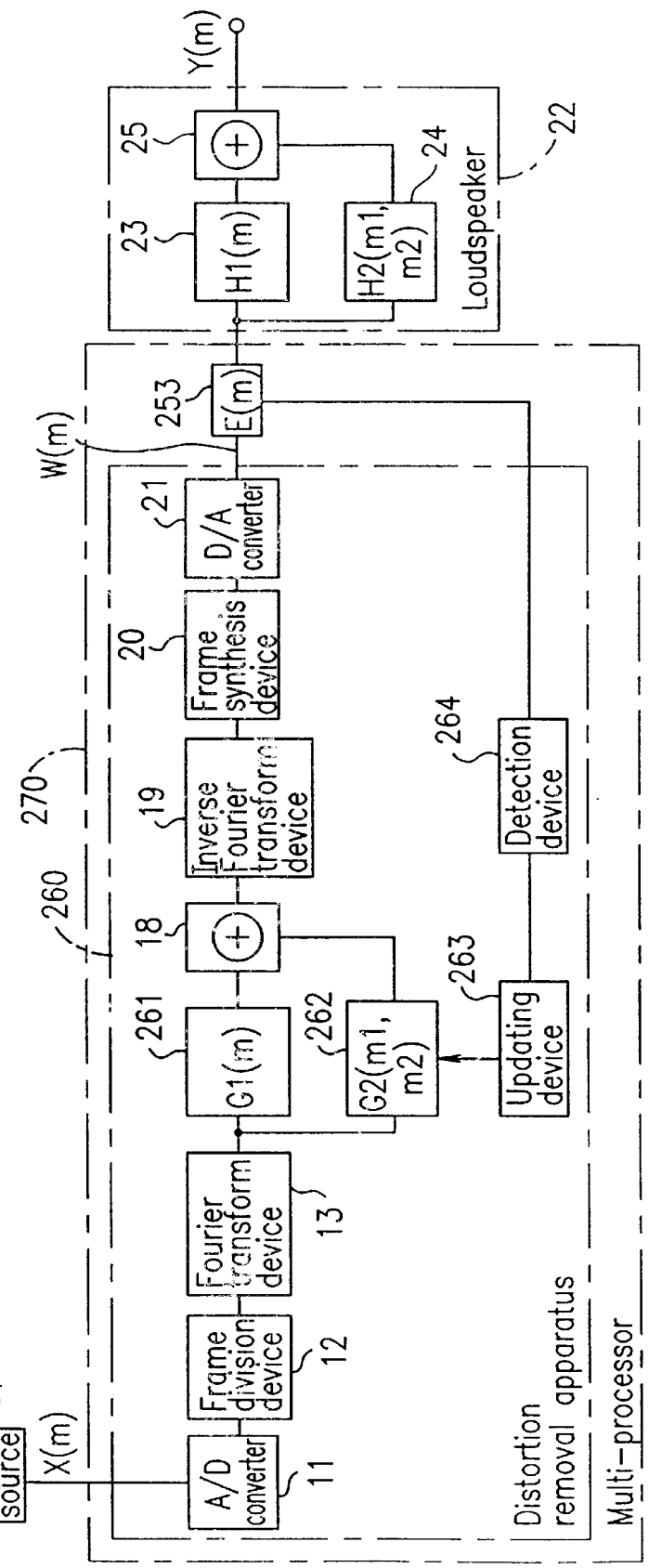
Figure 28:
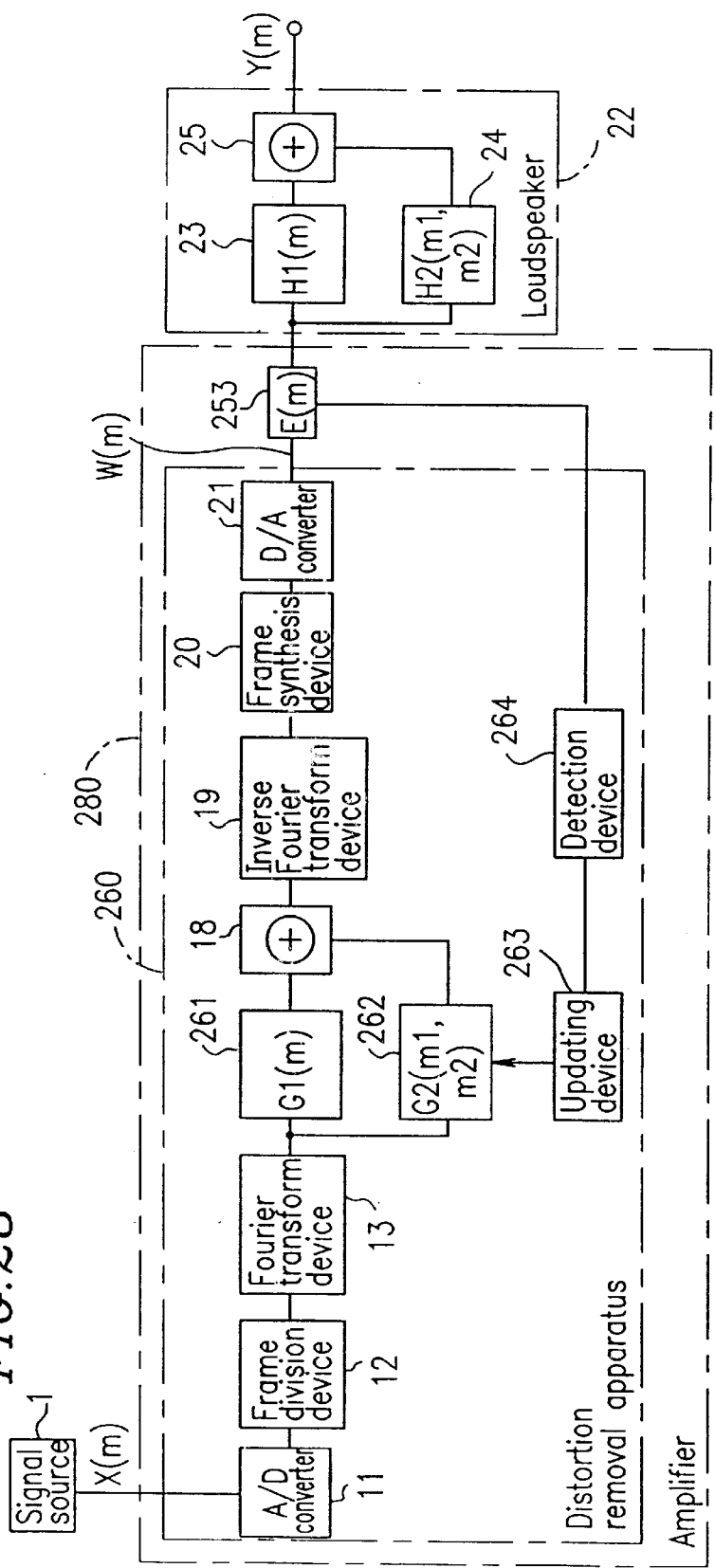
Figure 29:
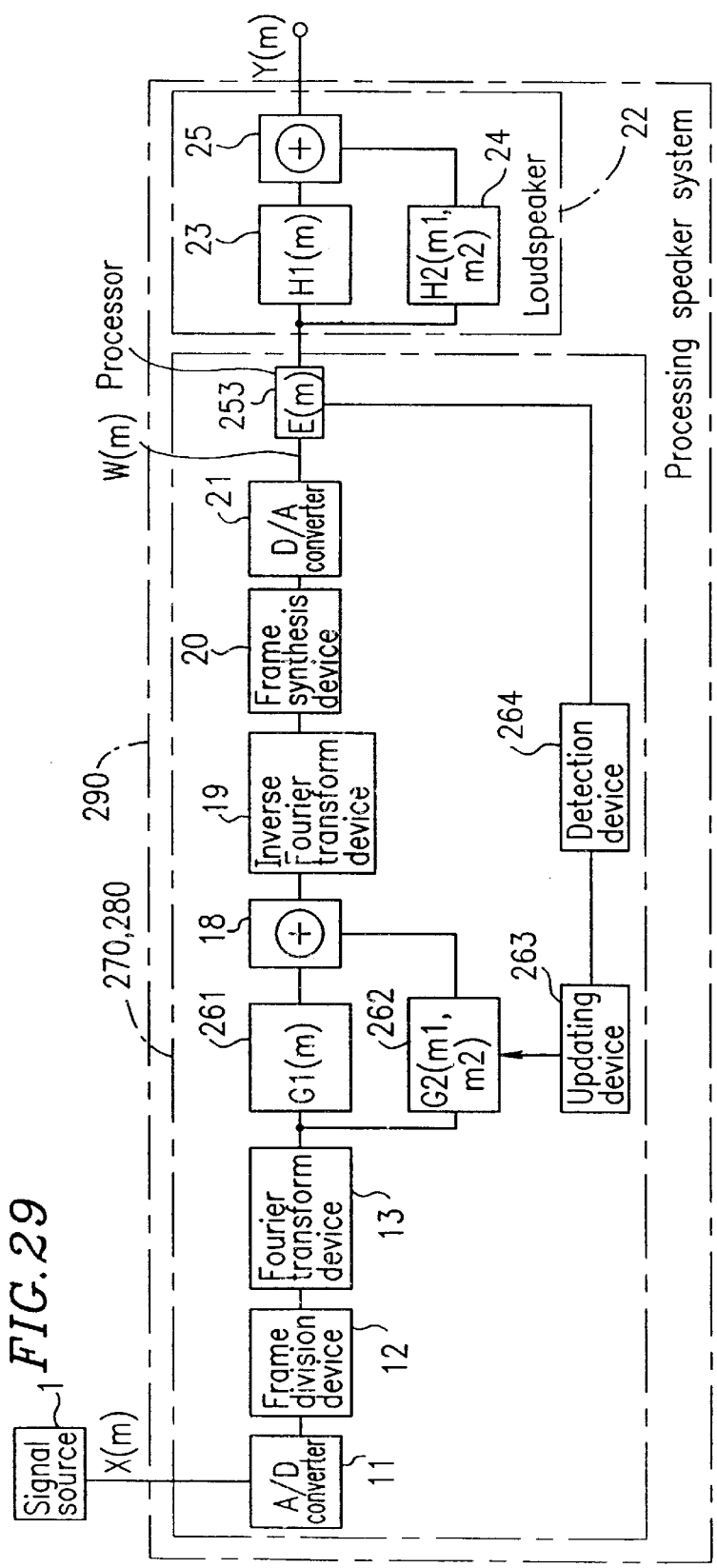
Figure 30:
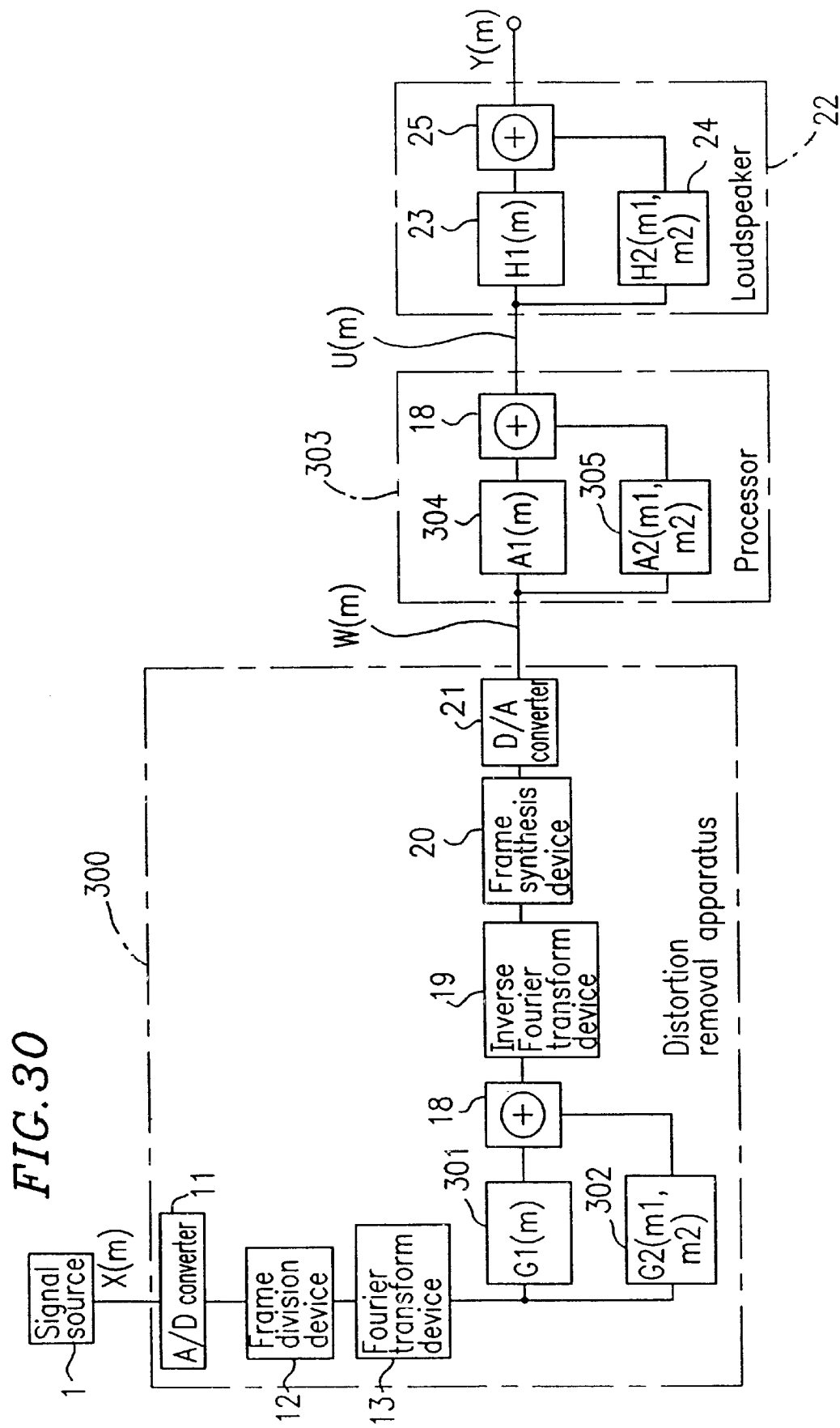
Figure 31:
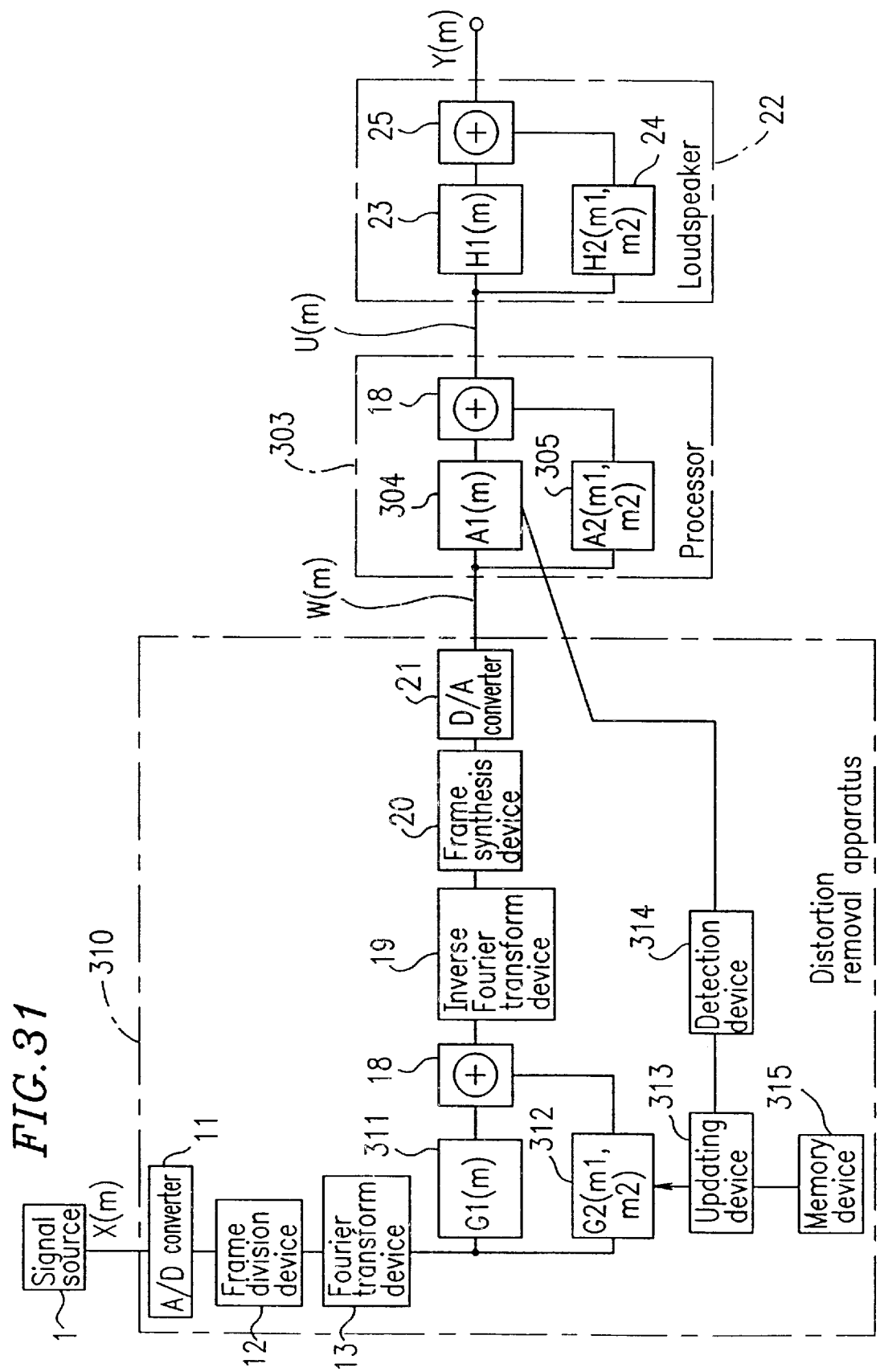
Figure 32:
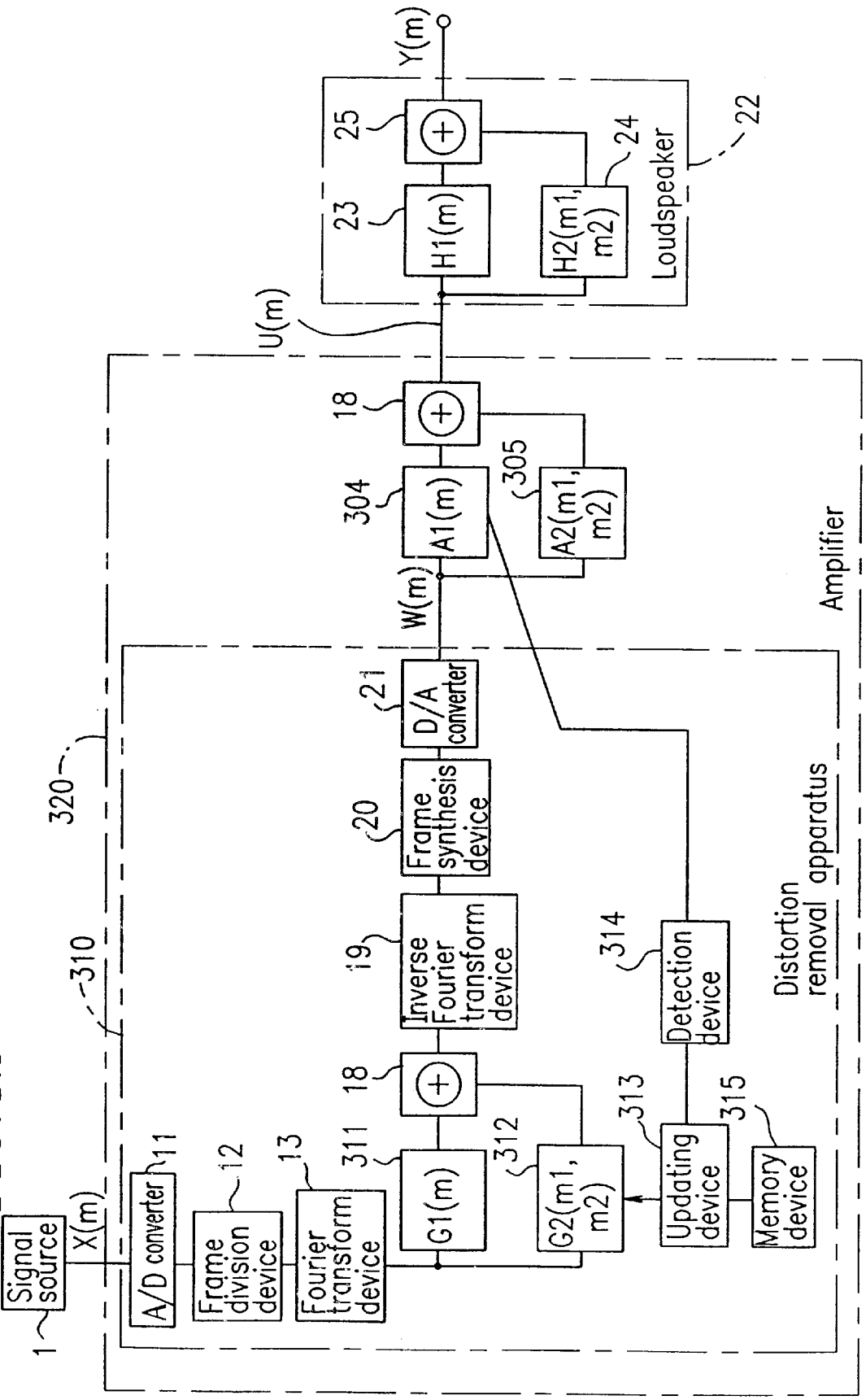
Figure 33:
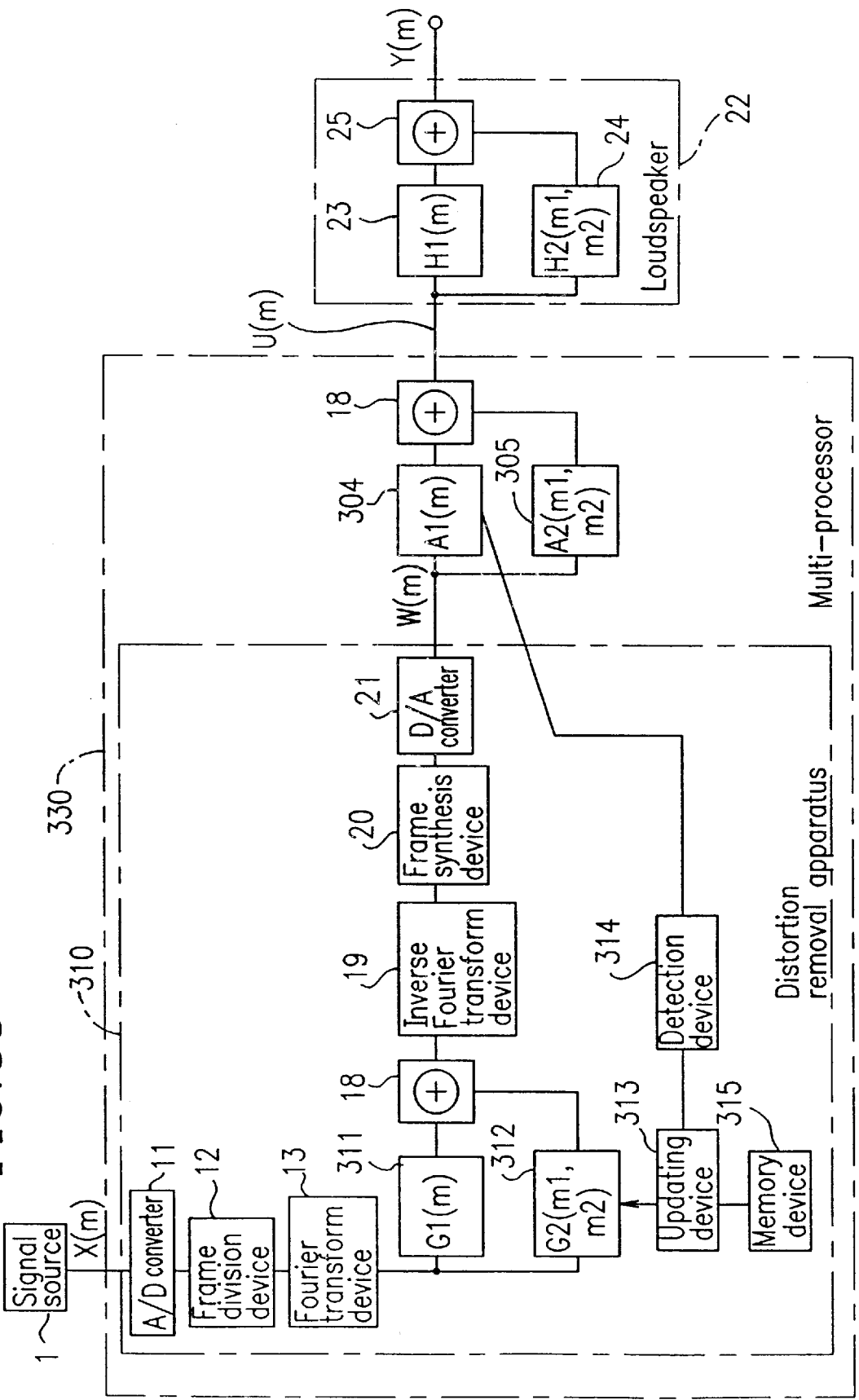
Figure 34:
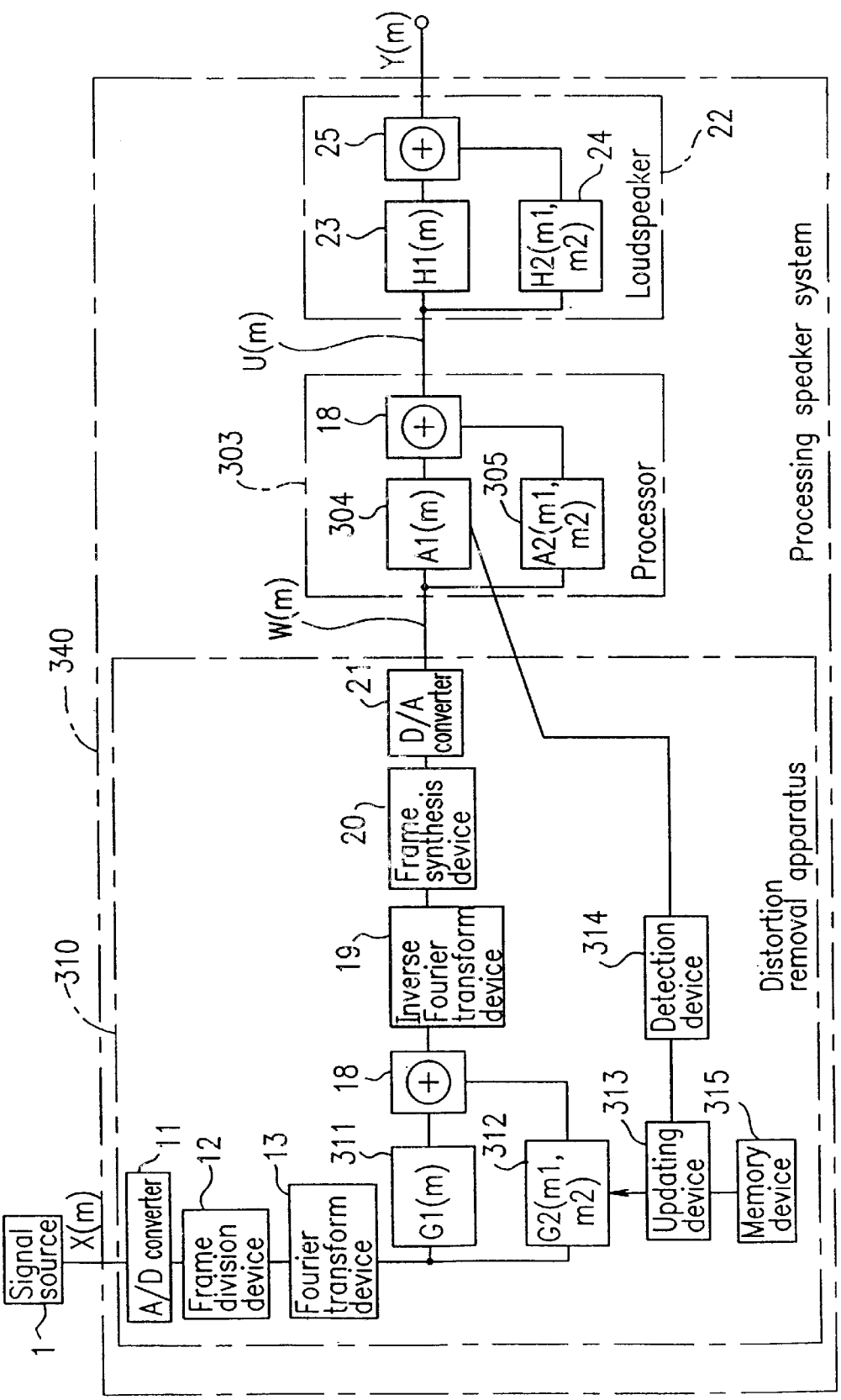

FIG. 3B is a diagram showing that the tap of the two-dimensional filter has an axially symmetrical characteristic with the diagonal line as the axis of symmetry;

FIG. 3C is a diagram showing that the tap of the two-dimensional filter has a conjugate relationship with the center of the tap as the center of the point symmetry;

FIG. 3D is a diagram showing that the results of convolution operation performed by the two-dimensional filter in the hatched areas and the other area have a conjugate relationship to each other in the distortion removal apparatus in the second example;

FIG. 4 is a block diagram of a distortion removal apparatus in a third example according to the present invention;

FIG. 5 is a block diagram of a processing speaker system in a fourth example according to the present invention;

FIG. 6 is a block diagram of a multi-processor system in a fifth example according to the present invention;

FIG. 7 is a block diagram of a distortion removal apparatus in a sixth example according to the present invention;

FIG. 8A is a diagram showing an example of an area of a two-dimensional filter for which the operation is to be substantially performed in a distortion removal apparatus having the function of a low-pass filter in a seventh example according to the present invention;

FIG. 8B is a diagram showing another example of an area of the two-dimensional filter for which the operation is to be substantially performed in the distortion removal apparatus having the function of the low-pass filter in the seventh example;

FIG. 9 is a block diagram of a distortion removal apparatus in an eighth example according to the present invention;

FIG. 10A is a diagram showing an example of an area of a two-dimensional filter for which the operation is to be substantially performed in a distortion removal apparatus having the function of a band-pass filter in a ninth example according to the present invention;

FIG. 10B is a diagram showing another example of an area of the two-dimensional filter for which the operation is to be substantially performed in the distortion removal apparatus having the function of the band-pass filter in the ninth example;

FIG. 11 is a block diagram of a distortion removal apparatus in a tenth example according to the present invention;

FIG. 12 is a diagram showing an area of a two-dimensional filter for which the operation is to be substantially performed in a distortion removal apparatus having the function of a high-pass filter in an eleventh example according to the present invention;

FIG. 13 is a block diagram of a distortion removal apparatus in a twelfth example according to the present invention;

FIG. 14 is a diagram showing an area of a two-dimensional filter for which the convolution operation is to be substantially performed in a distortion removal apparatus in the twelfth example in order to restrict the frequency of an output signal to a frequency equal to or less than the cut-off frequency of the reproduction frequency range of a system;

FIG. 15 is a diagram showing an area of a two-dimensional filter for which the convolution operation is to be substantially performed in a distortion removal apparatus in the twelfth example to reduce the total amount of the operation in order to restrict the frequency of an output signal to a frequency equal to or less than the cut-off frequency of the reproduction frequency range of a system;

FIG. 16 is a diagram showing an area of a transfer function of a second-order subsystem of the system for which measurement is to be substantially performed when the tap of the two-dimensional filter is determined in the distortion removal apparatus in the twelfth example for restricting the frequency of an output signal to a frequency equal to or less than the out-off frequency of the reproduction frequency range of the system;

FIG. 17 is a block diagram of a distortion removal apparatus in a thirteenth example according to the present invention;

FIG. 18 is a diagram showing an area of a two-dimensional filter for which the convolution operation is to be substantially performed in a distortion removal apparatus in the thirteenth example in order to restrict the frequency of an output signal to a frequency within the reproduction frequency range of a system;

FIG. 19 is a diagram showing an area of a two-dimensional filter for which the convolution operation is to be substantially performed in a distortion removal apparatus in the thirteenth example to reduce the total amount of the operation in order to restrict the frequency of an output signal to a frequency within the reproduction frequency range of a system;

FIG. 20 is a diagram showing an area of a transfer function of a second-order subsystem of the system for which measurement is to be substantially performed when the tap of the two-dimensional filter is determined in the distortion removal apparatus in the thirteenth example for restricting the frequency of an output signal to a frequency within the reproduction frequency range of the system;

FIG. 21 is a block diagram of a distortion removal apparatus in a fourteenth example according to the present invention;

FIG. 22 is a diagram showing an area of a two-dimensional filter for which the convolution operation is to be substantially performed in a distortion removal apparatus in the fourteenth example in order to restrict the frequency of an output signal to a frequency within the reproduction frequency range of a system;

FIG. 23 is a diagram showing an area of a two-dimensional filter for which the convolution operation is to be substantially performed in a distortion removal apparatus in the fourteenth example to reduce the total amount of the operation in order to restrict the frequency of an output signal to a frequency within the reproduction frequency range of a system;

FIG. 24 is a diagram showing an area of a transfer function of a second-order subsystem of the system for which measurement is to be substantially performed when the tap of the two-dimensional filter is determined in the distortion removal apparatus in the fourteenth example for restricting the frequency of an output signal to a frequency within the reproduction frequency range of the system;

FIG. 25 is a block diagram of a distortion removal apparatus in a fifteenth example according to the present invention;

FIG. 26 is a block diagram of a distortion removal apparatus in a sixteenth example according to the present invention;

FIG. 27 is a block diagram of a multi-processor in a seventeenth example according to the present invention;

FIG. 28 is a block diagram of a power amplifier for the loudspeaker in an eighteenth example according to the present invention;

FIG. 29 is a block diagram of a processing speaker system in a nineteenth example according to the present invention;

FIG. 30 is a block diagram of a distortion removal apparatus in a twentieth example according to the present invention;

FIG. 31 is a block diagram of a distortion removal apparatus in a twenty-first example according to the present invention;

FIG. 32 is a block diagram of a power amplifier for the loudspeaker in a twenty-second example according to the present invention;

FIG. 33 is a block diagram of a multi-processor the loudspeaker in a twenty-third example according to the present invention; and FIG. 34 is a block diagram of a processing speaker system in a twenty-fourth example according to the present invention.

DESCRIPTION OF THE PREFERRED EMBODIMENTS

Hereinafter, the present invention will be described by way of illustrative examples with reference to the accompanying drawings.

EXAMPLE 1

Figure 1:
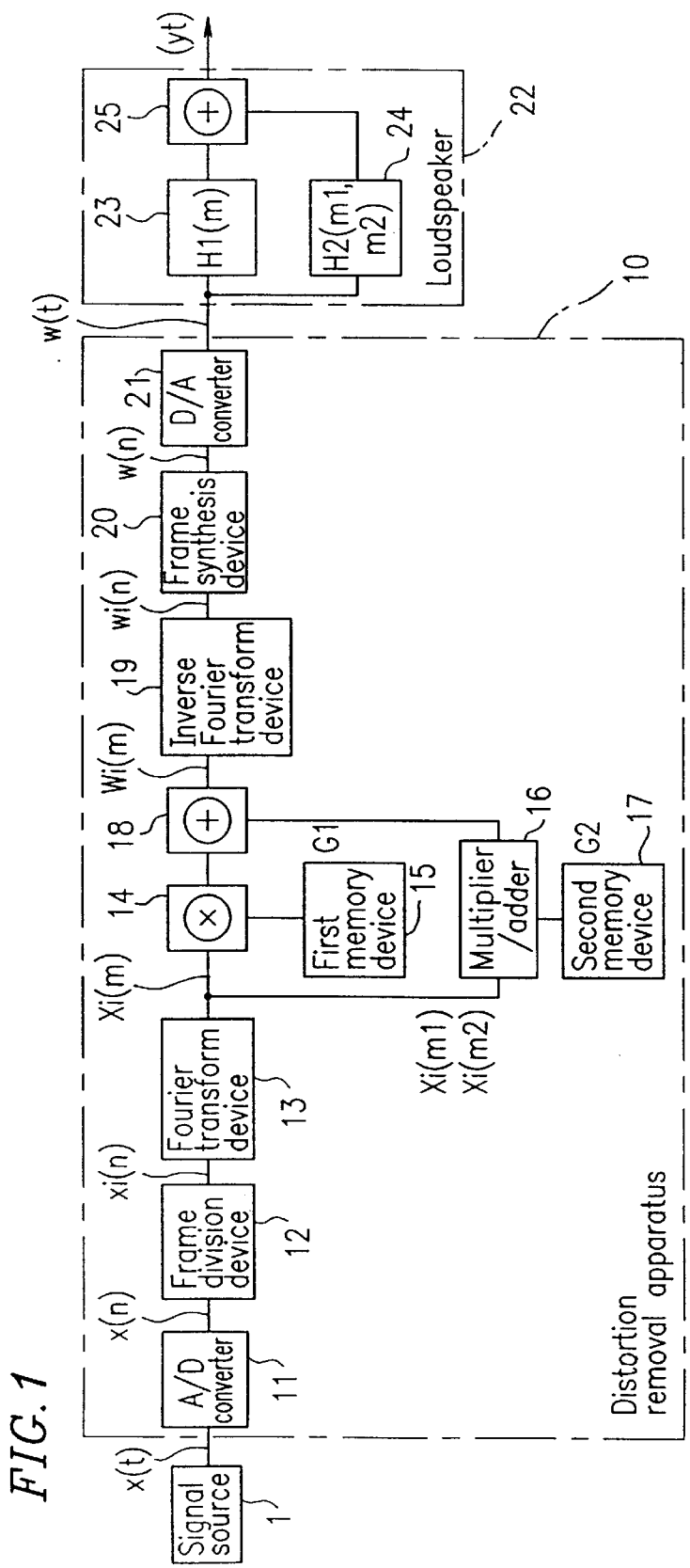
FIG. 1 is a block diagram of a distortion removal apparatus in a first example according to the present invention.

FIG. 1 is a block diagram showing a first example according to the present invention.

In the first example, a distortion removal apparatus and a method of operation for reducing the distortion even when a factor of generation of the distortion in a system is not clear are provided.

A distortion removal apparatus 10 includes an A/D converter 11 for receiving a signal output from a signal source 1, and a frame division device 12 for dividing every N−N1+1 pieces of data in the signal output from the A/D converter 11 so as to have a length of N (frame) and taking in the resultant signals, where N>N1. The distortion removal apparatus 10 further includes a Fourier transform device 13 for performing Fourier transform of the signal obtained by the frame division device 12, a first memory device 15 for storing a first coefficient of a one-dimensional digital filter having a tap length of N in a frequency domain, and a multiplier 14 for performing multiplication in the first term of the right side of the expression (1) using the first coefficient and the output signal from the Fourier transform device 13.

$$W(m) = G1(m)X(m) + \sum_{\substack{m=m1+m2 \\ \text{or} \\ |m1-m2|}} G2(m1, m2)X(m1)X(m2) \quad \text{expression (1)}$$

The distortion removal apparatus 10 still further includes a second memory device 17 for storing a second coefficient which is a two-dimensional arrangement of N×N in a frequency domain, a multiplier/adder 16 for performing multiplication and addition in the second term of the right side of expression (1) using the second coefficient and the output signal from the Fourier transform device 13, and an adder 18 for adding the output signal from the multiplier 14 and the output signal from the multiplier/adder 16. Still further, the distortion removal apparatus 10 includes an inverse Fourier transform device 19 for performing inverse Fourier transform of the output signal from the adder 18, a frame synthesis device 20 for sequentially connecting a first through N'th data of the output signal from the inverse Fourier transform device 19 and outputting the resultant signal, and a D/A converter 21 for converting the output signal from the frame synthesis device 20 into an analog signal.

The distortion removal apparatus 10 removes a distortion generated in a general system which generates a second-order distortion. Herein, the "second-order distortion" refers to a second-order nonlinear distortion including harmonic and intermodulation distortions.

The system is, for example, a loudspeaker 22.

In the case where the system is a loudspeaker 22, the signal source 1 can be a sound source such as a CD player, and the signal from the sound source is an audio signal in a time domain. When an audio signal having a frequency of m is input to the loudspeaker 22, a harmonic distortion having a frequency of 2m is generated and is reproduced with the signal having a frequency of m. When two signals having frequencies of m1 and m2 are input, intermodulation distortion having frequencies of (m1+m2) and |m1−m2| is generated and is reproduced with the signals having frequencies of m1 and m2.

The distortion removal apparatus 10 having the above-described structure operates in the following manner.

Figure 2A:
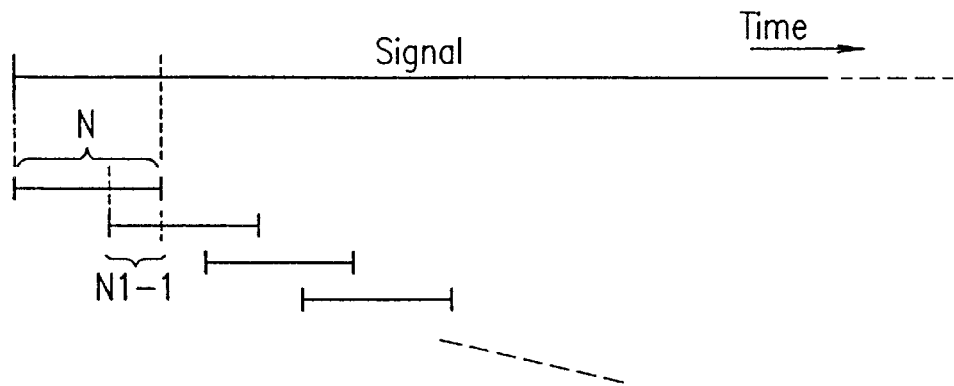
FIG. 2A is a diagram showing a method of frame division performed by a frame division device of the distortion removal apparatus shown in FIG. 1 in a time domain.
Figure 2B:
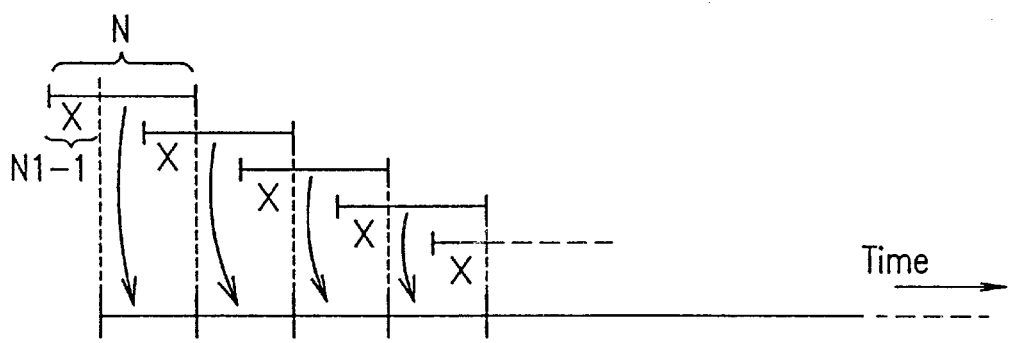
FIG. 2B is a diagram showing a method of audio signal connection performed by a frame synthesis device of the distortion removal apparatus shown in FIG. 1 in the time domain.

When an analog audio signal x(t) is input to the distortion removal apparatus 10 from, for example, a CD player via an audio amplifier, the A/D converter 11 converts the signal x(t) into a digital signal x(n). As shown in FIGS. 2A and 2B, each time the frame division device 12 receives N−N1+1 pieces of data of the output signal x(n), the frame division device 12 cuts out and outputs a frame (data stream) having a length of N from the trailing end of the signal x(n). Accordingly, the N1−1 pieces of data from the leading end of a frame overlaps the N1−1 pieces of data from the trailing end of the immediately prior frame and thus is the same data. In this case, N>N1. The signal having a length of N cutout as the i'th frame is input to the Fourier transform device 13 and transformed into a signal Xi(m) in a frequency domain. Herein, "m" is an integer representing the number of discrete points on a frequency axis and corresponds to the frequency.

The signal Xi(m) is treated by the operation represented by expression (2) by the multiplier 14, the first memory device 15, the multiplier/adder 16, the second memory device 17, and an adder 18, and as a result, a signal Wi(m) is derived.

$$Wi(m) = G1(m)Xi(m) + \sum_{\substack{m=m1+m2 \\ \text{or} \\ |m1-m2|}} G2(m1, m2)Xi(m1)Xi(m2) \quad \text{expression (2)}$$

The operation represented by expression (2) will be described in detail. The multiplier 14 multiplies a first coefficient G1 having a tap length of N stored in the first memory device 15 and the output signal Xi(m) from the Fourier transform device 13 for each m. This refers to the first term of the right side of expression (2). The multiplier/adder 16 performs the operation in the second term of the right side of expression (2) using a second coefficient G2(m1, m2) which is a two-dimensional arrangement of N×N stored in the second memory device 17, the signal Xi(m1) and the signal Xi(m2). Herein, "m1" and "m2" each represent an integer corresponding to the frequency. The second term of the right side of expression (2) refers to add m1 and m2 in any combination which fulfills m=m1+m2 or m=|m1−m2|. For example, when m corresponds to a frequency of 5 kHz, there are a maximum of N usable combinations of m1 and m2 including (1+4) kHz, (2+3) kHz, and |7−2| kHz.

The adder 18 adds the output signal from the multiplier 14 and the output signal from the multiplier/adder 16 to each m and outputs a signal Wi(m). This refers to adding the first term and the second term of the right side of expression (2).

The output signal Wi(m) from the adder 18 is input to the inverse Fourier transform device 19 and transformed into a signal wi(n) in a time domain. The frame synthesis device 20 discards up to the (N1−1)'th data from the leading end of the signal wi(n), cutouts wi(N1) through wi(N) data, and sequentially outputs w1(N1) . . . w1(N), w2(N1), w2(N), w3(N1), . . . The D/A converter 21 converts the output signal from the frame synthesis device 20 to an analog signal w(t). The resultant analog signal is input to the loudspeaker 22 as the output signal from the distortion removal apparatus 10.

The first coefficient and the second coefficient are determined in the following manner.

The loudspeaker 22 includes a system 23 of linear transfer function H1(m), a system 24 of nonlinear second-order transfer function H2(m1, m2) generating a distortion, and an adder 25. The input/output characteristic of the loudspeaker 22 can be represented by expression (3) by a frequency domain.

$$Y(m) = H1(m)W(m) + \sum_{\substack{m=m1+m2 \\ \text{or} \\ |m1-m2|}} H2(m1, m2)W(m1)W(m2) \quad \text{expression (3)}$$

The relationship between the audio signal x(t) output from, for example, the CD player via the amplifier and the output sound pressure y(t) from the loudspeaker 22 is represented in a frequency domain by expression (4) by substituting W(m) of expression (1) into expression (3) and erasing W(m).

$$Y(m) = G1(m)H1(m)X(m) + \\ \sum_{\substack{m=m1+m2 \\ \text{or} \\ |m1-m2|}} \{H1(m)G2(m1, m2) + H2(m1, m2) \\ G1(m1)G1(m2)\}X(m1)X(m2) \quad \text{expression (4)}$$

The first term of the right side of expression (4) represents a component of the audio signal x(t) which passes through the multiplier 14 and the system 23 of the transfer function H1 of the loudspeaker 22. The first term in the braces of the second term of the right side of expression (4) represents a component of the audio signal x(t) which passes through the multiplier/adder 16 and the system 23 of the transfer function H1 of the loudspeaker 22. The second term in the braces of the second term of expression (4) represents a component of the audio signal x(t) which passes through the multiplier 14 and the system 24 having the transfer function H2(m1, m2) representing the distortion generated in the loudspeaker 22.

The component of the audio signal x(t) which passes through the multiplier/adder 16 and the system 24 having the transfer function H2(m1, m2) representing the distortion generated in the loudspeaker 22 is negligible compared to the other components and ignored.

The distortion generated in the loudspeaker 22 can be removed by causing the two terms in the braces of the second term of the right side of expression (4) to cancel each other and so to be zero.

The first coefficient G1(m) for the first memory device 15 is determined so that the first term of the right side of expression (4) equals a desirable output sound pressure from the loudspeaker 22. For example, in order to cause the output signal Y(m) equal the audio signal X(m), expression (6) is derived from expression (5).

$$X(m)=H1(m)G1(m)X(m) \quad \text{expression (5)}$$

$$G1(m) = \frac{1}{H1(m)} \quad \text{expression (6)}$$

Alternatively, in the case where an audio signal influenced by the transfer characteristic H1(m) of the loudspeaker 22 and delayed by a delay circuit needs to be obtained as an output signal, the transfer function G1 of the first filter can be represented by expression (8) from expression (7).

$$H1(m)D(m)X(m)=H1(m)G1(m)X(m) \quad \text{expression (7)}$$

$$G1(m)=D(m) \quad \text{expression (8)}$$

Next, the second coefficient G2(m1, m2) for the second memory device 17 is determined as follows.

The distortion generated in the loudspeaker 22 can be removed by causing the two terms in the braces of the second term of the right side of expression (4) to cancel each other to be zero. Assuming the value in the braces equal zero, expression (9) is derived from expression (4) for the second coefficient G2(m1, m2).

$$G2(m1, m2) = -\frac{H2(m1, m2)}{H1(m)}G1(m1)G1(m2) \quad \text{expression (9)}$$

The second coefficient G2(m1, m2) can be determined by substituting the first-order transfer function H1(m), the second-order distortion transfer function H2(m1, m2) of the loudspeaker 22, and the first coefficient G1(m) for the first memory device 15 determined in the above-described manner to expression (9).

By determining the first coefficient G1(m) for the first memory device 15 and the second coefficient G2(m1, m2) for the second memory device 17 in this manner, the harmonic and intermodulation distortions in the loudspeaker 22 can be removed by the distortion removal apparatus 10.

The first-order transfer function H1(m) and the second-order distortion transfer function H2(m1, m2) of the loudspeaker 22 are determined in the following manner.

The first-order transfer function H1(m) of the loudspeaker 22 can be obtained by actual measurement relatively easily using a test signal, for example, a square wave, having a frequency of m. The tap length N2 of the first-order transfer function H1(m) is sufficient as long as the impulse response of the loudspeaker 22 in a time domain can be sufficiently converged within the tap length. The tap length N2 can be actually measured by inputting an impulse signal to the loudspeaker 22. Alternatively, the function H1(m) obtained in a frequency domain is treated by inverse Fourier transform into a waveform in a time domain, and it is determined whether the waveform is sufficiently converged. The tap length N2 needs to be equal to or shorter than N1, which defines the overlapping length (N1−1) of the frame obtained by the frame division device 12.

The second-order distortion transfer function H2(m1, m2) of the loudspeaker 22 can be obtained relatively easily using a test signal having frequencies of m1 and m2, for example, a square wave having a frequency of m1 added to a square wave having a frequency of m2. The tap length N3 of one side of the transfer function H2(m1, m2), for the second-order distortion, which is a two-dimensional arrangement is sufficient as long as a two-dimensional waveform in a time domain obtained by two-dimensional inverse Fourier transform of the function H2(m1, m2) in a frequency domain is sufficiently converged in a N3×N3 plane. The tap length N3 needs to be equal to or shorter than N1, which defines the overlapping length (N1−1) of the frame obtained by the frame division device 12.

Hereinafter, with reference to FIGS. 2A, 2B, 2C and 2D, the relationship among the frame length N obtained from the audio signal by the frame division device 12, the overlapping length (N1−1), the tap length N2 of the first-order transfer function H1(m) of the loudspeaker 22, the tap length N3 of one side of the transfer function H2(m1, m2), for the second-order distortion, which is a two-dimensional arrangement of the loudspeaker 22 will be described. For simplicity, N1=N2=N3.

First, the first-order transfer function H1(m) and the transfer function H2(m1, m2) of the second-order distortion of the loudspeaker 22 are measured by the tap lengths N1 and N1×N1. Then, the first coefficient G1(m) and the second coefficient G2(m1, m2) are obtained by the method described above. The tap length of the first coefficient G1(m) is N1, and the tap length of the second coefficient G2(m1, m2) is N1×N1. The operation performed by the multiplier 14 of the distortion removal apparatus 10 is, in essence, a one-dimensional convolution operation of the input signal. The operation performed by the multiplier/adder 16 is, in essence, a two-dimensional convolution operation.

There are a plurality of methods of convolution operation available for a nonlinear signal such as a general audio signal. Herein, the overlap-save method (see Richard E. Blahut, "Fast Algorithms for Digital Signal Processing" (Addison-Wesley Publishing Company Inc., 1985) is used and the convolution operation is performed in a frequency domain. Accordingly, the tap length of the first coefficient G1(m) needs to be extended to N. The tap length of the second coefficient G2(m1, m2) needs to be extended to N×N.

Figure 2C:
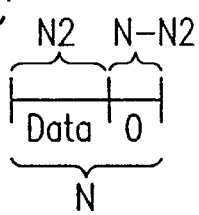
FIG. 2C is a diagram showing a part of a process performed in the time domain to obtain a coefficient to be stored in a first memory device.
Figure 2D:
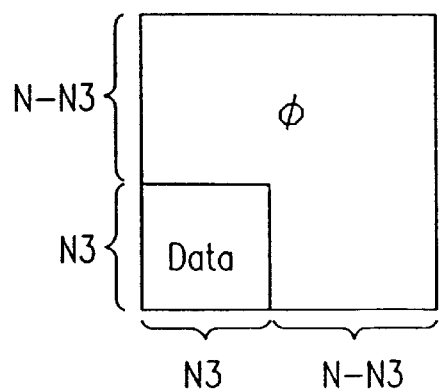
FIG. 2D is a diagram showing a part of a process performed in the time domain to obtain a second-order coefficient to be stored In a second memory device.

In order to extend the tap lengths, the first coefficient G1(m) and the second coefficient G2(m1, m2) are converted into the coefficients in a time domain. Next, the (N−N1) pieces of data are added to the converted first coefficient as shown in FIG. 2C. Zero data is added to the converted second coefficient as shown in FIG. 2D. Then, the first and second coefficients are converted back to the coefficients in the frequency domain. Thus, the first coefficient has a tap length of N and the second coefficient has a tap length of N×N.

Summarizing the tap lengths, tap length of the first coefficient G1(m) obtained using the first-order transfer characteristic and the second-order distortion transfer characteristic is N1, and the tap length of the second coefficient G2(m1, m2) obtained in a similar manner is N1×N1. The first coefficient G1(m) stored in the first memory device 15 of the distortion removal apparatus 10 after the above-described extension has a tap length of N, and the second coefficient G2(m1, m2) stored in the second memory device 17 of the distortion removal apparatus 10 after the above-described extension has a tap length of N×N.

Before and after the extension of the tap length, the essential characteristics of the first coefficient G1(m) and the second coefficient G2(m1, m2) do not change. Accordingly, the first coefficient is indicated by G1(m) both before and after the extension, and the second coefficient is indicated by G2(m1, m2) both before and after the extension, for simplicity.

Next, the frame length N obtained by the frame division device 12, and the length N1 which defines the overlapping length when the signal is taken in, will be described.

The distortion removal apparatus 10 in the first example converts the input audio signal into a signal in a frequency domain frame by frame for signal processing and converts back to a signal in a time domain again and outputs the resultant signal.

A necessary amount of operation for each signal w(n) output from the distortion removal apparatus 10 in the first example will be described. For example, when the first-order impulse response length N1(=N2=N3) of the loudspeaker 22 is 128 taps, the amount of operation in the distortion removal apparatus 10 is minimum. This is represented by expression (10).

$$N1 = \frac{N}{2} \qquad \text{expression (10)}$$

Next, the significance of converting the input audio signal into a signal in a frequency domain for signal processing and converting back to a signal in a time domain will be described.

One conventional method for removing a distortion from a general system performs a convolution operation only in a time domain using a one-dimensional and two-dimensional digital filters. Since the two-dimensional convolution operation requires an excessive amount of operation, a huge distortion removal apparatus is required to perform real-time processing of an input audio signal. Such a huge distortion removal apparatus is not practical.

The distortion removal apparatus 10 in the first example according to the present invention has a feature in that the amount of operation can be reduced by performing the operation after the input audio signal is converted into a signal in a frequency domain. The necessary number of multiplication and addition will be described.

The number of multiplication and addition required to be performed by the distortion removal apparatus 10 in order to remove a distortion from the loudspeaker 22 is in the order of N for each digital audio signal x(n). According to the conventional method using the convolution operation in a time domain, the number of multiplication required in the convolution operation is in the order of $N^2$ for each audio signal x(n), which is significantly larger than in the case of the present invention.

As can be appreciated by the comparison, by converting an input audio signal into a signal in a frequency domain for signal processing and then converting back to a signal in a time domain, the amount of operation can be reduced significantly.

EXAMPLE 2

With reference to FIGS. 3A, 3B, 3C and 3D, a second example according to the present invention will be described. By the second example, the amount of operation performed by the second memory device 17 and the multiplier/adder 16 can be further reduced.

The structure of the distortion removal apparatus in the second example is substantially the same as that in the first example, except that the second memory device 17 stores only a coefficient in the region shown in FIG. 3A. The region shown in FIG. 3A is defined by expression (11).

$$A: \begin{cases} m1 + m2 \leq \frac{1}{2}N \\ m2 \geq m1 \\ m1 \geq 0, m2 \geq 0 \end{cases} \quad \text{expression (11)}$$

$$B: \begin{cases} m1 + m2 \geq N \\ \frac{1}{2}N \leq m1 \leq N \\ 0 \leq m2 \leq \frac{1}{2}N \end{cases}$$

In the first example, the multiplication and addition in the second term of the right side of expression (1) performed by the multiplier/adder 16 occupies a major part of the total amount of operation, whereas, in the second example, the amount of operation performed by the multiplier/adder 16 is reduced so as to reduce the size of the distortion removal apparatus.

The characteristic of the second coefficient G2(m1, m2) is as follows. Regarding the second coefficient G2(m1, m2), the coefficient in the hatched area in FIG. 3B and the coefficient in the other area has a axially symmetrical relationship with m1=m2 as a symmetry axis. The coefficient in the hatched areas in FIG. 3C and the coefficient in the other area are also conjugate with each other with (N/2, N/2) as a center of the point symmetry. Since the results of the multiplication and addition in the second term of the right side of expression (1) in the hatched areas and the other area in FIG. 3C are always conjugate with each other, only the hatched areas need to be considered in actual calculation. The product of FIGS. 3B, 3C and 3D is the hatched areas of FIG. 3A. Thus, the operation in the second term of the right side of expression (1) can be performed by conducting multiplication and addition of each G2(m1, m2) in the hatched areas of FIG. 3A and adding the results as represented by expression (12).

$$2 \sum_{\substack{m=m1+m2 \\ (m2>m1, 0 \leq m1 \leq \frac{N}{4}, 0 \leq m2 \leq \frac{N}{2})}} G2(m1, m2)Xi(m1)Xi(m2) + \quad \text{expression (12)}$$

$$\sum_{\substack{m=m1+m2 \\ (m1=m2, 0 \leq m1 \leq \frac{N}{4})}} G2(m1, m2)Xi(m1)Xi(m2) +$$

$$2 \sum_{\substack{m=|m1-m2| \\ (m1+m2 \geq N, \frac{N}{2} \leq m1 < N, 0 \leq m2 < \frac{N}{2})}} G2(m1, m2)Xi(m1)Xi(m2) +$$

$$\sum_{\substack{m=|m1-m2| \\ (m2=\frac{N}{2}, \frac{N}{2} \leq m1 < N)}} G2(m1, m2)Xi(m1)Xi(m2)$$

Thus, the amount of multiplication performed by the multiplier/adder 16 required for each digital audio signal is about 3/16, which reduces the size of the distortion removal apparatus.

EXAMPLE 3

FIG. 4 is a block diagram showing a third example according to the present invention.

A distortion removal apparatus 40 in the third example is substantially the same as the distortion removal apparatus 10 in the first example, except that a second multiplier 26 is provided after the Fourier transform device 13 and that a third memory device 27 for storing a coefficient D1(m) is connected to the second multiplier 26.

An impulse response h1(t) of the loudspeaker 22 generally includes a group delay with respect to the input signal x(t). The first-order transfer function H1(m) of the loudspeaker 22 can be obtained by Fourier transform after making h1(t) discrete. In the case where h1(t) has a group delay, if the first coefficient G1(m) is determined in consideration of only the frequency characteristic as represented by expression (6), the causality of the input/output characteristic of the entire system including the distortion removal apparatus 40 and the loudspeaker 22 does not work. Even if a non-cyclic random audio signal is input to the distortion removal apparatus 40, the distortion generated in the loudspeaker 22 cannot be removed as intended.

In the third example, in order to solve this problem, the second multiplier 26 and the third memory device 27 for storing the third coefficient D1(m) are provided as shown in FIG. 4.

The distortion removal apparatus 40 operates in the following manner. The third memory device 27 stores therein a third coefficient D1(m) obtained by Fourier transform of an impulse response characteristic in a N-tap delay having a delay function which is substantially the same as the group delay amount τ.

The multiplier 26 multiplies D1(m) read from the third memory device 27 and the signal X(m) for each m and outputs the resultant signals. Thus, the component passing through the second multiplier 26 is provided with a delay corresponding to the group delay of the first-order sub-system 23 of the loudspeaker 22. The coefficient D1(m1) read from the third memory device 27 is multiplied by the signal X(m1) by the second multiplier 26, and the coefficient D2(m2) read from the third memory device 27 is multiplied by the signal X(m2) by the second multiplier 26. Then, resultant signals are input to the multiplier/adder 16. As a result, the component passing through the multiplier/adder 16 is provided with a delay corresponding to the group delay of the distortion generated in the loudspeaker 22. Accordingly, the signals X(m) and W(m) obtained by the first multiplier 14, the second multiplier 26, the multiplier/adder 16 and the adder 18 have the relationship represented by expression (13).

$$W(m) = G1(m)D1(m)X(m) + \quad \text{expression (13)}$$

$$\sum_{\substack{m=m1+m2 \\ \text{or} \\ |m1-m2|}} G2(m1, m2)D1(m1)X(m1)D1(m2)X(m2)$$

By the above-described operation, even when a non-cyclic general audio signal is input to the distortion removal apparatus 40, the distortion generated in the loudspeaker 22 can be removed.

Alternatively, it is possible to store G1(m)D(m) in expression (13) in the first memory device 15 as a new first coefficient, and store G2(m1, m2)D2(m2) in expression (13)

in the second memory device 17 as a new second coefficient. In this case, an equivalent distortion removal can be performed using the distortion removal apparatus 10 in the first example.

EXAMPLE 4

FIG. 5 shows a processing speaker system 50 in a fourth example according to the present invention. The processing speaker system 50 includes either one of the distortion removal apparatus 10 or 40 in the first through third examples. The output from the distortion removal apparatus is input to the loudspeaker 22.

Specifically in the professional-use systems, a large volume of sound is generated by the loudspeaker 22 and thus a nonlinear distortion is generated relatively easily. By performing signal processing for distortion compensation using the distortion removal apparatus 10 or 40, the quality of the sound can be improved.

EXAMPLE 5

FIG. 6 shows a multi-processor 60 in a fifth example according to the present invention. The multi-processor 60 includes an equalizer/delay circuit 61 for adjusting the frequency characteristic and the delay time, and either one of the distortion removal apparatus 10 or 40 in the first through third examples. The output from the distortion removal apparatus is input to the loudspeaker 22

Generally when reproducing an audio signal by a professional-use loudspeaker, a signal processing device referred to as a multi-processor is inserted into the sound source and the loudspeaker 22 for adjusting the frequency characteristic and the delay time. By incorporating either one of the distortion removal apparatus 10 or 40 into the multi-processor 60, the distortion generated in the loudspeaker 22 can be removed without Increasing the number of devices in the sound reproduction system.

EXAMPLE 6

FIG. 7 is a block diagram showing a sixth example according to the present invention.

A distortion removal apparatus 70 includes an A/D converter 11 for receiving a signal output from a signal source 1 such as a CD player, a frame division device 12, a Fourier transform device 13, a first filter 71 for receiving an output signal from the Fourier transform device 13, a second filter 72 for receiving the output signal from the Fourier transform device 13, an adder 18 for adding the output signal from the first filter 71 and the output signal from the second filter 72, an inverse Fourier transform device 19 for receiving the output signal from the adder 18, a frame synthesis device 20, and a D/A converter 21.

The first filter 71 is a one-dimensional filter having the functions of the first memory device 15 and the multiplier 14 in the distortion removal apparatus 10 combined. The second filter 72 is a two-dimensional filter having the functions of the second memory device 17 and the multiplier/adder 16 in the distortion removal apparatus 10 combined.

The distortion removal apparatus 70 in the sixth example is provided with the function of a low-pass filter utilizing the transfer characteristics of the first and second filters 71 and 72, so as to eliminate the low-pass filter conventionally required in a sound reproduction system. Thus, the distortion removal apparatus 70 can simplify the structure of the sound reproduction system.

The relationship between the signal X(m) and the signal WL(m) respectively input to and output from the distortion removal apparatus 70 is discretely represented by expression (14) in a frequency domain.

$$WL(m) = G1L(m)X(m) + \sum_{\substack{m=m1+m2 \\ \text{or} \\ |m1-m2|}} G2L(m1, m2)X(m1)X(m2) \quad \text{expression (14)}$$

The transfer characteristic G1L(m) of the first filter 71 is L(m)G1(m) including the transfer characteristic of a low-pass filter L(m) as a component. The transfer characteristic G2L(m1, m2) of the second filter 72 is L(m1)L(m2)G2(m1, m2) including the transfer characteristic of a low-pass filter L(m) as a component When an analog audio signal x(t) is input from the signal source 1 such as a CD player to the distortion removal apparatus 70 having such a structure, the A/D converter 11 converts the analog signal x(t) into a digital signal x(n). The output signal from the A/D converter 11 is divided and transformed into a signal in a frequency domain by the frame division device 12 and the Fourier transform device 13, and then Input to the first filter 71. The first filter 71 has the transfer characteristic of L(m)G1(m) and performs a one-dimensional convolution operation of the input signal. This is represented by the first term of the right side of expression (14).

The output signal from the Fourier transform device 13 is also input to the second filter 72. The second filter 72, which is a two-dimensional digital filter, performs a two-dimensional convolution operation of the input signal using the two-dimensional transfer characteristic L(m1)L(m2)G2 (m1, m2). This is represented by the second term of the right side of expression (14).

The output signal from the first filter 71 and the output signal from the second filter 72 are input to and added together by the adder 18. This is represented by the addition of the first term and the second term of the right side of expression (14).

The output signal from the adder 18 is converted into a signal in a time domain and sequentially connected by the inverse Fourier transform device 19 and the frame synthesis device 20, and then input to the D/A converter 21. The signal is then converted into an analog signal by the D/A converter 21 and output as an output signal from the distortion removal apparatus 70.

The transfer characteristics of the first and second filters 71 and 72 are determined in the following manner.

The transfer characteristic of a combination of the first memory device 15 and the multiplier 14 in the distortion removal apparatus 10 without the function of a low-pass filter (corresponding to the first filter 71 in the sixth example except for the function of a low-pass filter) is assumed to be G1(m), and the transfer characteristic of a combination of the second memory device 17 and the multiplier/adder 16 in the distortion removal apparatus 10 without the function of a low-pass filter (corresponding to the second filter 72 in the sixth example except for the function of a low-pass filter) is assumed to be G2(m1, m2). G1(m) and G2(m1, m2) are obtained in the same manner as described in the first example.

For example, generally in a professional-use sound reproduction system, in the case where a woofer for reproducing an audio signal mainly in a low frequency range is used as a loudspeaker, the signal output from the sound source such as a CD player is first passed through the low-pass filter and then input to the loudspeaker 22. In the sixth example, the low-pass filter is eliminated from the sound reproduction system by determining the transfer characteristics of the first and second filters 71 and 72 in the following manner and thus providing the distortion removal apparatus 70 with the function of the low-pass filter.

Assuming the transfer characteristic of the low-pass filter is L(m), the transfer characteristic G1L(m) of the first filter 71 of the distortion removal apparatus 70 is made equal to the transfer characteristic G1(m)L(m) obtained by multiplying G1(m) and the transfer characteristic L(m) of the low-pass filter (G1L(m)=G1(m)L(m)). Then, the transfer characteristic of the second filter 72 is made G2L(m1, m2). The relationship between the input signal X(m) to the distortion removal apparatus 70 and the output signal Y(m) from the loudspeaker 22 is represented by expression (15) by the frequency domain.

$$Y(m) = G1L(m)H1(m)X(m) + \sum_{\substack{m=m1+m2 \\ \text{or} \\ |m1-m2|}} \{H1(m)G2L(m1, m2) + H2(m1, m2)G1L(m1)G1L(m2)\}X(m1)X(m2)$$

expression (15)

The distortion removal apparatus 70 can be provided with the function of the low-pass filter by causing the first term and the second term in the braces of the second term of the right side of expression (15) to cancel each other. In order to realize this, G2L(m1, m2) is determined as represented by expression (16).

$$G2L(m1, m2) = -\frac{H2(m1, m2)}{H1(m)} G1L(m1)G1L(m2)$$

expression (16)

As described above, in the sixth example, the distortion removal apparatus 70 is provided with the function of a low-pass filter, and also the distortion generated in the loudspeaker 22 is removed. Even in the case where the distortion removal apparatus 70 is inserted to the sound reproduction system, the low-pass filter can be eliminated. The distortion in the loudspeaker can be removed without increasing the size of the sound reproduction system.

EXAMPLE 7

With reference to FIGS. 8A and 8B, a seventh example according to the present invention will be described.

In the seventh example, while the distortion removal apparatus 70 is provided with the function of a low-pass filter, the amount of operation performed by the second filter 72 is reduced so as to reduce the total amount of operation performed by the distortion removal apparatus 70.

The seventh example is different from the sixth example in the area of the filter tap which performs the operation in the second filter 72.

The operation performed by the second filter 72 in a frequency domain is represented by the second term of the right side of the expression (15). In the seventh example, the number of multiplications and additions can be reduced by performing multiplication and addition of substantially only the filter tap of the second filter 72 in the hatched areas in FIGS. 8A or 8B in consideration of the symmetrical and conjugate characteristic of the filter tap of the second filter 72.

The hatched areas in FIG. 8A are represented by expressions (17) and (18).

$m2 \geq m1, \; 0 \leq m1 \leq mc, \; 0 \leq m2 \leq mc$     expression (17)

$m1+m2 \geq N, N-mc \leq m1 < N, \; 0 \leq m2 \leq mc$     expression (18)

The hatched areas in FIG. 8B are represented by expressions (19), (20) and (21).

$$m2 \geq m1, \quad 0 \leq m1 \leq \frac{N}{4}, \quad 0 \leq m2 \leq \frac{N}{4}$$

expression (19)

$$m1 + m2 \geq \frac{N}{2}, \quad 0 \leq m1 \leq \frac{N}{4}, \quad \frac{N}{4} \leq m2 \leq mc$$

expression (20)

$m1+m2 \geq N, N-mc \leq m1 < N, 0 \leq m2 \leq mc$     expression (21)

By setting the tap of the first and second filters 71 and 72 so as to provide the distortion removal apparatus 70 with the function of the low-pass filter, the output signals from the first and second filters 71 and 72 are restricted to a component equal to or lower than the cut-off frequency of the desirable low-pass filtering characteristic. In other words, the amount of the component above the cut-off frequency is very small.

In the seventh example, the multiplication and addition indicated in the second term of the right side of expression (15) is only performed for the hatched areas in FIGS. 8A or 8B by the second filter 72. Thus, the amount of operation can be reduced.

Whether the operation is performed for FIGS. 8A or 8B is determined based on the relationship between the cut-off frequency of the low-pass filter and the tap length of the second filter 72. Where the second filter 72 is a two-dimensional digital filter having a tap length of N×N and the point on the frequency axis corresponding to the cut-off frequency of the low-pass filter function is mc, the multiplication and addition in the second term of the right side of expression (15) is performed for the hatched areas in FIG. 8A when $mc \leq N/4$ and for the hatched areas in FIG. 8B when $N/4 < mc$.

In this manner, the number of multiplications and additions performed by the second filter 72, which occupies a major part of the total amount of operation performed by the distortion removal apparatus 70 is reduced, and thus the total amount of operation performed by the distortion removal apparatus 70 can be significantly reduced.

EXAMPLE 8

FIG. 9 is a block diagram showing an eighth example according to the present invention.

A distortion removal apparatus 90 includes an A/D converter 11 for receiving a signal output from a signal source 1 such as a CD player, a frame division device 12, a Fourier transform device 13, a first filter 91 for receiving an output signal from the Fourier transform device 13, a second filter 92 for receiving the output signal from the Fourier transform device 13, an adder 18 for adding the output signal from the first filter 91 and the output signal from the second filter 92, an inverse Fourier transform device 19 for receiving the output signal from the adder 18, a frame synthesis device 20, and a D/A converter 21.

The first filter 91 is a one-dimensional filter having the functions of the first memory device 15 and the multiplier 14 in the distortion removal apparatus 10 combined. The second filter 92 is a two-dimensional filter having the functions of the second memory device 17 and the multiplier/adder 16 in the distortion removal apparatus 10 combined.

The distortion removal apparatus 90 in the eighth example is different from the distortion removal apparatus 10 in the first example in that the distortion removal apparatus 90 is provided with the function of a band-pass filter. A sound reproduction system conventionally requires a band-pass filter between the signal source 1 such as a CD player and the loudspeaker 22 in the case where the loudspeaker 22 from which the distortion is to be removed is a horn loudspeaker for a middle frequency domain.

The relationship between the signal X(m) and the output signal WB(m) respectively input to and output from the distortion removal apparatus 90 is represented by expression (22) in a frequency domain.

$$WB(m) = G1B(m)X(m) + \sum_{\substack{m=m1+m2 \\ \text{or} \\ |m1-m2|}} G2B(m1, m2)X(m1)X(m2) \quad \text{expression (22)}$$

The transfer characteristic G1B(m) of the first filter 91 is B(m)G1(m) including the transfer characteristic of a band-pass filter B(m) as a component. The transfer characteristic G2B(m1, m2) of the second filter 92 is B(m1)B(m2)G2(m1, m2) including the transfer characteristic of a band-pass filter B(m) as a component The transfer characteristics of the first and second filters 91 and 92 are determined in the following manner.

The transfer characteristic of a combination of the first memory device 15 and the multiplier 14 in the distortion removal apparatus 10 without the function of a band-pass filter (corresponding to the first filter 91 in the eighth example except for the function of a band-pass filter) is assumed to be G1(m), and the transfer characteristic of a combination of the second memory device 17 and the multiplier/adder 16 in the distortion removal apparatus 10 without the function of a band-pass filter (corresponding to the second filter 72 in the eighth example except for the function of a band-pass filter) is assumed to be G2(m1, m2). G1(m) and G2(m1, m2) are obtained in the same manner as described in the first example.

As described above, for example, generally in a professional-use sound reproduction system, in the case where a loudspeaker for reproducing an audio signal mainly in a middle frequency range is used as a loudspeaker, the signal output from the signal source 1 such as a CD player is first passed through the band-pass filter and then input to the loudspeaker 22. In the eighth example, the band-pass filter is eliminated from the sound reproduction system by determining the transfer characteristics of the first and second filters 91 and 92 in the following manner and thus providing the distortion removal apparatus 90 with the function of the band-pass filter.

Assuming the transfer characteristic of the band-pass filter is B(m), the transfer characteristic G1B(m) of the first filter 91 of the distortion removal apparatus 90 is made equal to the transfer characteristic G1(m)B(m) obtained by multiplying G1(m) and the transfer characteristic B(m) of the band-pass filter (G1B(m)=G1(m)B(m)). Then, the transfer characteristic of the second filter 92 is made G2B(m1, m2). The relationship between the input signal X(m) to the distortion removal apparatus 90 and the output signal Y(m) from the loudspeaker 22 is represented by expression (23) by the frequency domain.

$$Y(m) = G1B(m)H1(m)X(m) + \sum_{\substack{m=m1+m2 \\ \text{or} \\ |m1-m2|}} \{H1(m)G2B(m1, m2) + H2(m1, m2)G1B(m1)G1B(m2)\}X(m1)X(m2) \quad \text{expression (23)}$$

The distortion removal apparatus 90 can be provided with the function of the band-pass filter by causing the first term and the second term in the braces of the second term of the right side of expression (23) to cancel each others In order to realize this, G2B(m1, m2) is determined as represented by expression (24).

$$G2B(m1, m2) = -\frac{H2(m1, m2)}{H1(m)}G1B(m1)G1B(m2) \quad \text{expression (24)}$$

As described above, in the eighth example, the distortion removal apparatus 90 is provided with the function of a band-pass filter, and also the distortion generated in the loudspeaker 22 is removed. Even in the case where the distortion removal apparatus 90 is inserted to the sound reproduction system, the band-pass filter can be eliminated. The distortion in the loudspeaker can be removed without increasing the size of the sound reproduction system.

EXAMPLE 9

With reference to FIGS. 10A and 10B, a ninth example according to the present invention will be described.

In the ninth example, while the distortion removal apparatus 90 is provided with the function of a band-pass filter, the amount of operation performed by the second filter 92 is reduced so as to reduce the total amount of operation performed by the distortion removal apparatus 90.

The ninth example is different from the eighth example in the area of the filter tap which performs the operation in the second filter 92.

The operation performed by the second filter 92 in a frequency domain is represented by the second term of the right side of the expression (22). In the ninth example, the number of multiplications and additions can be reduced by performing multiplication and addition of substantially only the filter tap of the second filter 92 in the hatched areas in FIGS. 10A or 10B in consideration of the symmetrical and conjugate characteristic of the filter tap of the second filter 92.

The hatched areas in FIG. 10A are represented by expressions (25) and (26).

$$m2 \geq m1, \ mcl \leq m1 \leq mch, \ mcl \leq m2 \leq mch \quad \text{expression (25)}$$

$$m1+m2 \geq N+mcl,$$

$$N-mch+mcl \leq m1 \leq N-mcl$$

$$2mcl \leq m2 \leq mch \quad \text{expression (26)}$$

The hatched areas in FIG. 10B are represented by expressions (27), (28) and (29).

$$m2 \geq m1, \quad mcl \leq m1 \leq \frac{N}{4}, \quad mcl \leq m2 \leq \frac{N}{4} \quad \text{expression (27)}$$

$$m1 + m2 \geq \frac{N}{2}, \quad mcl \leq m1 \leq \frac{N}{4}, \quad \frac{N}{4} \leq m2 \leq mch \quad \text{expression (28)}$$

$m1+m2 \geq N+mcl,$ $N-mch+mcl \leq m1 \leq N-mcl,$ $2mcl \leq m2 \leq mch$ expression (29)

By setting the tap of the first and second filters 91 and 92 so as to provide the distortion removal apparatus 90 with the function of a band-pass filter, the output signals from the first and second filters 91 and 92 are restricted to a component equal to or lower than the cut-off frequency of the desirable band-pass filtering characteristic. In other words, the amount of the component above the cut-off frequency is very small.

In the ninth example, the multiplication and addition indicated in the second term of the right side of expression (22) is only performed for the hatched areas in FIGS. 10A or 10B by the second filter 92. Thus, the amount of operation can be reduced.

Whether the operation is performed for FIGS. 10A or 10B is determined based on the relationship between the cut-off frequency mch of the band-pass filter and the tap length of the second filter 92. Where the second filter 92 is a two-dimensional digital filter having a tap length of N×N and the point on the frequency axis corresponding to the cut-off frequency of the band-pass filter function is mch, the multiplication and addition in the second term of expression (22) is performed for the hatched areas in FIG. 10A when mch≦N/4 and for the hatched areas in FIG. 10B when N/4<mch.

In this manner, the number of multiplications and additions performed by the second filter 92, which occupies a major part of the total amount of operation performed by the distortion removal apparatus 90 is reduced, and thus the total amount of operation performed by the distortion removal apparatus 90 can be significantly reduced.

EXAMPLE 10

FIG. 11 is a block diagram showing a tenth example according to the present invention.

A distortion removal apparatus 110 includes an A/D converter 11 for receiving a signal output from a signal source 1 such as a CD player, a frame division device 12, a Fourier transform device 13, a first filter 111 for receiving an output signal from the Fourier transform device 13, a second filter 112 for receiving the output signal from the Fourier transform device 13, an adder 18 for adding the output signal from the first filter 111 and the output signal from the second filter 112, an inverse Fourier transform device 19 for receiving the output signal from the adder 18, a frame synthesis device 20, and a D/A converter 21.

The first filter 111 is a one-dimensional filter having the functions of the first memory device 15 and the multiplier 14 in the distortion removal apparatus 10 combined. The second filter 112 is a two-dimensional filter having the functions of the second memory device 17 and the multiplier/adder 16 in the distortion removal apparatus 10 combined.

The distortion removal apparatus 110 in the tenth example is different from the distortion removal apparatus 10 in the first example in that the distortion removal apparatus 110 is provided with the function of a high-pass filter. A sound reproduction system conventionally requires a high-pass filter between the signal source 1 such as a CD player and the loudspeaker 22 in the case where the loudspeaker 22 from which the distortion is to be removed is a horn loudspeaker for a high frequency domain.

The relationship between the signal X(m) and the output signal WF(m) respectively input to and output from the distortion removal apparatus 110 is discretely represented by expression (30) in a frequency domain.

$$WF(m) = G1F(m)X(m) + \sum_{\substack{m=m1+m2 \\ \text{or} \\ |m1-m2|}} G2F(m1, m2)X(m1)X(m2) \quad \text{expression (30)}$$

The transfer characteristic G1F(m) of the first filter 111 is F(m)G1(m) including the transfer characteristic of a high-pass filter F(m) as a component. The transfer characteristic G2F(m1, m2) of the second filter 112 is, F(m1)F(m2)G2(m1, m2) including the transfer characteristic of a high-pass filter F(m) as a component.

The transfer characteristics of the first and second filters 111 and 112 are determined in the following manner.

The transfer characteristic of a combination of the first memory device 15 and the multiplier 14 in the distortion removal apparatus 10 without the function of a high-pass filter (corresponding to the first filter 111 in the tenth example except for the function of a high-pass filter) is assumed to be G1(m), and the transfer characteristic of a combination of the second memory device 17 and the multiplier/adder 16 in the distortion removal apparatus 10 without the function of a high-pass filter (corresponding to the second filter 112 in the tenth example except for the function of a high-pass filter) is assumed to be G2(m1, m2). G1(m) and G2(m1, m2) are obtained in the same manner as described in the first example.

As described above, for example, generally in a professional-use sound reproduction system, in the case where a loudspeaker for reproducing an audio signal mainly in a high frequency range is used as a loudspeaker, the signal output from the signal source 1 such as a CD player is first passed through the high-pass filter and then input to the loudspeaker 22. In the tenth example, the high-pass filter is eliminated from the sound reproduction system by determining the transfer characteristics of the first and second filters 111 and 112 in the following manner and thus providing the distortion removal apparatus 110 with the function of the high-pass filter.

Assuming the transfer characteristic of the high-pass filter is F(m), the transfer characteristic G1F(m) of the first filter 111 of the distortion removal apparatus 110 is made equal to the transfer characteristic G1(m)F(m) obtained by multiplying G1(m) and the transfer characteristic F(m) of the high-pass filter (G1F(m)=G1(m)F(m)). Then, the transfer characteristic of the second filter 112 is made G2F(m1, m2). The relationship between the input signal X(m) to the distortion removal apparatus 110 and the output signal Y(m) from the loudspeaker 22 is represented by expression (31) by the frequency domain.

$Y(m) =$ expression (31)

-continued $$G1F(m)H1(m)X(m) + \sum_{\substack{m=m1+m2 \\ \text{or} \\ |m1-m2|}} \{H1(m)G2F(m1, m2) +$$

$$H2(m1, m2)G1F(m1)G1F(m2)\}X(m1)X(m2)$$

The distortion removal apparatus 110 can be provided with the function of the high-pass filter by causing the first term and the second term in the braces of the second term of the right side of expression (31) to cancel each other. In order to realize this, G2F(m1, m2) is determined as represented by expression (32).

$$G2F(m1, m2) = -\frac{H2(m1, m2)}{H1(m)}G1F(m1)G1F(m2) \quad \text{expression (32)}$$

As described above, in the tenth example, the distortion removal apparatus 110 is provided with the function of a high-pass filter, and also the distortion generated in the loudspeaker 22 is removed. Even in the case where the distortion removal apparatus 110 is inserted to the sound reproduction system, the high-pass filter can be eliminated. The distortion in the loudspeaker can be removed without increasing the size of the sound reproduction system.

EXAMPLE 11

With reference to FIG. 12, an eleventh example according to the present invention will be described.

In the eleventh example, while the distortion removal apparatus 110 is provided with the function of a high-pass filter, the amount of operation performed by the second filter 112 is reduced so as to reduce the total amount of operation performed by the distortion removal apparatus 110.

The eleventh example is different from the tenth example in the area of the filter tap which performs the operation in the second filter 112.

The operation performed by the second filter 112 in a frequency domain is represented by the second term of the right side of the expression (30). In the eleventh example, the number of multiplications and additions can be reduced by performing multiplication and addition of substantially only the filter tap of the second filter 112 in the hatched areas in FIG. 12 in consideration of the symmetrical and conjugate characteristic of the filter tap of the second filter 112.

The hatched areas in FIG. 12 are represented by expressions (33), (34) and (35).

$$m2 \geq m1, \quad mc \leq m1 \leq \frac{N}{4}, \quad mc \leq m2 \leq \frac{N}{4} \quad \text{expression (33)}$$

$$m1 + m2 \geq \frac{N}{2}, \quad mc \leq m1 \leq \frac{N}{4}, \quad \text{expression (34)}$$

$$\frac{N}{4} \leq m2 \leq \frac{N}{2} - mc$$

$$m1 + m2 \geq N + mc, \quad \frac{N}{2} + mc \leq m1 \leq N - mc, \quad \text{expression (35)}$$

$$2mc \leq m2 \leq \frac{N}{2}$$

By setting the tap of the first and second filters 111 and 112 so as to provide the distortion removal apparatus 110 with the function of a high-pass filter, the output signals from the first and second filters 111 and 112 are restricted to a component equal to or lower than the cut-off frequency of the desirable high-pass filtering characteristic. In other words, the amount of the component above the cut-off frequency is very smell.

In the eleventh example, the multiplication and addition indicated in the second term of the right side of expression (30) is only performed for the hatched areas in FIG. 12 by the second filter 112. Thus, the amount of operation can be reduced.

In this manner, the number of multiplications and additions performed by the second filter 112, which occupies a major part of the total amount of operation performed by the distortion removal apparatus 110 can be reduced, and thus the total amount of operation performed by the distortion removal apparatus 110 can be significantly reduced.

The distortion removal apparatuses 70, 90 and 110 in the sixth through eleventh examples are applicable in the processing speaker system 50 in the fourth example or in the multi-processor 60 in the fifth example in lieu of the distortion removal apparatus 10 or 40.

In the distortion removal apparatuses 70, 90 and 110 in the sixth through eleventh examples, the audio signal output from the signal source 1 is first converted into a signal in a frequency domain and treated by signal processing and the resultant signal is converted back to a signal in a time domain. In the case where the operation (convolution operation) without such conversion between the frequency domain and the time domain, the first and the second filters can be provided with the function of a low-pass filter, a band-pass filter or a high-pass filter so as to eliminate the additional filters. Accordingly, the present invention is applicable to a distortion removal apparatus for performing operation while maintaining the signal to be processed in a time domain.

EXAMPLE 12

FIG. 13 is a block diagram showing a twelfth example according to the present invention.

A distortion removal apparatus 130 includes an A/D converter 11 for receiving a signal output from a signal source 1 such as a CD player, a frame division device 12, a Fourier transform device 13, a first filter 131 for receiving an output signal from the Fourier transform device 13, a second filter 132 for receiving the output signal from the Fourier transform device 13, a low-pass filter 133 for receiving the output signal from the second filter 132, an adder 18 for adding the output signal from the first filter 131 and the output signal from the low-pass filter 133, an inverse Fourier transform device 19 for receiving the output signal from the adder 18, a frame synthesis device 20, and a D/A converter 21.

The first filter 131 is a one-dimensional filter having the functions of the first memory device 15 and the multiplier 14 in the distortion removal apparatus 10 combined. The second filter 132 is a two-dimensional filter having the functions of the second memory device 17 and the multiplier/adder 16 in the distortion removal apparatus 10 combined.

The distortion- removal apparatus 130 in the twelfth example is different from the distortion removal apparatus 10 in the first example in that the low-pass filter 133 is provided on the stage after the second filter 132.

Where the cut-off frequency for the reproduction on the high frequency range side of the loudspeaker 22 is mc, the transfer function H1(m) of the first-order subsystem 23 in the loudspeaker 22 is very small in a region above the cut-off frequency mc. Expression (9) used for obtaining the coefficient G2(m1, m2) for the second filter 132 has H1(m) in the denominator in the right side. Accordingly, the obtained G2(m1, m2) is relatively large. Thus, even if the input signal to the distortion removal apparatus 130 is in the reproduction frequency range of the loudspeaker 22, i.e., m≦mc, the output signal from the second filter 132 includes a large component In the range of mc<m. In this case, even if such an audio signal is processed by the second filter 132 using G2(m1, m2), the signal input to the loudspeaker 22 as a distortion compensation signal has a higher frequency than mc. Accordingly, such an audio signal cannot be reproduced in actuality.

However, in the case where an audio signal including a large component In the range of m>mc is input to the loudspeaker 22, the loudspeaker 22 may be destroyed.

In the twelfth example, the loudspeaker 22 is protected against an excessive input of a signal having a frequency of above mc by providing the low-pass filter 133 after the second filter 132 and thus restricting the frequency of the output signal from the distortion removal apparatus 130 to mc or less.

Alternatively, the restriction of the frequency of the output signal from the distortion removal apparatus 130 to mc or less can be realized by providing the second filter 132 with a specific characteristic instead of providing the low-pass filter 133.

In the case where the reproduction frequency range of the loudspeaker 22 is mc or less, the following inconvenience is involved. When an audio signal is processed by G2(m1, m2) where m is a relatively large value in the range of equal to mc or more, the output signal from the distortion removal apparatus 130 includes a new distortion by signal processing or the S/N ratio is reduced. When the tap G2(m1, m2) for the second filter 132 is designed by the above-described method, the characteristic of the second filter 132 obtained in a frequency domain is converted into a characteristic in a time domain and zero data is added thereto, and then the resultant signal is converted back to a tap in the frequency domain. Due to an excessively small component in the domain of m>mc in the transfer H1(m) of the first-order subsystem 23 of the loudspeaker 22, the component in the m≦mc in the obtained G2(m1, m2) se also adversely influenced, and thus distortion compensation effect is reduced.

G2(m1, m2) obtained by expression (9) is passed through the hatched areas in FIG. 14 and multiplied by a two-dimensional band-pass filter which blocks the other region to obtain new G2(m1, m2). The hatched areas in FIG. 14 are represented by expression (36).

$$m1+m2 \leq mc, \quad m1 \geq 0, \quad m2 \geq 0$$

$$N-mc \leq m1+m2 \leq N+mc, \quad 0 \leq m1 < N, \quad 0 \leq m2 < N$$

$$m1+m2 \geq 2N-mc, \quad m1 < N, \quad m2 < N \qquad \text{expression (36)}$$

By G2(m1, m2) newly obtained in this manner, the area except for the hatched areas in FIG. 14 has a very small tap. The multiplication and addition can be performed only for the hatched areas in FIG. 14 by the second filter 132.

As a result, a distortion compensation component having an excessively large amplitude having a frequency above the cut-off frequency in the reproduction frequency range on the high frequency range side of the loudspeaker 22 is prevented from being input to the loudspeaker 22. Thus, generation of a new distortion by input of such a distortion compensation component and destruction of the loudspeaker 22 by the excessive input of a signal outside the reproduction frequency range can be prevented. By G2(m1, m2) newly obtained, a filter tap having a sufficiently large distortion compensation effect can be designed without the filter tap of a component in a range equal to or below the cut-off frequency of the loudspeaker 22 being adversely influenced by the tap of a component in the range of m>mc.

Next, a structure for reducing the amount of operation performed by the second filter 132 by utilizing the tap of symmetrical and conjugate characteristics of the tap of the second filter 132.

The operation performed by the second filter 132 can be substantially performed for the hatched areas in FIG. 15. The hatched areas shown in FIG. 15 are represented by expression (37).

$$m1 + m2 \leq mc, \quad m2 \geq m1, \quad 0 \leq m1 \qquad \text{expression (37)}$$

$$N \leq m1 + m2 \leq N + mc, \quad \frac{N}{2} \leq m1 < N,$$

$$0 \leq m2 \leq \frac{N}{2}$$

Since the amount of operation performed by the second filter 132 occupies a major part of the total amount of operation performed by the distortion removal apparatus 130, the total amount of operation performed by the distortion removal apparatus 130 can be significantly reduced by restricting the operation by the second filter 132 to the hatched areas.

In order to obtain G2(m1, m2) by expression (9), the transfer function H2(m1, m2) representing the distortion in the loudspeaker 22 which is a two-dimensional arrangement needs to be measured. In the distortion removal apparatus 130, such measurement can be only for the hatched areas in FIG. 16, which are represented by expression (38).

$$m1 + m2 \leq mc, \quad m2 \geq m1, \quad 0 \leq m1 \qquad \text{expression (38)}$$

$$N3 \leq m1 + m2 \leq N3 + mc, \quad \frac{N3}{2} \leq m1 < N3,$$

$$0 \leq m2 \leq \frac{N3}{2}$$

The low-pass filter 133 can be inserted after the adder 18 instead of after the D/A converter 21.

EXAMPLE 13

FIG. 17 is a block diagram showing a thirteenth example according to the present invention.

A distortion removal apparatus 170 includes an A/D converter 11 for receiving a signal output from a signal source 1 such as a CD player, a frame division device 12, a Fourier transform device 13, a first filter 171 for receiving an output signal from the Fourier transform device 13, a second filter 172 for receiving the output signal from the Fourier transform device 13, a band-pass filter for receiving the output signal from the second filter 172, an adder 18 for adding the output signal from the first filter 171 and the output signal from the band-pass filter 173, an inverse Fourier transform device 19 for receiving the output signal from the adder 18, a frame synthesis device 20, and a D/A converter 21.

The first filter 171 is a one-dimensional filter having the functions of the first memory device 15 and the multiplier 14 in the distortion removal apparatus 10 combined. The second filter 172 is a two-dimensional filter having the functions of the second memory device 17 and the multiplier/adder 16 in the distortion removal apparatus 10 combined.

The distortion removal apparatus 170 in the thirteenth example is different from the distortion removal apparatus 10 in the first example in that the band-pass filter 173 is provided on the stage after the second filter 172.

Where the cut-off frequency for the reproduction on the low frequency range side of the loudspeaker 22 is mcl and also the cut-off frequency for the reproduction on the high frequency range side of the loudspeaker 22 is mc, the transfer function H1(m) of the first-order subsystem 23 in the loudspeaker 22 is very small in ranges of m<mcl and mch<m. Expression (9) used for obtaining the coefficient for the second filter 172 has H1(m) in the denominator in the right side. Accordingly, the obtained G2(m1, m2) is relatively large. Thus, even if the input signal to the distortion removal apparatus 170 is in the reproduction frequency range of the loudspeaker 22, i.e., mcl≦m≦mch, the output signal from the second filter 172 includes a large component outside the reproduction frequency range of the loudspeaker 22. In this case, even if such an audio signal is processed by the second filter 172 using G2(m1, m2), the signal input to the loudspeaker 22 as a distortion compensation signal is outside the reproduction frequency range of the loudspeaker 22. Accordingly, such an audio signal cannot be reproduced in actuality.

However, in the case where an audio signal including a large component outside the reproduction frequency range is input to the loudspeaker 22, the loudspeaker 22 may be destroyed.

In the thirteenth example, the loudspeaker 22 is protected against an excessive input of a signal having a frequency outside the reproduction frequency range of the loudspeaker 22 by providing the band-pass filter 173 after the second filter 172 and thus restricting the frequency of the output signal from the distortion removal apparatus 170 within the reproduction frequency range of the loudspeaker 22.

Alternatively, the restriction of the frequency of the output signal from the distortion removal apparatus 170 to the reproduction frequency range of the loudspeaker 22 can be realized by providing the second filter 172 with a specific characteristic instead of providing the band-pass filter 173.

In the case where the reproduction frequency range of the loudspeaker 212 is between mcl and mch inclusive, the following inconvenience is involved. When an audio signal is processed by G2(m1, m2) having a relatively large value regarding the reproduction frequency range of the loudspeaker 22, the output signal from the distortion removal apparatus 170 includes a new distortion by signal processing or the S/N ratio is reduced. When the tap G2(m1, m2) for the second filter 172 is designed by the above-described method, the characteristic of the second filter 172 obtained in a frequency domain is converted into a characteristic in a time domain and zero data is added thereto, and then the resultant signal is converted back to a tap in the frequency domain. Due to an excessively small component outside the reproduction frequency range of the loudspeaker 22 in the transfer H1(m) of the first-order subsystem 23 of the loudspeaker 22, the component within the reproduction frequency range of the loudspeaker 22 in the obtained G2(m1, m2) is also adversely influenced, and thus distortion compensation effect is reduced.

G2(m1, m2) obtained by expression (9) is passed through the hatched areas in FIG. 18 and multiplied by a two-dimensional band-pass filter which blocks the other region to obtain new G2(m1, m2). The hatched areas in FIG. 18 are represented by expression (39).

$mcl \leq m1+m2 \leq mch, \ 0 \leq m1, \ 0 \leq m2$ $N-mch \leq m1+m2 \leq N-mcl, \ 0 \leq m1, \ 0 \leq m2$ $N+mcl \leq m1+m2 \leq N+mch, \ m1<N, \ m2<N$ $2N-mch \leq m1+m2 \leq 2N-mcl, \ m1<N, \ m2<N$ expression (39)

By G2(m1, m2) newly obtained in this manner, the area except for the hatched areas in FIG. 18 has a very small tap. The multiplication and addition can be performed only for the hatched areas in FIG. 18 by the second filter 172.

As a result, a distortion compensation component having an excessively large amplitude outside the reproduction frequency range of the loudspeaker 22 in use is prevented from being input to the loudspeaker 22. Thus, generation of a new distortion by input of such a distortion compensation component and destruction of the loudspeaker 22 by the excessive input of a signal outside the reproduction frequency range can be prevented. By G2(m1, m2) newly obtained, a filter tap having a sufficiently large distortion compensation effect can be designed without the filter tap of a component in the reproduction frequency range of the loudspeaker 22 being adversely influenced by the tap of a component outside the reproduction frequency range.

Next, a structure will be described for reducing the amount of operation performed by the second filter 172 by utilizing the top of symmetrical and conjugate characteristics of the tap of the second filter 172.

The operation performed by the second filter 172 can be substantially performed for the hatched areas in FIG. 19, which are represented by expression (40).

$$mcl \leq m1 + m2 \leq mch, \quad m1 \leq m2, \quad 0 \leq m1 \qquad \text{expression (40)}$$

$$N + mcl \leq m1 + m2, \quad m1 < N, \quad m2 \leq \frac{N}{2}$$

Since the amount of operation performed by the second filter 172 occupies a major part of the total amount of operation performed by the distortion removal apparatus 170, the total amount of operation performed by the distortion removal apparatus 170 can be significantly reduced by restricting the operation by the second filter 172 to the hatched areas.

In order to obtain G2(m1, m2) by expression (9), the transfer function H2(m1, m2) representing the distortion in the loudspeaker 22 which is a two-dimensional arrangement needs to be measured. In the distortion removal apparatus 170, such measurement can be only for the region represented by the hatched areas in FIG. 20, which are represented by expression (41).

$$mcl \leq m1 + m2 \leq mch, \quad m1 \leq m2, \quad 0 \leq m1 \qquad \text{expression (41)}$$

$$N3 + mcl \leq m1 + m2, \quad m1 < N3, \quad m2 \leq \frac{N3}{2}$$

The band-pass filter 173 can be inserted after the adder 18 instead of after the D/A converter 21.

EXAMPLE 14

FIG. 21 is a block diagram showing a fourteenth example according to the present invention.

A distortion removal apparatus 210 includes an A/D converter 11 for receiving a signal output from a signal source 1 such as a CD player, a frame division device 12, a Fourier transform device 13, a first filter 211 for receiving an output signal from the Fourier transform device 13, a second filter 212 for receiving the output signal from the Fourier transform device 13, a high-pass filter 213 for receiving the output signal from the second filter 212, an adder 18 for adding the output signal from the first filter 211 and the output signal from the high-pass filter 213, an inverse Fourier transform device 19 for receiving the output signal from the adder 18, a frame synthesis device 20, and a D/A converter 21.

The first filter 211 is a one-dimensional filter having the functions of the first memory device 15 and the multiplier 14 in the distortion removal apparatus 10 combined. The second filter 212 is a two-dimensional filter having the functions of the second memory device 17 and the multiplier/adder 16 in the distortion removal apparatus 10 combined.

The distortion removal apparatus 210 in the fourteenth example is different from the distortion removal apparatus 10 In the first example in that the high-pass filter 213 is provided on the stage after the second filter 212.

The loudspeaker 22 is a horn loudspeaker for a high frequency domain and can reproduce an audio signal of equal to or above the cut-off frequency mc on the low frequency range side. In this case, the transfer function H1(m) of the first-order subsystem 23 in the loudspeaker 22 is very small in range lower than the cut-off frequency mc of the loudspeaker 22. Expression (9) used for obtaining the coefficient for the second filter 212 has H1(m) in the denominator in the right side. Accordingly, the obtained G2(m1, m2) is relatively large.

Thus, even if the input signal to the distortion removal apparatus 210 is in the reproduction frequency range of the loudspeaker 22, i.e., mc≦m, the output signal from the second filter 212 includes a large component outside the reproduction frequency range of the loudspeaker 22. In this case, even if such an audio signal is processed by the second filter 212 using G2(m1, m2), the signal input to the loudspeaker 22 as a distortion compensation signal is outside the reproduction frequency range of the loudspeaker 22. Accordingly, such an audio signal cannot be reproduced in actuality, However, in the case where an audio signal including a large component outside the reproduction frequency range is input to the loudspeaker 22, the loudspeaker 22 may be destroyed.

In the fourteenth example, the loudspeaker 22 is protected against an excessive input of a signal having a frequency outside the reproduction range of the loudspeaker 22 by providing the high-pass filter 213 after the second filter 212 and thus restricting the frequency of the output signal from the distortion removal apparatus 210 within the reproduction frequency range of the loudspeaker 22.

Alternatively, the restriction of the frequency of the output signal from the distortion removal apparatus 210 to the reproduction frequency range of the loudspeaker 22 can be realized by providing the second filter 212 with a specific characteristic instead of providing the high-pass filter 213.

In the case where the reproduction frequency range of the loudspeaker 22 is mc or above, the following inconvenience is involved. When an audio signal is processed by G2(m1, m2) having a relatively large value regarding the reproduction frequency range of the loudspeaker 22, the output signal from the distortion removal apparatus 210 includes a new distortion by signal processing or the S/N ratio is reduced. When the tap G2(m1, m2) for the second filter 212 is designed by the above-described method, the characteristic of the second filter 212 obtained in a frequency domain is converted into a characteristic in a time domain and zero data is added thereto, and then the resultant signal is converted back to a tap in the frequency domain. Due to an excessively small component outside the reproduction frequency range of the loudspeaker 22 in the transfer characteristic H1(m) of the first-order subsystem 23 of the loudspeaker 22, the component within the reproduction frequency range of the loudspeaker 22 in the obtained G2(m1, m2) is also adversely influenced, and thus distortion compensation effect is reduced.

G2(m1, m2) obtained by expression (9) is passed through the hatched areas in FIG. 22 and multiplied by a two-dimensional band-pass filter which blocks the other region to obtain new G2(m1, m2). The hatched areas in FIG. 22 are represented by expression (42).

$$mc \leq m1+m2 \leq N-mc,\ 0 \leq m1,\ 0 \leq m2$$

$$N+mc \leq m1+m2 \leq 2N-mc,\ m1<N,\ m2<N \quad \text{expression (42)}$$

By G2(m1, m2) newly obtained in this manner, the area except for the hatched areas in FIG. 22 has a very small tap. The multiplication and addition can be performed only for the hatched areas in FIG. 22 by the second filter 212.

As a result, a distortion compensation component having an excessively large amplitude outside the reproduction frequency range of the loudspeaker 22 in use is prevented from being input to the loudspeaker 22. Thus, generation of a new distortion by input of such a distortion compensation component and destruction of the loudspeaker 22 by the excessive input of a signal outside the reproduction frequency range can be prevented. By G2(m1, m2) newly obtained, a filter tap having a sufficiently large distortion compensation effect can be designed without the filter tap of a component in the reproduction frequency range of the loudspeaker 22 being adversely influenced by the tap of a component outside the reproduction frequency range.

Next, a structure will be described for reducing the amount of operation performed by the second filter 212 by utilizing the tap of symmetrical and conjugate characteristics of the tap of the second filter 212.

The operation performed by the second filter 212 can be substantially performed for the hatched areas in FIG. 23, which are represented by expression (43).

$$mc \leq m1 + m2 \leq \frac{N}{2},\ m1 \leq m2,\ 0 \leq m1 \quad \text{expression (43)}$$

$$N + mc \leq m1 + m2,\ m1 < N,\ m2 \leq \frac{N}{2}$$

Since the amount of operation performed by the second filter 212 occupies a major part of the total amount of operation performed by the distortion removal apparatus 210, the total amount of operation performed by the distortion removal apparatus 210 can be significantly reduced by restricting the operation by the second filter 212 to the hatched areas.

In order to obtain G2(m1, m2) by expression (9), the transfer function H2(m1, m2) representing the distortion in the loudspeaker 22 which is a two-dimensional arrangement of N3×N3 needs to be measured. In the distortion removal apparatus 210, such measurement can be only for the region represented by the hatched areas in FIG. 24, which are represented by expression (44).

$$mc \leq m1 + m2 \leq \frac{N3}{2}, \quad m1 \leq m2, \quad 0 \leq m1$$

$$N3 + mc \leq m1 + m2, \quad m1 < N3, \quad m2 \leq \frac{N3}{2}$$

expression (44)

The high-pass filter 213 can be inserted after the adder 18 instead of after the D/A converter 21.

The distortion removal apparatuses 130, 170 and 210 in the twelfth through fourteenth examples are applicable in the processing speaker system 50 in the fourth example or in the multi-processor 60 in the fifth example in lieu of the distortion removal apparatus 10 or 40.

EXAMPLE 15

FIG. 25 is a block diagram showing a fifteenth example according to the present inventions A distortion removal apparatus 250 in the fifteenth example is connected to a sound reproduction system including the loudspeaker 22 and a processor 253 such as a graphic equalizer on the stage before the loudspeaker 22.

The distortion removal apparatus 250 can remove the distortion generated in the loudspeaker 22 even when the processor 253 such as a graphic equalizer is provided thereafter. The structure of the distortion removal apparatus 250 is substantially the same as those of the distortion removal apparatuses 10, 70, 90 and the like in the previous example, except for a method for obtaining the coefficient G2(m1, m2) for a second filter 252.

The distortion removal apparatuses 10, 70, 90 and the like in the previous examples have the following inconvenience. When the first and second filters are designed to remove the distortion generated in the loudspeaker 22 and thereafter the processor 253 is connected on the stage after the distortion removal apparatus, the distortion removing effect from the loudspeaker 22 is reduced or sometimes is substantially nullified. In order to overcome this inconvenience, the first-order and second-order transfer characteristics of the system after the distortion removal apparatus need to be measured again to obtain the coefficient for the second filter.

In the case where the processor 253 is replaced with a different model or the characteristics of the processor 253 are changed in the process of sound quality adjustment, it is troublesome to measure again the transfer characteristic H1(m) of the first-order subsystem 23 and the distortion transfer characteristic H2(m1, m2) of the second-order subsystem 24 of the loudspeaker 22.

In the fifteenth example, the distortion removal apparatus 250 can remove the distortion generated in the loudspeaker 22 without performing the measurement again, by correcting the characteristics of the second filter 252 using the characteristics of the processor 253 inserted between the distortion removal apparatus 250 and the loudspeaker 22.

The transfer characteristics of first and second filters 251 and 252 of the distortion removal apparatus 250 are determined in the following manner.

The relationship between the signal X(m) and the output signal WF(m) respectively input to and output from the distortion removal apparatus 250 is represented by expression (45) in a frequency domain as in the distortion removal apparatuses 10, 70, 90 and the like.

$$W(m) = G1(m)X(m) + \sum_{\substack{m=m1+m2 \\ \text{or} \\ |m1-m2|}} G2(m1, m2)X(m1)X(m2)$$

expression (45)

The relationship between the input signal W(m) to the processor 253 and the output signal Y(m) from the loudspeaker 22 is represented by expression (46).

$$Y(m) = H1(m)E(m)W(m) + \sum_{\substack{m=m1+m2 \\ \text{or} \\ |m1-m2|}} H2(m1, m2)E(m1)E(m2)W(m1)W(m2)$$

expression (46)

E(m) represents the transfer function of the processor 253, H1(m) represents the transfer function of the first-order subsystem 23 of the loudspeaker 22, H2(m1, m2) represents the transfer function of the second-order subsystem 24, i.e., the transfer function of the harmonic and intermodulation distortions generated in the loudspeaker 22, and the addition in the first term and the second term of the right side represents the function of an adder 25.

By substituting expression (45) into expression (46) to obtain the relationship between X(m) and Y(m), expression (47) is obtained.

$$Y(m) = H1(m)E(m)G1(m)X(m) + \sum_{\substack{m=m1+m2 \\ \text{or } |m1-m2|}} \{H1(m)E(m)G2(m1, m2) +$$

$$H2(m1, m2)E(m1)E(m2)G1(m1)$$

$$G1(m2)\}X(m1)X(m2)$$

expression (47)

The first term of the right side of expression (47) represents a component of X(m) which passes through the first filter 251, the processor 253 and the first-order subsystem 23 of the loudspeaker 22. The first term in the braces of the second term of the right side represents a component of X(m) which passes through the second filter 252, the processor 253 and the first-order subsystem 23 of the loudspeaker 22. The second term in the braces of the second term of the right side represents a component of X(m) which passes through the first filter 251, the processor 253 and the second-order subsystem 24 of the loudspeaker 22. A component of X(m) which passes through the second filter 252, the processor 253 and the second-order subsystem 24 of the loudspeaker 22 is negligible compared to the other components and thus ignored.

In order to provide the output signal Y(m) from the loudspeaker 22 with a desirable characteristic, G1(m) is determined so that the first term of the right side of expression (47) is equal to the desirable characteristic as in the distortion removal apparatuses 10, 70, 90 and the like. For example, when it is desired that the characteristic of the Y(m) is equal to the characteristic of the X(m) combined with the characteristic of the processor 253, i.e., Y(m)=E(m)X(m) is desired, G1(m) is set to have an inverse characteristic (G1(m)=1/H1(m)) to that of the first-order subsystem 23 of the loudspeaker 22.

Next, the two-order distortion generated in the two-order system 24 of the loudspeaker 22 can be compensated for by causing the first term and the second term in the braces of the right side of expression (47) to cancel each other. Accordingly, G2(m1, m2) is determined as represented by expression (48).

$$G2(m1, m2) = -\frac{H2(m1, m2)E(m1)E(m2)}{H1(m)E(m)}G1(m1)G1(m2) \quad \text{expression (48)}$$

G2(m1, m2) newly obtained equals to the G2(m1, m2) before the insertion of the processor 253 multiplied by the transfer characteristics E(m1) and E(m2) of the processor 253. In the case where the processor 253 is included in the sound reproduction system, the coefficient G2(m1, m2) for the second filter 252 of the distortion removal apparatus 250 can be corrected by the transfer characteristics of the processor 253. Accordingly, the distortion in the loudspeaker 22 can be removed without measuring again the transfer characteristics of the elements after the distortion removal apparatus 250.

EXAMPLE 16

FIG. 26 is a block diagram showing a sixteenth example according to the present invention.

A distortion removal apparatus 260 in the sixteenth example is different from the distortion removal apparatus 250 in the fifteenth example in that the former includes a detection device 264 for detecting the transfer characteristic of the processor 253 and an updating device 263 for updating the characteristic of the coefficient G2(m1, m2) for a second filter 262, thereby updating the coefficient for the second filter 262.

When the transfer characteristic E(m) of the processor 253 is changed, the detection device 264 detects E(m) and sends E(m) to the updating device 263. The updating device 263 substitutes the characteristic E(m) from the detection device 263 to expression (48) described in the fifteenth example and obtains the coefficient G2(m1, m2) for the second filter 262, thereby updating the coefficient for the second filter 262.

By such a system, even if the characteristic of the processor 253 provided after the distortion removal apparatus 260 is changed, the distortion generated in the loudspeaker 22 can be removed.

In order to provide the transfer characteristic G1(m) of a first filter 261 with an inverse characteristic to that of the first-order subsystem 23 of the loudspeaker 22 in actuality, it is necessary to multiply the inverse characteristic (1/H1 (m)) by a delay characteristic. Such a process is omitted for simplicity.

The transfer characteristic E(m) of the processor 253 can be considered as the transfer characteristic of the graphic equalizer or power amplifier.

EXAMPLE 17

FIG. 27 is a block diagram showing a seventeenth example according to the present invention.

A multi-processor 270 used for a loudspeaker in the seventeenth example includes either one of the distortion removal apparatus 250 in FIG. 25 or the distortion removal apparatus 260 in FIG. 26.

Generally when reproducing an audio signal by a professional-use loudspeaker, a signal processing device referred to as a multi-processor is inserted into the signal source 1 and the loudspeaker 22 for adjusting the sound quality. In the case where the coefficient for the second filter 262 in the distortion removal apparatus is determined and thereafter the transfer characteristic of the multi-processor 270 is changed, the distortion removing effect for the loudspeaker 22 is reduced or sometimes is substantially nullified. Accordingly, when the transmission characteristic of the multi-processor 270 is changed, the coefficient of the second filter 262 needs to be updated.

By incorporating either one of the distortion removal apparatus 250 or 260 into the multi-processor 270, the distortion generated in the loudspeaker 22 can be removed without increasing the number of devices in the sound reproduction system.

EXAMPLE 18

FIG. 28 is a block diagram showing an eighteenth example according to the present invention.

A power amplifier 280 used for a loudspeaker in the eighteenth example includes either one of the distortion removal apparatus 250 in FIG. 25 or the distortion removal apparatus 260 in FIG. 26.

Generally when reproducing an audio signal by the loudspeaker 22, a power amplifier is provided at the stage prior to the loudspeaker 22 for adjusting the sound quality. In the case where the coefficient for the second filter 262 in the distortion removal apparatus is determined and thereafter the gain of the power amplifier 280 is changed, the distortion removing effect for the loudspeaker 22 is reduced or sometimes is substantially nullified. Accordingly, when the gain of the power amplifier 280 is changed, the coefficient of the second filter 262 needs to be updated.

By incorporating either one of the distortion removal apparatus 250 or 260 into the power amplifier 280, the distortion generated in the loudspeaker 22 can be removed without increasing the number of devices in the sound reproduction system.

EXAMPLE 19

FIG. 29 is a block diagram showing a nineteenth example according to the present invention.

A processing speaker system 290 in the nineteenth example includes either one of the multi-processor 270 in FIG. 27 or the power amplifier 280 in FIG. 28.

A professional-use loudspeaker, which reproduces an audio signal in a large amount, relatively easily generates a nonlinear distortion. By incorporating the multi-processor 270 in FIG. 27 or the power amplifier 280 in FIG. 28 into the processing speaker system 290 to perform signal processing for distortion compensation, the sound quality can be improved.

EXAMPLE 20

FIG. 30 is a block diagram showing a twentieth example according to the present invention.

A distortion removal apparatus 300 in the twentieth example, in the case where a power amplifier 303 provided on the stage thereafter generates a two-order distortion, can remove the distortion generated in the power amplifier 303 and the loudspeaker 22 simultaneously. The structure of the distortion removal apparatus 300 is substantially the same as that of the distortion removal apparatuses 10, 70, 90 and the like in the previous examples, except for a method for obtaining the coefficient G2(m1, m2) for a second filter 302.

In the distortion removal apparatuses 10, 70, 90 and the like in the previous examples, the first filter and the second filter are designed in order to remove the distortion in the elements provided on the stage after the distortion removal apparatus including a power amplifier, the processor and/or the loudspeaker 22.

In the case where the filters are designed and thereafter the gain of the power amplifier is changed or the processor is replaced with a different model having a different transfer characteristic of the two-order distortion, the distortion removing effect for the loudspeaker 22 is reduced or sometimes is substantially nullified. In order to overcome such inconveniences, the transfer characteristics of the first-order subsystem and the second-order subsystem generating a second-order distortion need to be measured again to obtain the coefficient of the second filter.

However, it is troublesome to measure the transfer characteristics after the gain of the power amplifier is adjusted or the processor is replaced with a different model.

In the twentieth example, the distortion removal apparatus 300 can remove the distortion generated in the loudspeaker 22 without performing the measurement again, by correcting the characteristics of a second filter 302 using the transfer characteristics A1(m) of a first-order subsystem 304 and the transfer characteristic A2(m1, m2) of a second-order distortion system 305 of the power amplifier 303 provided on the stage before the loudspeaker 22.

The transfer characteristics of a first filter 301 and the second filter 302 of the distortion removal apparatus 300 are determined in the following manner.

The relationship between the signal X(m) and the output signal W(m) respectively input to and output from the distortion removal apparatus 300 is represented by expression (45) in a frequency domain as in the distortion removal apparatuses 10, 70, 90 and the like The relationship between the signal W(m) and the signal U(m) respectively input to and output from the power amplifier 303 is represented by expression (49).

$$U(m) = A1(m)W(m) + \sum_{\substack{m=m1+m2 \\ \text{or } |m1-m2|}} A2(m1, m2)W(m1)W(m2) \quad \text{expression (49)}$$

A1(m) represents the transfer function of the first-order subsystem 304 of the power amplifier 303, A2(m1, m2) represents the transfer function of the second-order distortion system 305, and the addition in the first term and the second term of the right side of expression (49) represents the function of the adder 18.

The relationship between the signal U(m) and the signal Y(m) respectively input to and output from the loudspeaker 22 is represented by expression (50).

$$Y(m) = H1(m)U(m) + \sum_{\substack{m=m1+m2 \\ \text{or } |m1-m2|}} H2(m1, m2)U(m1)U(m2) \quad \text{expression (50)}$$

The relationship between X(m) and Y(m) is represented by expression (51) by erasing W(m) and U(m) from expressions (45), (49) and (50).

$$Y(m) = H1(m)A1(m)G1(m)X(m) + \quad \text{expression (51)}$$

$$\sum_{\substack{m=m1+m2 \\ \text{or } |m1-m2|}} [G2(m1, m2)H1(m)A1(m) +$$

$$\{H1(m)A2(m1, m2) + H2(m1, m2)A1(m1)A1(m2)\}$$

$$G1(m1)G1(m2)X(m1)X(m2)$$

The first term of the right side of expression (51) represents a component of X(m) which passes through the first filter 301, the first-order subsystem 304 of the power amplifier 303, and the first-order subsystem 23 of the loudspeaker 22, the first term in the brackets of the second term of the right side represents a component of X(m) which passes through the second filter 302, the first-order subsystem 304 of the power amplifier 303 and the first-order subsystem 23 of the loudspeaker 22. The first term in the braces of the second term of the right side represents a component of X(m) which passes through the first filter 301, the second-order subsystem 305 of the power amplifier 303 and the first-order subsystem 23 of the loudspeaker 22. The second term in the braces of the second term in the brackets of the second term of the right side represents a component of X(m) which passes through the first filter 301, the first-order subsystem 304 of the power amplifier 303 and the second-order subsystem 24 of the loudspeaker 22. A component of X(m) which passes through at least two of the second filter 302, the second-order subsystem 305 of the power amplifier 303 and the second-order subsystem 24 of the loudspeaker 22 is negligible compared to the other components and thus ignored.

In order to provide the output signal Y(m) from the loudspeaker 22 with a desirable characteristic, G1(m) is determined so that the first term of the right side of expression (51) is equal to the desirable characteristic. For example, when it is desired that the characteristic of the Y(m) is equal to the characteristic of the X(m) amplified by the power amplifier 303, i.e., Y(m)=A(m)X(m) is desired, G1(m) is set to have an inverse characteristic (G1(m)=1/H1(m)) to that of the first-order subsystem 23 of the loudspeaker 22.

In order to provide the transfer characteristic G1(m) of the first filter 302 with an inverse characteristic to that of the first-order subsystem 23 of the loudspeaker 22 in actuality, it is necessary to multiply the inverse characteristic (1/H1(m)) by a delay characteristic. Such a process is omitted for simplicity.

Next, the characteristic G2(m1, m2) of the second filter 302 for compensating for the distortions generated in the loudspeaker 22 and the power amplifier 303 will be described. The distortion component is prevented from being included in the output signal Y(m) from the loudspeaker 22 by causing the first term and the second term in the brackets of the second term of the right side of expression (51) to cancel each other. Thus, G2(m1, m2) is determined as represented by expression (52).

$$G2(m1, m2) = \quad \text{expression (52)}$$

$$-\frac{H1(m1)A2(m1, m2) + \dfrac{H2(m1, m2)A1(m1)A1(m2)}{H1(m)A1(m)}}{} G1(m1)G1(m2)$$

G2(m1, m2) newly obtained can be considered to be equal to G2(m1, m2) before the insertion of the power amplifier 303 corrected by the transfer characteristic A1(m1) and A1(m2) of the first-order subsystem 304 of the power amplifier 303 and the transfer characteristic A2(m1, m2) of the second-order subsystem 305 generating a second-order distortion of the power amplifier 303. In the case where the power amplifier 303 is replaced with a different system, the coefficient G2(m1, m2) for the second filter 302 of the distortion removal apparatus 300 can be corrected by the transfer characteristics A1(m) and A2(m1, m2). Accordingly, the distortions in the loudspeaker 22 and the power amplifier 303 can be removed without measuring again the transfer characteristics of the elements after the distortion removal apparatus 300.

EXAMPLE 21

FIG. 31 is a block diagram showing a twenty-first example according to the present invention.

A distortion removal apparatus 310 in the twenty-first example can remove the distortions in the loudspeaker 22 and the power amplifier 303 even if the gain of the power amplifier 303 is changed.

The distortion removal apparatus 310 is different from the distortion removal apparatus 300 in the twentieth example in that the former includes a detection device 314 for detecting the transfer characteristic A1(m) of the first-order subsystem 304 of the power amplifier 303 and the model of the power amplifier 303, a memory device 315 for storing the model of the power amplifier 303 and the transfer characteristic of the second-order distortion system 305 of the power amplifier 303 corresponding to the transfer characteristic A1(m) of the first-order subsystem 304, and an updating device 313 for updating the characteristic of the coefficient G2(m1, m2) for a second filter 312.

When the transfer characteristic A1(m) of the first-order subsystem 304 is changed, the detection device 314 detects A1(m) and sends A1(m) to the updating device 313. The updating device 313 reads new transfer characteristic A2(m1, m2) of the second-order distortion system 305 of the power amplifier 303 corresponding to the transfer characteristic A1(m) sent from the detection device 314. The updating device 313 substitutes the characteristic A1(m) and A2(m1, m2) newly obtained into expression (52) described in the twentieth example and obtains the coefficient G2(m1, m2) for the second filter 312, thereby updating the coefficient for the second filter 312.

By such a system, even if the characteristic of the power amplifier 303 provided after the distortion removal apparatus 300 is changed, the distortions generated in the loudspeaker 22 and the power amplifier 303 can be removed.

In order to provide the transfer characteristic G1(m) with an inverse characteristic to that of the first-order subsystem 23 of the loudspeaker 22 in actuality, it is necessary to multiply the inverse characteristic (1/H1(m)) by a delay characteristic. Such a process is omitted for simplicity.

EXAMPLE 22

FIG. 32 is a block diagram showing a twenty-second example according to the present invention.

A power amplifier 320 used for a loudspeaker in the twenty-second example includes either one of the distortion removal apparatus 300 in FIG. 30 or the distortion removal apparatus 310 in FIG. 31.

Generally when reproducing an audio signal by the loudspeaker 22, a power amplifier is provided on the stage before the loudspeaker 22 for adjusting the sound quality. In the case where the coefficient for the second filter 312 in the distortion removal apparatus is determined and thereafter the gain of the power amplifier 320 is changed, the distortion removing effect for the loudspeaker 22 is reduced or sometimes is substantially nullified. Accordingly, when the gain of the power amplifier 320 is changed, the coefficient of the second filter 312 needs to be updated.

By incorporating either one of the distortion removal apparatus 300 or 310 into the power amplifier 320, the distortions generated in the second-order distortion system 305 in the power amplifier 320 and the loudspeaker 22 can be removed without increasing the number of devices in the sound reproduction system.

EXAMPLE 23

FIG. 33 is a block diagram showing a twenty-third example according to the present invention.

A multi-processor 330 used for a loudspeaker in the twenty-third example includes either one of the distortion removal apparatus 300 in FIG. 30 or the distortion removal apparatus 310 in FIG. 31.

Generally when reproducing an audio signal by a professional-use loudspeaker, a signal processing device referred to as a multi-processor is inserted into the signal source 1 and the loudspeaker 22 for adjusting the sound quality. In the case where the coefficient for the second filter 312 in the distortion removal apparatus is determined and thereafter the transfer characteristic of the multi-processor 330 is changed, the distortion removing effect for the loudspeaker 22 is reduced or sometimes is substantially nullified. Accordingly, when the transfer characteristic of the multi-processor 330 is changed, the coefficient of the second filter 312 needs to be updated.

By incorporating either one of the distortion removal apparatus 300 or 310 into the multi-processor 320, the distortions generated in the second-order distortion system 305 in the multi-processor 320 and the loudspeaker 22 can be removed without increasing the number of devices in the sound reproduction system.

EXAMPLE 24

FIG. 34 is a block diagram showing a twenty-fourth example according to the present invention.

A processing speaker system 340 in the twenty-fourth example includes either one of the distortion removal apparatus 300 in FIG. 30 or the distortion removal apparatus 310 in FIG. 31. The output signal from the distortion removal apparatus is sent to the loudspeaker 22.

A professional-use loudspeaker, which reproduces an audio signal in a large amount, relatively easily generates a nonlinear distortion. By incorporating the distortion removal apparatus 300 in FIG. 30 or the distortion removal apparatus 310 in FIG. 31 into the processing speaker system 340 to perform signal processing for distortion compensation, the sound quality can be improved.

As described above, according to the present invention, even when a factor of a distortion is not clear, the nonlinear distortion is removed by measuring a transfer function of the distortion by inputting a test signal to a system, designing a Volterra filter in a frequency domain based on the measurement result, and performing a convolution operation of the Volterra filter in the frequency domain.

In the case where a first-order transfer characteristic of the system includes a delay, the nonlinear distortion can be removed by reflecting the delay characteristic on a two-dimensional filter which generates a nonlinear distortion compensation signal.

By processing an input audio signal by a distortion removal apparatus in the frequency domain, real-time processing is realized.

When taking in an audio signal by frame division by a distortion removal apparatus capable of real-time processing, the frame length and the overlapping length are determined so that the amount of convolution operation is minimum after taking in the signal.

By reducing the substantial area for which the operation is performed by a two-dimensional filter which generates a distortion compensation signal for removing a nonlinear second-order distortion, the total amount of operation is reduced.

By providing the one-dimensional and two-dimensional filters with the function of a low-pass filter, a band-pass filter or a high-pass filter, the frequency band of an audio signal to be reproduced is restricted so that a component in a certain band is passed. By this, a distortion removal apparatus having the function of a low-pass filter, a band-pass filter or a high-pass filter can be realized without providing additional devices.

By reducing the substantial area for which the convolution operation is performed by a two-dimensional filter in the distortion removal apparatus having the function of a low-pass filter, a band-pass filter or a high-pass filter, the total amount of operation is reduced.

In the case where the reproduction frequency range of the loudspeaker is restricted to a certain degree, it is not necessary to output a distortion compensation signal for cancelling the distortion which is generated outside the reproduction frequency range from the distortion removal apparatus. Accordingly, even when the distortion compensation signal is outside the reproduction frequency range, such a distortion compensation signal is avoided from being forcibly input to the loudspeaker.

In a distortion removal apparatus designed not to output a distortion compensation signal outside the reproduction frequency range of the loudspeaker, the total amount of operation is reduced by reducing the amount of convolution operation performed by the two-dimensional filter in the apparatus.

Even in the case where a processor such as a graphic equalizer is Inserted on the stage after the distortion removal apparatus, the distortion generated in the loudspeaker can be removed.

Generally, when a graphic equalizer or the like is provided on the stage after the distortion removal apparatus after the coefficients of the two-dimensional and two-dimensional filters are determined, the distortion removal effect is reduced. According to the present invention, the same level of effect can be obtained by correcting the coefficient of the processor.

In an audio reproduction system including a processor such as a graphic equalizer on the stage after the distortion removal apparatus, when the characteristic of the graphic equalizer is changed, the coefficients of the filters in the distortion removal apparatus are automatically updated so that the distortion generated in the loudspeaker is always removed.

As well as the distortion generated in the loudspeaker, the distortion generated in a power amplifier for the loudspeaker provided on the stage after the distortion removal apparatus can be removed.

In a distortion removal apparatus capable of removing the distortion generated in the power amplifier for the loudspeaker provided on the stage after the distortion removal apparatus, when the gain-of the power amplifier is changed, the coefficient of the filter in the distortion removal apparatus is automatically updated that the nonlinear distortion generated in the loudspeaker is always removed.

By the method according to the present invention, in the case where the amount of convolution operation performed by the two-dimensional filter in the distortion removal apparatus in order to reduce the total amount of operation, the measurement point number of the transfer function of the distortion of the loudspeaker which is required to determine the coefficient of the two-dimensional filter is reduced and thus the measurement time is shortened, Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A distortion removal apparatus connected between a signal source and a signal input section of a distortion-generating system, for adding a characteristic of a predetermined filter to a signal output from the signal source and also processing the signal output from the signal source so as to compensate for a distortion component generated in the system, the distortion removal apparatus comprising:

an A/D converter for converting an analog signal output from the signal source into a digital signal;

a Fourier transform section for performing Fourier transform of the output signal from the A/D converter in a time domain into a signal in a frequency domain;

a first filter for performing a one-dimensional convolution operation of the output signal from the Fourier transform section;

a second filter for performing a two-dimensional convolution operation of the output signal from the Fourier transform section;

an adder for adding the output signal from the first filter and the output signal from the second filter;

an inverse Fourier transform section for performing inverse Fourier transform of the output signal from the adder in the frequency domain into a signal in the time domain; and a D/A converter for converting the output signal from the inverse Fourier transform section into an analog signal, wherein, where m is an integer representing a point number on a frequency axis, m1 and m2 are each an integer representing a point number on the frequency axis and fulfill the relationship of $m=m1+m2$ or $m=|m1-m2|$, $H1(m)$ is a value representing the transfer characteristic of a first-order subsystem of the system in a frequency domain, and $H2(m1, m2)$ is a value representing the transfer characteristic of a second-order harmonic distortion and intermodulation distortion of a second-order subsystem of the system in a two-dimensional frequency domain, the transfer characteristic $G1A(m)$ of the first filter is $G1(m)A(m)$ obtained by multiplying a characteristic $A(m)$ of the predetermined filter by an arbitrarily determinable first-order transfer characteristic $G1(m)$, and the transfer characteristic $G2A(m1, m2)$ of the second filter is represented by expression (16), $$G2A(m1, m2) = -\frac{H2(m1, m2)}{H1(m)} G1A(m1)G1A(m2). \quad \text{expression (16)}$$

2. A distortion removal apparatus according to claim 1, wherein the predetermined filter is a low-pass filter.

3. A distortion removal apparatus according to claim 2, wherein the second filter is a two-dimensional digital filter having a tap length of N×N; and where the point number on the frequency axis corresponding to a cut-off frequency of the low-pass filter is mc, when the mc is N/4 or less, the second filter performs an operation on the tap substantially in the area represented by expressions (17) and (18), $$m2 \geq m1,\ 0 \leq m1 \leq mc,\ 0 \leq m2 \leq mc \quad \text{expression (17)}$$

$$m1+m2 \geq N,\ N-mc \leq m1 < N,\ 0 \leq m2 \leq mc \quad \text{expression (18).}$$

4. A distortion removal apparatus according to claim 2, wherein the second filter is a two-dimensional digital filter having a tap length of N×N; and where the point number on the frequency axis corresponding to a cut-off frequency of the low-pass filter is mc, when the mc is more than N/4, the second filter performs an operation on the tap substantially in the area represented by expressions (19), (20) and (21), $$m2 \geq m1,\ 0 \leq m1 \leq \frac{N}{4},\ 0 \leq m2 \leq \frac{N}{4} \quad \text{expression (19)}$$

$$m1 + m2 \geq \frac{N}{2},\ 0 \leq m1 \leq \frac{N}{4},\ \frac{N}{4} \leq m2 \leq mc \quad \text{expression (20)}$$

$$m1+m2 \geq N,\ N-mc \leq m1 < N,\ 0 \leq m2 \leq mc \quad \text{expression (21).}$$

5. A distortion removal apparatus according to claim 1, wherein the predetermined filter is a band-pass filter.

6. A distortion removal apparatus according to claim 5, wherein the second filter is a two-dimensional digital filter having a tap length of N×N; and where the point number on the frequency axis corresponding to a cut-off frequency on the high frequency range side of the band-pass filter is mc and the point number on the frequency axis corresponding to a cut-off frequency on the low frequency range side of the band-pass filter is mcl, when the mc is N/4 or less, the second filter performs an operation on the tap substantially in the area represented by expressions (25) and (26), $$m2 \geq m1,\ mcl \leq m1 \leq mch,\ mcl \leq m2 \leq mch \quad \text{expression (25)}$$

$$m1+m2 \geq N+mcl,$$

$$N-mch+mcl \leq m1 \leq N-mcl$$

$$2mcl \leq m2 \leq mch \quad \text{expression (26).}$$

7. A distortion removal apparatus according to claim 5, wherein the second filter is a two-dimensional digital filter having a tap length of N×N; and where the point number on the frequency axis corresponding to a cut-off frequency on the high frequency range side of the band-pass filter is mch and the point number on the frequency axis corresponding to a cut-off frequency on the low frequency range side of the band-pass filter is mcl, when the mch is more than N/4, the second filter performs an operation on the tap substantially in the area represented by expressions (27), (28) and (29), $$m2 \geq m1,\ mcl \leq m1 \leq \frac{N}{4},\ mcl \leq m2 \leq \frac{N}{4} \quad \text{expression (27)}$$

$$m1 + m2 \geq \frac{N}{2},\ mcl \leq m1 \leq \frac{N}{4},\ \frac{N}{4} \leq m2 \leq \pi \quad \text{expression (28)}$$

$$m1+m2 \geq N+mcl,$$

$$N-mch+mcl \leq m1 \leq N-mcl,$$

$$2mcl \leq m2 \leq mch \quad \text{expression (29).}$$

8. A distortion removal apparatus according to claim 1, wherein the predetermined filter is a high-pass filter.

9. A distortion removal apparatus according to claim 8, wherein the second filter is a two-dimensional digital filter having a tap length of N×N; and where the point number on the frequency axis corresponding to a cut-off frequency of the high-pass filter is mc, the second filter performs an operation on the tap substantially in the area represented by expressions (33), (34) and (35), $$m2 \geq m1,\ mc \leq m1 \leq \frac{N}{4},\ mc \leq m2 \leq \frac{N}{4} \quad \text{expression (33)}$$

$$m1 + m2 \geq \frac{N}{2},\ mc \leq m1 \leq \frac{N}{4},\ \frac{N}{4} \leq m2 \leq \frac{N}{2} - mc \quad \text{expression (34)}$$

$$m1 + m2 \geq N + mc, \quad \text{expression (35)}$$

$$\frac{N}{2} + mc \leq m1 \leq N - mc,\ 2mc \leq m2 \leq \frac{N}{2}.$$

10. A processing speaker system including a distortion removal apparatus according to claim 1, wherein the distortion-generating system is a loudspeaker for reproducing an audio signal.

11. A multi-processor including a distortion removal apparatus according to claim 1, wherein the distortion-generating system is a loudspeaker for reproducing an audio signal, and the system is provided between the signal source and an amplifier for driving the loudspeaker.

* * * * *

UNITED STATES PATENT AND TRADEMARK OFFICE
CERTIFICATE OF CORRECTION

PATENT NO.     : 6,408,079 B1                                            Page 1 of 1
DATED          : June 18, 2002
INVENTOR(S)    : Taro Katayama and Mitsuhiko Serikawa It is certified that error appears in the above-identified patent and that said Letters Patent is hereby corrected as shown below:

<u>Column 50,</u>
Line 15, expression 28 "$\pi$" should be -- mch --.

Signed and Sealed this

Twenty-first Day of January, 2003

JAMES E. ROGAN
*Director of the United States Patent and Trademark Office*